United States Patent
Wang et al.

(10) Patent No.: US 12,243,477 B2
(45) Date of Patent: Mar. 4, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Rui Wang, Beijing (CN); Chao Zeng, Beijing (CN); Ming Hu, Beijing (CN); Haijun Qiu, Beijing (CN); Weiyun Huang, Beijing (CN); Tianyi Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/788,581

(22) PCT Filed: Sep. 17, 2021

(86) PCT No.: PCT/CN2021/119060
§ 371 (c)(1),
(2) Date: Mar. 23, 2023

(87) PCT Pub. No.: WO2023/039830
PCT Pub. Date: Mar. 23, 2023

(65) Prior Publication Data
US 2024/0177657 A1    May 30, 2024

(51) Int. Cl.
*G09G 3/3225* (2016.01)
*H10K 59/131* (2023.01)

(52) U.S. Cl.
CPC ......... *G09G 3/3225* (2013.01); *H10K 59/131* (2023.02); *G09G 2300/0426* (2013.01);
(Continued)

(58) Field of Classification Search
None
See application file for complete search history.

(56) References Cited

U.S. PATENT DOCUMENTS

| 10,818,230 B1 | 10/2020 | Lu |
| 2017/0062538 A1 | 3/2017 | Kim et al. |

(Continued)

FOREIGN PATENT DOCUMENTS

| CN | 109087610 A | 12/2018 |
| CN | 109410836 A | 3/2019 |

(Continued)

OTHER PUBLICATIONS

Translation of CN 112289269A into English; Xu et al. (Year: 2021).*

(Continued)

*Primary Examiner* — Brian M Butcher
(74) *Attorney, Agent, or Firm* — Intellectual Valley Law, P.C.

(57) ABSTRACT

A pixel driving circuit is provided. The pixel driving circuit includes a driving transistor; a storage capacitor; a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element; and a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor.

18 Claims, 46 Drawing Sheets

(52) U.S. Cl.
CPC ............... *G09G 2300/0819* (2013.01); *G09G 2300/0842* (2013.01)

(56) References Cited

U.S. PATENT DOCUMENTS

| | | | |
|---|---|---|---|
| 2017/0294503 | A1 | 10/2017 | Kim et al. |
| 2020/0327853 | A1 | 10/2020 | Li |
| 2021/0118361 | A1 | 4/2021 | Li |
| 2021/0134210 | A1 | 5/2021 | In et al. |
| 2021/0319754 | A1 | 10/2021 | Shang et al. |
| 2021/0327345 | A1 | 10/2021 | Chen |
| 2022/0157238 | A1* | 5/2022 | Wang ............... G09G 3/3233 |
| 2022/0165870 | A1 | 5/2022 | Zhao |
| 2022/0310010 | A1 | 9/2022 | Cheng et al. |

FOREIGN PATENT DOCUMENTS

| | | |
|---|---|---|
| CN | 109473063 A | 3/2019 |
| CN | 111128080 A | 5/2020 |
| CN | 111403456 A | 7/2020 |
| CN | 111613180 A | 9/2020 |
| CN | 112133253 A | 12/2020 |
| CN | 112289269 A | 1/2021 |
| CN | 112435962 A | 3/2021 |
| CN | 112585761 A | 3/2021 |
| CN | 112785956 A | 5/2021 |
| CN | 113257192 A | 8/2021 |

OTHER PUBLICATIONS

International Search Report & Written Opinion mailed Jun. 21, 2022, regarding PCT/CN2021/119060.
E. Song et al., "Novel voltage programming n-channel TFT pixel circuit for low power and high performance AMLOED displays", Display 35 (2014) 118-125.
The Extended European Search Report in the European Patent Application No. 21957115.5, dated Jun. 4, 2024.

* cited by examiner

GL_P[n-1]

GL_P[n]_B1

Cel

EM[n]

GL_P[n]_B2

GL_P[n-1]

GL_P[n]_B1

Ce1

EM[n]

GL_P[n]_B2

ARRAY SUBSTRATE AND DISPLAY APPARATUS

CROSS-REFERENCE TO RELATED APPLICATION

This application is a national stage application under 35 U.S.C. § 371 of International Application No. PCT/CN2021/119060, filed Sep. 17, 2021, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is formed on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a pixel driving circuit, comprising a driving transistor; a storage capacitor, a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element; and a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor.

Optionally, the first gate line in the previous stage is connected to the gate electrode of the second reset transistor in the present stage and a gate electrode of a first reset transistor in the previous stage; and the first gate line in the present stage is connected to the gate electrode of the first reset transistor in the present stage and a gate electrode of a second reset transistor in a next stage.

Optionally, the pixel diving circuit further comprises a fourth transistor having a gate electrode connected to a respective light emitting control signal line, a source electrode connected to the drain electrode of the second reset transistor and the drain electrode of the driving transistor, and a drain electrode connected to the drain electrode of the first reset transistor and the anode of the light emitting element.

Optionally, the first gate line in the present stage comprises a first gate line first branch and a first gate line second branch configured to be provided with a same gate scanning signal; the gate electrode of the first reset transistor is connected to the first gate line second branch as the present stage; and the gate electrode of the second reset transistor is connected to the first gate line second branch saw the previous stage.

Optionally, the pixel driving circuit further comprises a first transistor having a gate electrode connected to the first gate line first branch in a present stage of a plurality of first gate lines, a source electrode connected to a respective data line of a plurality of data lines, and a drain electrode connected to a source electrode of the driving transistor.

Optionally, the pixel driving circuit further comprises a second transistor having a gate electrode connected to a respective second gate line in a present stage of a plurality of second gate lines, a source electrode converted to a first capacitor electrode of the storage capacitor and a gate electrode of the driving transistor, and a drain electrode connected to a drain electrode of the driving transistor; wherein the plurality of first gate lines and the plurality of second gate lines are spaced apart by one or more insulating layer.

Optionally, the respective second gate line in a present stage comprises a second gate line first branch and a second gate line second branch is two different layers.

Optionally, the pixel driving circuit further comprises a second reset transistor having a gate electrode connected to a first gate line in a previous stage of a plurality of first gate lines, a source electrode connected to a respective second reset signal line of a plurality of second reset signal lines, and a drain electrode connected to a drain electrode of the driving transistor; a first transistor having a gate electrode connected to a first gate line in a present stage of a plurality of first gate lines, a source electrode connected to a respective data line of a plurality of data lines, and a drain electrode connected to a source electrode of the driving transistor; a second transistor having a gate electrode connected to a respective second gate line in a present stage of a plurality of second gate lines, a source electrode connected to the first capacitor electrode of the storage capacitor and the gate electrode of the driving transistor, and a drain electrode connected to the drain electrode of the driving transistor; a third transistor having a gate electrode connected to a respective light emitting control signal line of a plurality of light emitting control signal lines, a source electrode connected to a respective voltage supply line of a plurality of voltage supply lives, and a drain electrode connected to the source electrode of the driving transistor and the drain electrode of the first transistor; and a fourth transistor having a gate electrode connected to the respective light emitting control signal line, a source electrode connected to drain electrodes of the driving transistor and the second transistor, and a drain electrode connected to an anode of a light emitting element; wherein a second capacitor electrode of the storage capacitor is connected to the respective voltage supply line and the source electrode of the third transistor.

In another aspect, the present disclosure provides an array substrate, comprising the pixel driving circuit described herein, and the light emitting element connected to the pixel diving circuit.

Optionally, the pixel driving circuit further comprises a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor; the first gate line is the previous stage is connected to the gate electrode of the second reset transistor in the present stage and a gate electrode of a first reset transistor in the previous stage; and the first gate love is the present stage is connected to the gate electrode of the first reset transistor in the present stage and a gate electrode of a second reset transistor in a next stage.

Optionally, the pixel driving circuit further comprises a fourth transistor having a gate electrode connected to a respective light emitting control signal live, a source electrode connected to the drain electrode of the second reset transistor and the drain electrode of the driving transistor, and a drain electrode connected to the drain electrode of the first reset transistor and the anode of the light emitting element.

Optionally, the first gate line in the present stage comprises a first gate line first branch and a first gate line second branch configured to be provided with a same gate scanning signal; the gate electrode of the first reset transistor is connected to the first gate line second branch in the present stage; and the gate electrode of the second reset transistor is connected to the first gate line second branch is the previous stage.

Optionally, the pixel driving circuit further comprises a first transistor having a gate electrode connected to the first gate line first branch in a present stage of a plurality of first gate lines, a source electrode connected to a respective data line of a plurality of data lines, and a drain electrode connected to a source electrode of the driving transistor.

Optionally, the pixel driving circuit further comprises a second transistor having a gate electrode connected to a respective second gate line in a present stage of a plurality of second gate lives, a source electrode connected to a first capacitor electrode of the storage capacitor and a gate electrode of the driving transistor, and a drain electrode connected to a drain electrode of the driving transistor; and the plurality of first gate lines and the plurality of second gate lines are spaced apart by one or more insulating layer.

Optionally, the array substrate comprises a base substrate; a first semiconductor material layer on the base substrate; an insulating layer on a side of the first semiconductor material layer away from the base substrate; and a second semiconductor material layer on a side of the insulating layer away from the first semiconductor material layer, wherein the first semiconductor material layer comprises an active layer of the driving transistor and an active layer of the first reset transistor; and the second semiconductor material layer comprises au active layer of the second transistor.

Optionally, the first semiconductor material layer further comprises at least a portion of the source electrode of the driving transistor, at least a portion of the drain electrode of the driving transistor, at least a portion of the source electrode of the first reset transistor, at least a portion of the drain electrode of the first reset transistor; and the second semiconductor material layer further comprises at least a portion of the source electrode of the second transistor, and at least a portion of the drain electrode of the second transistor.

Optionally, the first semiconductor material layer comprises active layers, at least portions of source electrodes, and at least positions of drain electrodes of all transistors other than the second transistor in the pixel driving circuit.

Optionally, the first semiconductor material layer comprises a polycrystalline silicon material; and the second semiconductor material layer comprises a metal oxide semiconductor material.

Optionally, the respective second gate line in a present stage comprises a second gate line first branch and a second gate line second branch in two different layers; and an orthographic projection of the second gate line first branch on a base substrate at least partially overlaps with an orthographic projection of the second gate line second branch on the base substrate.

Optionally, the array substrate comprises a base substrate; a second gate metal layer on the base substrate; a first inter-layer dielectric layer on a side of the second gate metal layer away from the base substrate; a second semiconductor material layer on a side of the first inter-layer dielectric layer away from the second gate metal layer; a second inter-layer dielectric layer on a side of the second semiconductor material layer away from the first inter-layer dielectric layer; and a third gate metal layer on a side of the second inter-layer dielectric layer away from the second semiconductor material layer; wherein the second gate metal layer comprises the second gate line first branch; the second semiconductor material layer comprises as active layer of the second transistor; and the third gate metal layer comprises the second gate line second branch.

Optionally, the array substrate further comprises a base substrate; a first gate metal layer on the base substrate, the first gate metal layer comprising a first capacitor electrode of the storage capacitor; a second semiconductor material layer on a side of the first gate metal layer away from the base substrate, the second semiconductor material layer comprising at least a portion of a source electrode of the second transistor; and a first signal line layer on a side of the second semiconductor material layer away from the first gate metal layer, the first signal line layer comprising the plurality of first reset signal lines and a first node connecting line; wherein the first node connecting line is connected to the first capacitor electrode through a first via, and connected to the source electrode of the second transistor through a second via.

Optionally, the first node connecting line crosses over the respective second gate line in the present stage.

Optionally, the pixel diving circuit further comprises a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor; and a fourth transistor having a gate electrode connected to a respective light emitting control signal line, a source electrode connected to the drain electrode of the second reset transistor and the drain electrode of the driving transistor; and a drain electrode connected to the drain electrode of the first reset transistor and the anode of the light emitting element; wherein the array substrate further comprises a base substrate; a first semiconductor material layer on the base substrate, the first semiconductor material layer comprising the drain electrode of the second reset transistor, the source electrode of the fourth transistor, and the drain electrode of the driving transistor; a second semiconductor material layer on a side of the fast semiconductor material layer away from the base substrate, the second semiconductor material layer comprising the drain electrode of the second transistor; and a first signal line layer on a side of the second semiconductor material layer away from the first gate metal layer, the first signal line layer comprising the plurality of first reset signal lines and a second node connecting line; wherein the second node connecting line is connected to the drain electrode of the second transistor through a third via, connected to the drain electrode of the second reset transistor through a fourth via, and connected to the source electrode of the fourth transistor and the drain electrode of the driving transistor through a fifth via.

Optionally, the second node connecting line crosses over the respective second gate line in the present stage and a first gate line first branch of the first gate line in first present stage.

Optionally, the array substrate comprises a base substrate; a second semiconductor material layer on a side of the insulating layer away from the first semiconductor material layer, the second semiconductor material layer comprising an active layer of the second transistor; and a second signal line layer on a side of the second semiconductor material layer away from the base substrate, the second signal line layer comprising a plurality of voltage supply lines; wherein an orthographic projection of a respective voltage supply fine of the plurality of voltage supply lives on the base substrate covers an orthographic projection of the active layer of the second transistor on the base substrate.

Optionally, the orthographic projection of a respective voltage supply line of the plurality of voltage supply lines on the base substrate father covers an orthographic projection of the source electrode or drain electrode of the second transistor on the base substrate.

Optionally, voltage supply lines respectively from a first pixel driving circuit and a second pixel driving circuit directly adjacent to each other and in the present stage form a unitary structure is which the voltage supply lives are connected to each other in a region where orthographic projections of voltage supply lives on the base substrate cover orthographic projections of active layers of second transistors from the first pixel driving circuit and the second pixel driving circuit on the base substrate.

Optionally, the pixel driving circuit further comprises a second reset transistor having a gate electrode connected to a first gate line in a previous stage of the plurality of first gate lines, a source electrode connected to a respective second reset signal line of a plurality of second reset signal lines, and a drain electrode connected to a drain electrode of the diving transistor; and wherein second reset transistors respectively from a first pixel driving circuit and a second pixel driving circuit directly adjacent to each other and in the present stage form a unitary structure is which source or drain electrodes of the second reset transistors are connected to each other is a region where the respective second reset signal line is connected to the source or drain electrodes of the second reset transistors through one or more vias.

Optionally, a part of the second reset transistor in the first semiconductor material layer is spaced apart from other transistors in a same pixel driving circuit; second reset transistors respectively from a first pixel driving circuit and a second pixel driving circuit directly adjacent to each other and in the present stage form a unitary structure; and source or drain electrodes of the second reset transistors respectively from the first pixel driving circuit and the second pixel driving circuit directly adjacent to each other and in the present stage are connected to each other, thereby forming the unitary structure.

Optionally, the respective second reset signal line is connected to the source or drain electrodes of the second reset transistors through a single via.

Optionally, corresponding layers of a first pixel driving circuit and corresponding layers of a second pixel driving circuit directly adjacent to each other and is the present stage have a substantially mirror symmetry with respect to each other.

Optionally, corresponding layers of a first pixel driving circuit and corresponding layers of a second pixel diving circuit directly adjacent to each other and in the present stage have a substantially translational symmetry.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 3D is a diagram illustrating the structure of a second gate metal layer of two adjacent pixel driving circuits is an array substrate depicted in FIG. 3A.

FIG. 5C is a diagram illustrating the structure of a second semiconductor material layer and a second signal line layer of two adjacent pixel driving circuits in an array substrate depicted in FIG. 5A.

DETAILED DESCRIPTION

Figure 1:
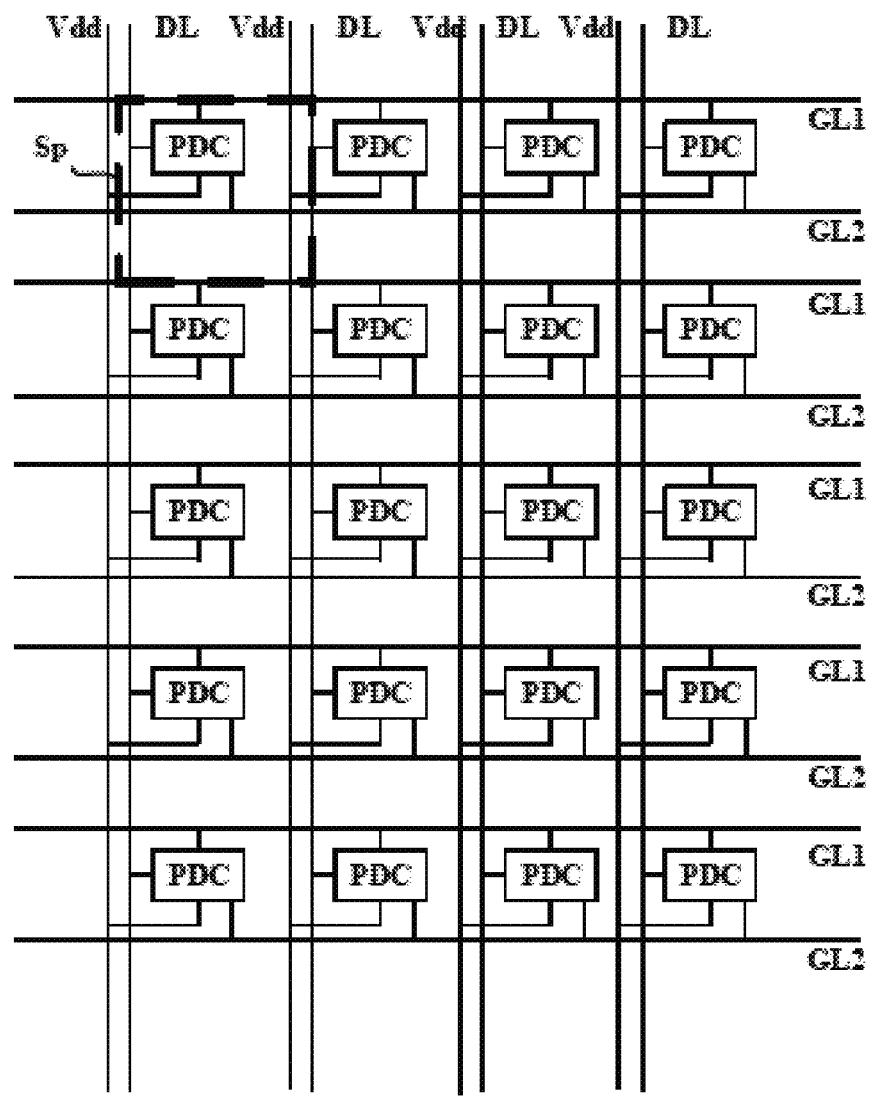
FIG. 1 is a plan view of an array substrate is some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a pixel driving circuit and the light emitting element connected to the pixel diving circuit. In some embodiments, the pixel driving circuit includes a driving transistor; a storage capacitor; a first reset transistor having a gate electrode connected to a first gate line in a present stage of a plurality of first gate lives, a source electrode connected to a respective first reset signal line of a plurality of first reset signal les, and a drain electrode connected to an anode of a light emitting element; and a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor.

It should be noted that in embodiments according to the present disclosure, a source electrode or a drain electrode refers to one of a first terminal and a second terminal of a transistor, the first terminal and the second terminal being connected to an active layer of the transistor. A direction of a current flowing through the transistor may be configured to be from a source electrode to a drain electrode, or from a drain electrode to a source electrode. Accordingly, depending on the direction of the current flowing through the transistor, is one example, the source electrode is configured to receive an input signal and the drain electrode is configured to output an output signal; is another example, the drain electrode is configured to receive an input signal and the source electrode is configured to output as output signal.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate loses GL1, a plurality of second gate lives GL2, a plurality of data lines DL, a plurality of voltage supply line Vdd, and a respective second voltage supply line (e.g., a low voltage supply line Vss). Light emission is a respective subpixel sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to as mode of the light emitting element; a low voltage signal (e.g., a VSS signal) is input, through a low voltage supply line Vas, to a cathode of the light emitting element. A voltage difference between the high voltage signal (e.g., the VDD signal) and the low voltage signal (e.g., the VSS signal) is a driving voltage $\Delta V$ that drives light emission is the light emitting element.

Figure 2:
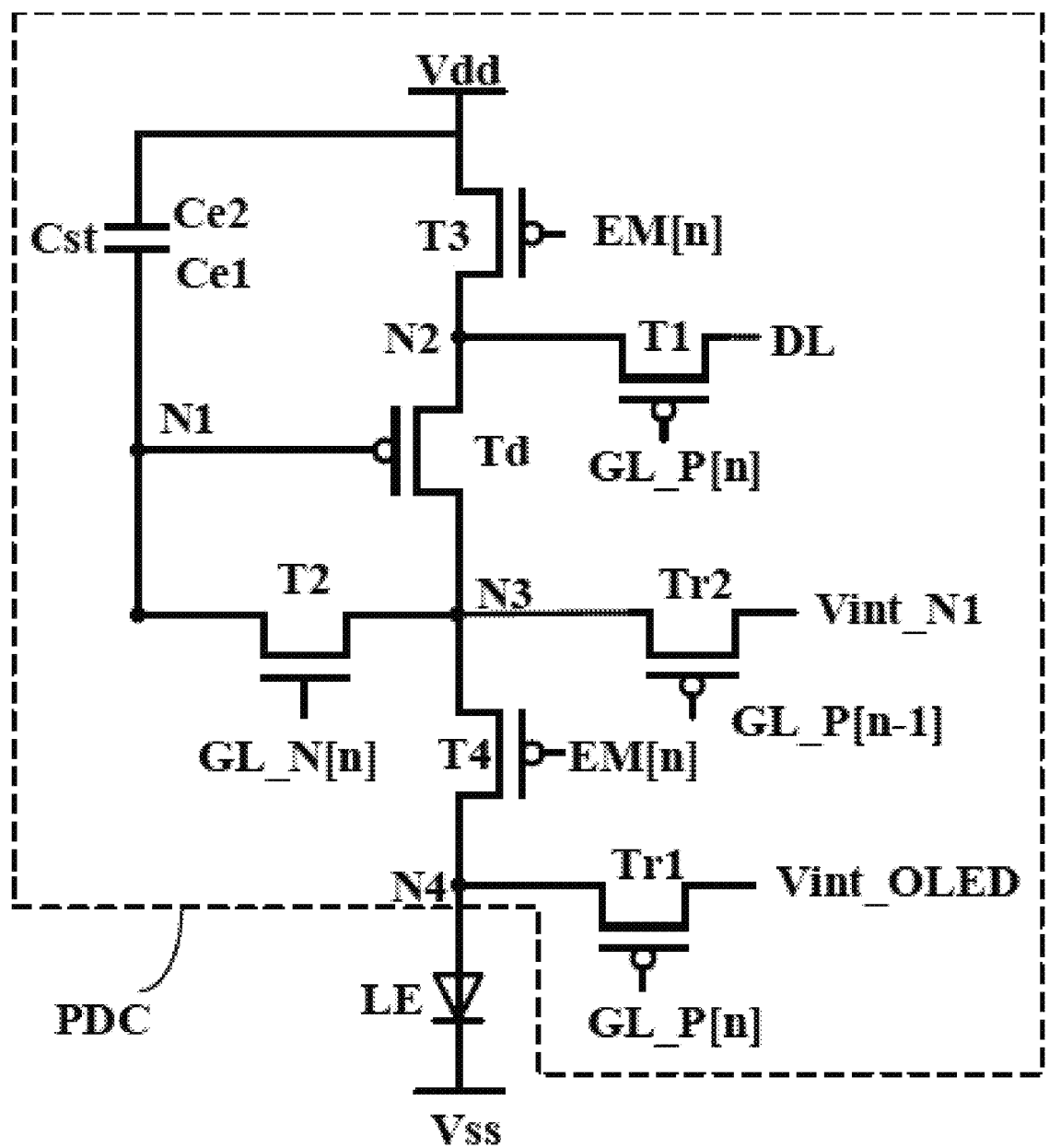
FIG. 2 is a circuit diagram illustrating the structure of a pixel driving circuit in some embodiments according to the present disclosure.

FIG. 2 is a circuit diagram illustrating the structure of a pixel driving circuit is some embodiments according to the present disclosure. Referring to FIG. 2, in some embodiments, the pixel driving circuit includes a driving transistor Td; a storage capacitor Cot having a first capacitor electrode Ce1 and a second capacitor electrode Ce1; a second reset transistor Tr2 having a gate electrode connected to a first gate line GL_P[n−1] in a previous stage of a plurality of first gate lines, a source electrode connected to a respective second reset signal line Vint_N1 of a plurality of second reset signal lines, and a dram electrode connected to a drain electrode of the driving transistor Td; a first transistor T1 having a gate electrode connected to a first gate line GL_P [n] in a present stage of a plurality of first gate lines, a source electrode connected to a respective data loss DL of a plurality of data lines, and a drain electrode connected to a source electrode of the driving transistor Td; a second transistor T2 having a gate electrode connected to a respective second gate line GL_N[n] in a present stage of a plurality of second gate lines, a source electrode connected to the first capacitor electrode Ce1 of the storage capacitor Cst and the gate electrode of the driving transistor Td, and a drain electrode connected to the drain electrode of the driving transistor Td; a third transistor T3 having a gate electrode connected to a respective light emitting control signal line EM[n] of a plurality of light emitting control signal lines, a source electrode connected to a respective voltage supply line Vdd of a plurality of voltage supply lines, and a drain electrode connected to the source electrode of the driving transistor Td and the drain electrode of the first transistor T1; a fourth transistor T4 having a gate electrode connected to the respective light emitting control signal line EM[n], a source electrode connected to drain electrodes of the driving transistor Td and the second transistor T2, and a drain electrode connected to an anode of a light emitting element LE; and a first reset transistor Tr1 having a gate electrode connected to the first gate line GL_P[n] in the present stage of a plurality of first gate lines, a source electrode connected to a respective first reset signal line Vint_OLED of a plurality of first reset signal lines, and a drain electrode connected to the drain electrode of the fourth transistor T4 and the anode of the light emitting element LE. The second capacitor electrode Ce2 is connected to the respective voltage supply line and the source electrode of the third transistor T3.

The pixel diving circuit further include a first node N1, a second node N2, a third node N3, and a fourth node N4. The first node N1 is connected to the gate electrode of the diving transistor Td, the first capacitor electrode Ce1, and the source electrode of the second transistor 12. The second node N2 is connected to the drain electrode of the third transistor T3, the drain electrode of the first transistor T1, and the source electrode of the driving transistor Td. The third node N3 is connected to the drain electrode of the driving transistor Td, the drain electrode of the second transistor T2, the source electrode of the fourth transistor T4, and the drain electrode of the second reset transistor Tr2. The fourth node NA is connected to the drain electrode of the fourth transistor T4, the drain electrode of the first reset transistor Tr1, and the anode of the light emitting element LE.

It should be noted that in embodiments according to the present disclosure, a source electrode or a drain electrode refers to one of a first terminal and a second terminal of a transistor, the first terminal and the second terminal being connected to an active layer of the transistor. A direction of a current flowing through the transistor may be configured to be from a source electrode to a drain electrode, or from a drain electrode to a source electrode. That is, the source electrode or the drain electrode of the transistor are interchangeable with sack offer. For example, referring to FIGS. 3B and SB, a first terminal of the first reset transistor Tr1 (denoted as Sr1) may be a source electrode or a drain electrode depending on a direction of the current or a type of the transistor, similarly, a second terminal of the first reset transistor Tr1 (denoted as Dr1) may be a drain electrode or a source electrode. As another example, a first terminal of the second reset transistor Tr2 (denoted as Sr2) may be a source electrode or a drama electrode depending on a direction of the current or a type of the transistor; similarly, a second terminal of the second reset transistor Tr2 (denoted as Dr2) may be a drain electrode or a source electrode. Accordingly, the source electrode or the drain electrode of other transistors are interchangeable with each other depending on a direction of the current or a type of the transistor.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels an the array substrate are arranged in an array. Is one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of z fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, we C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective Gist subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the first reset transistor Tr1, the second reset transistor Tr2, and the driving transistor Td.

Figure 3A:
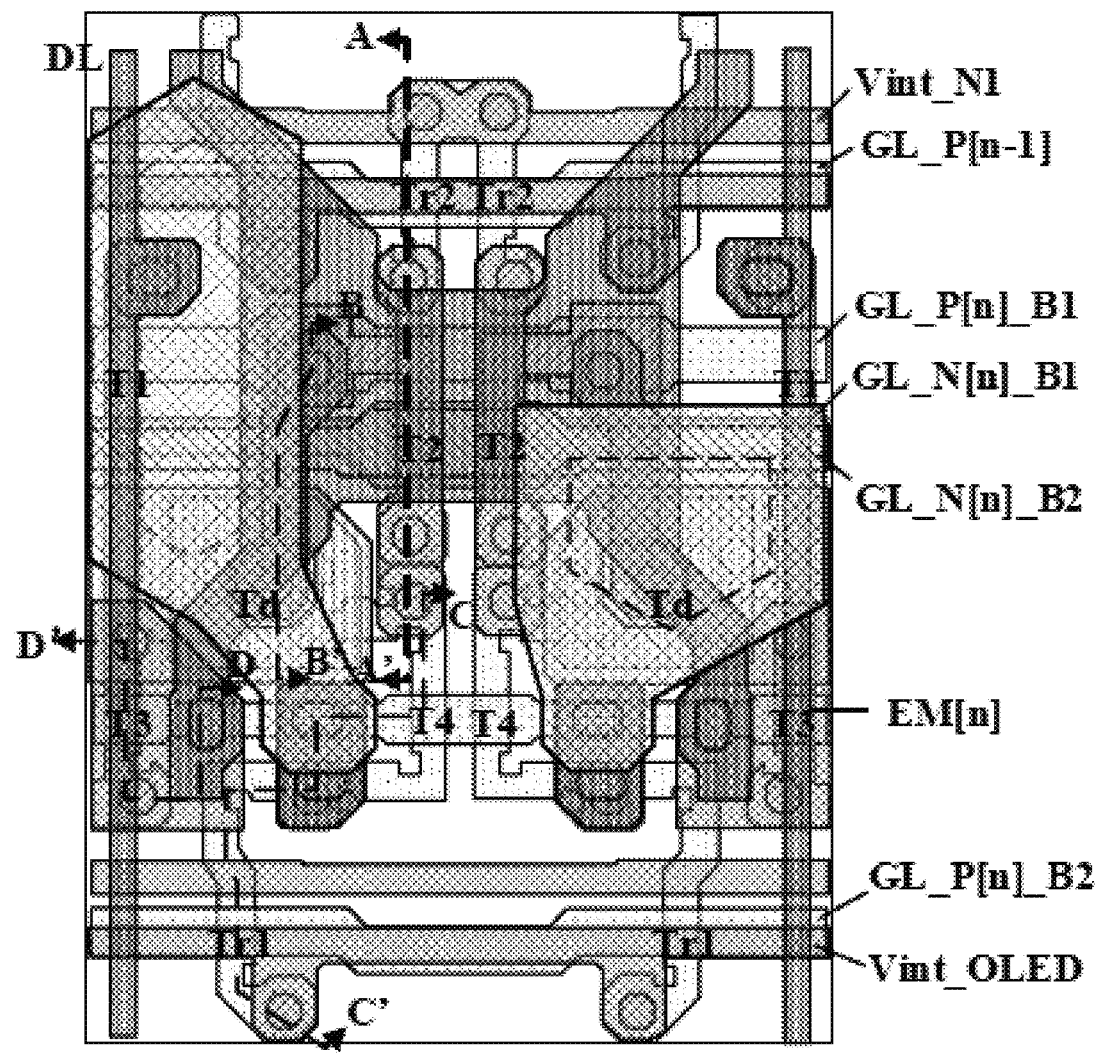
FIG. 3A is a diagram illustrating the structure of two adjacent pixel driving circuits in an array substrate in some embodiments according to the present disclosure.
Figure 3B:
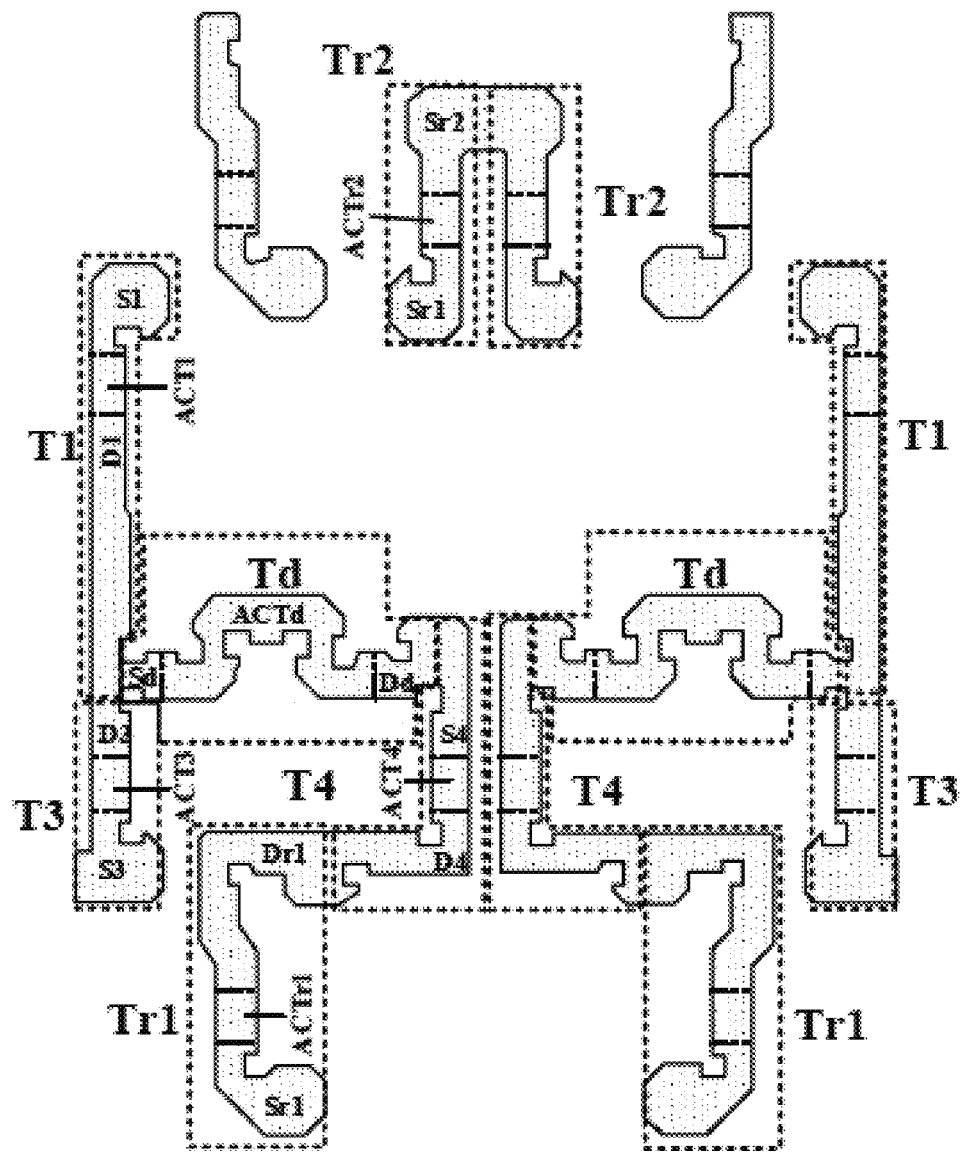
FIG. 3D is a diagram illustrating the structure of a first semiconductor material layer of two adjacent pixel driving circuits in an array substrate depicted in FIG. 3A.
FIG. 3C is a diagram illustrating the structure of a first gate metal layer of two adjacent pixel driving circuits is an array substrate depicted in FIG. 3A.
FIG. 3E is a diagram illustrating the structure of a second semiconductor material layer of two adjacent pixel driving circuits in an array substrate depicted in FIG. 3A.
FIG. 3F is a diagram illustrating the structure of a third gate metal layer of two adjacent pixel driving circuits is an array substrate depicted in FIG. 3A.
FIG. 3G is a diagram illustrating vias extending through a passivation layer, a second inter-layer dielectric layer, a first inter-layer dielectric layer, an insulating layer and a gate insulating layer in an array substrate depicted in FIG. 3A.
FIG. 3H is a diagram illustrating vias extending through a passivation layer and a second inter-layer dielectric layer in an array substrate depicted in FIG. 3A.
FIG. 3I is a diagram illustrating the structure of a first signal line layer of two adjacent pixel driving circuits in an array substrate depicted in FIG. 3A.
FIG. 3J is a diagram illustrating vias extending through a first planarization layer in as array substrate depicted in FIG. 3A.
FIG. 3K is a diagram illustrating vias extending through a passivation layer, a second inter-layer dielectric layer, a first inter-layer dielectric layer, an insulating layer and a gate insulating layer in an array substrate depicted in FIG. 3A.
FIG. 3L is a diagram illustrating the structure of a second signal line layer of two adjacent pixel driving circuits is an array substrate depicted in FIG. 3A.
FIG. 3M is a diagram illustrating vias extending through a second planarization layer in an array substrate depicted in FIG. 3A.
FIG. 3N is a diagram illustrating the structure of an anode layer of two adjacent pixel driving circuits in an array substrate depicted in FIG. 3A.
FIG. 3O is a diagram illustrating the structure of a pixel definition layer of two adjacent pixel driving circuits is an array substrate depicted in FIG. 3A.
Figure 3C:
Figure 3C:
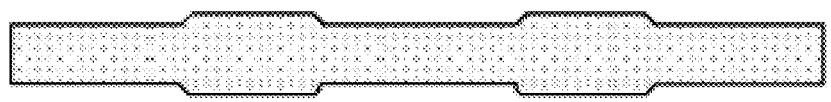
Figure 3C:
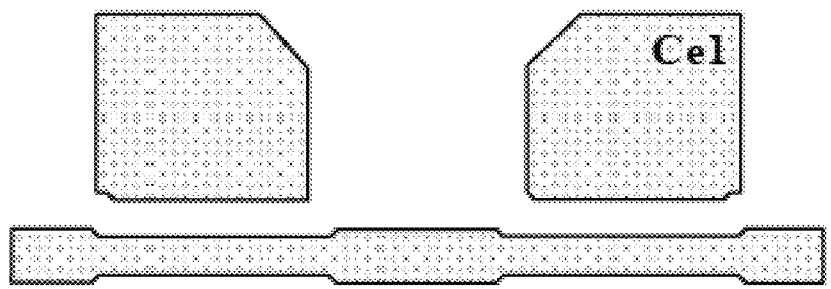
Figure 3C:
Figure 3D:
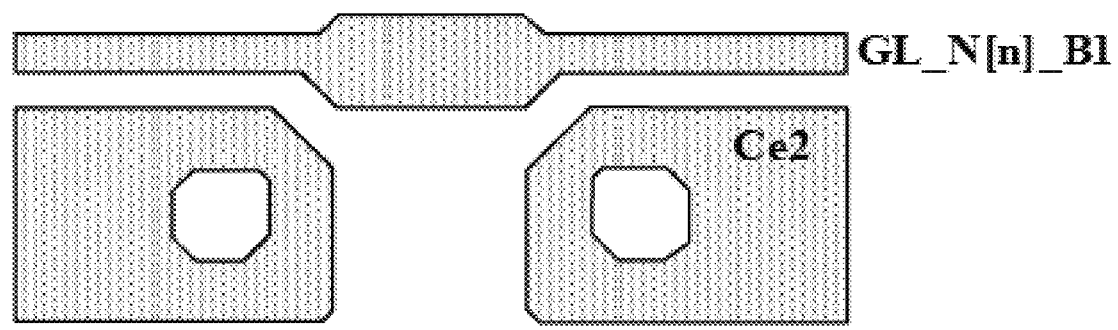
Figure 3E:
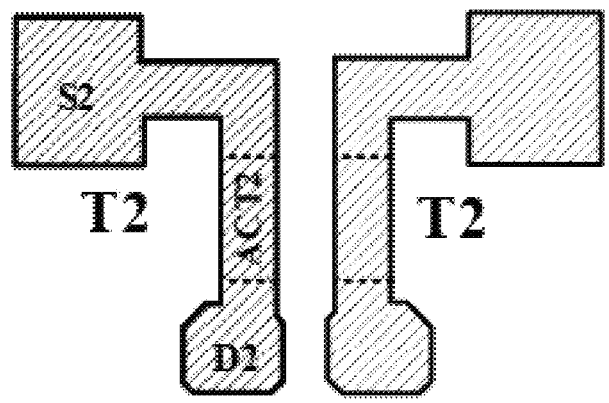
Figure 3F:
Figure 3G:
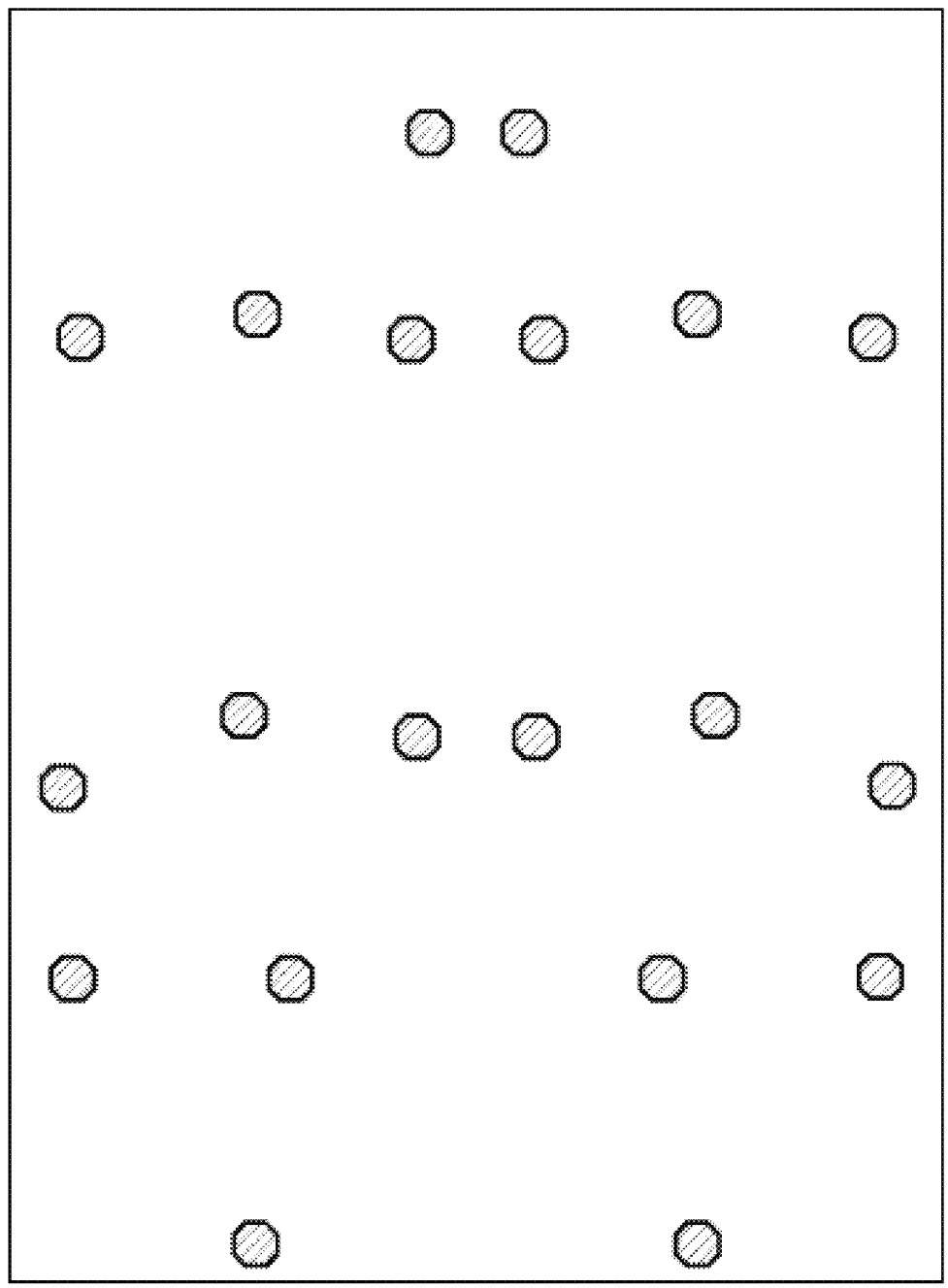
Figure 3H:
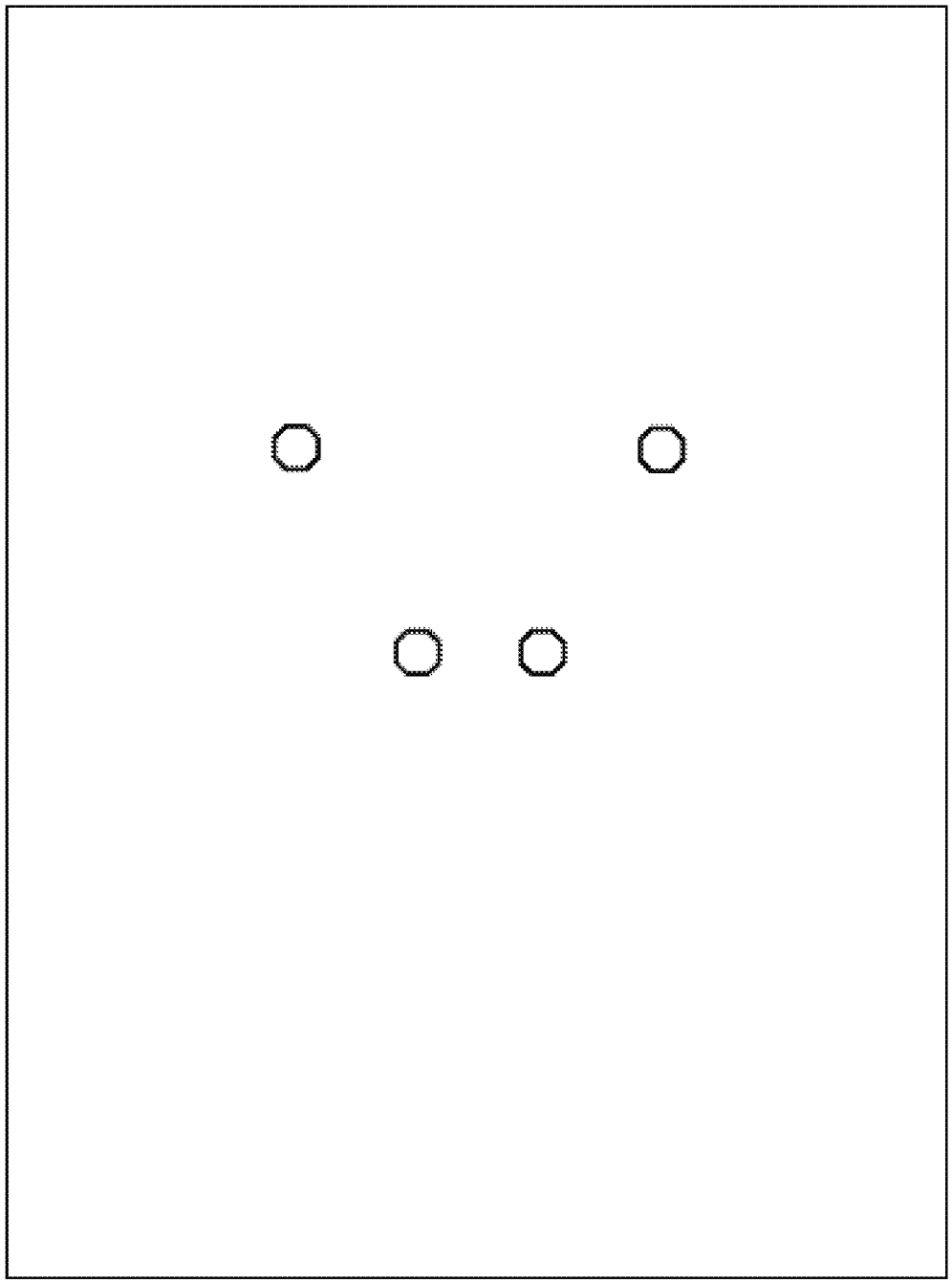
Figure 3I:
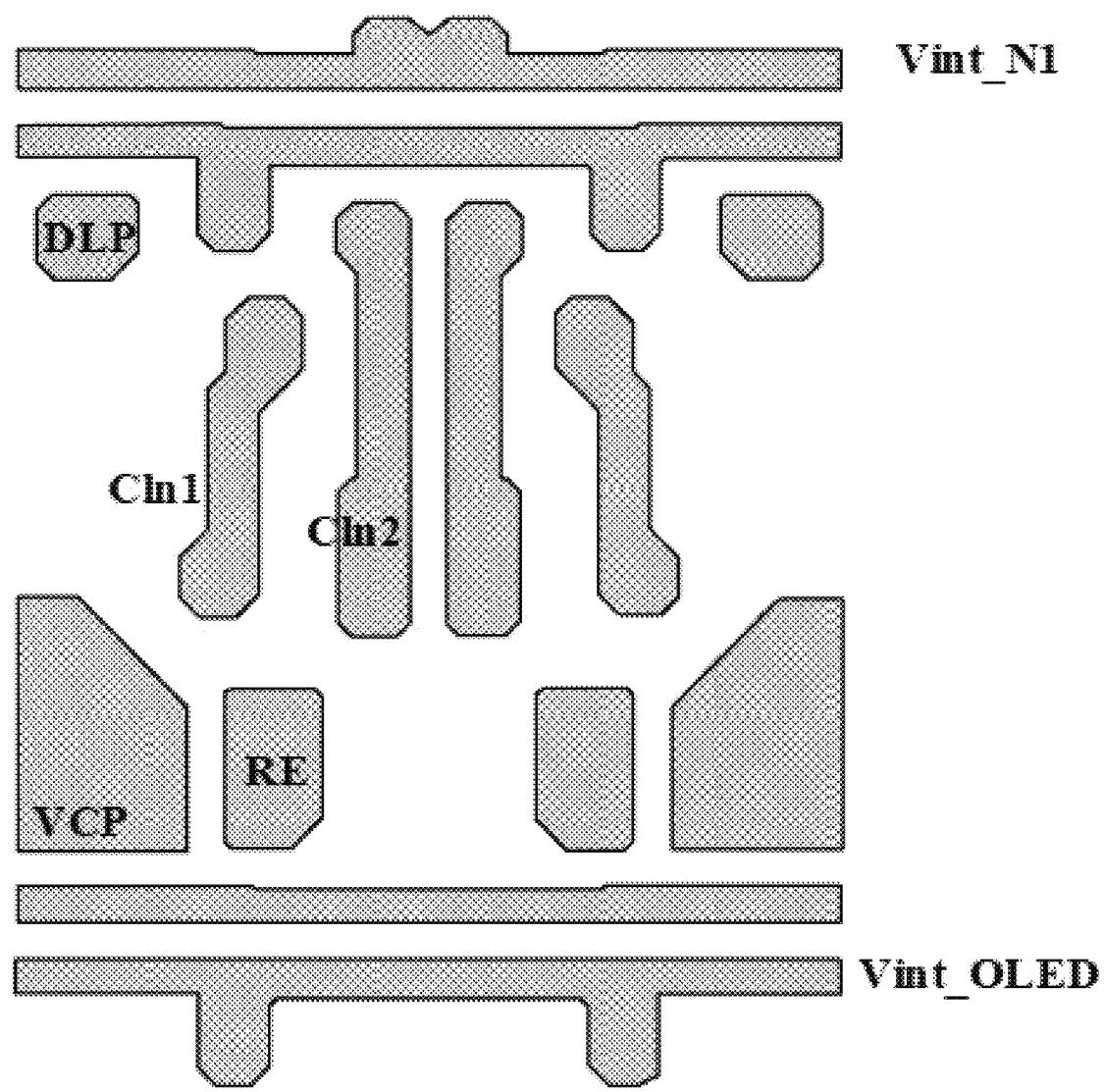
Figure 3J:
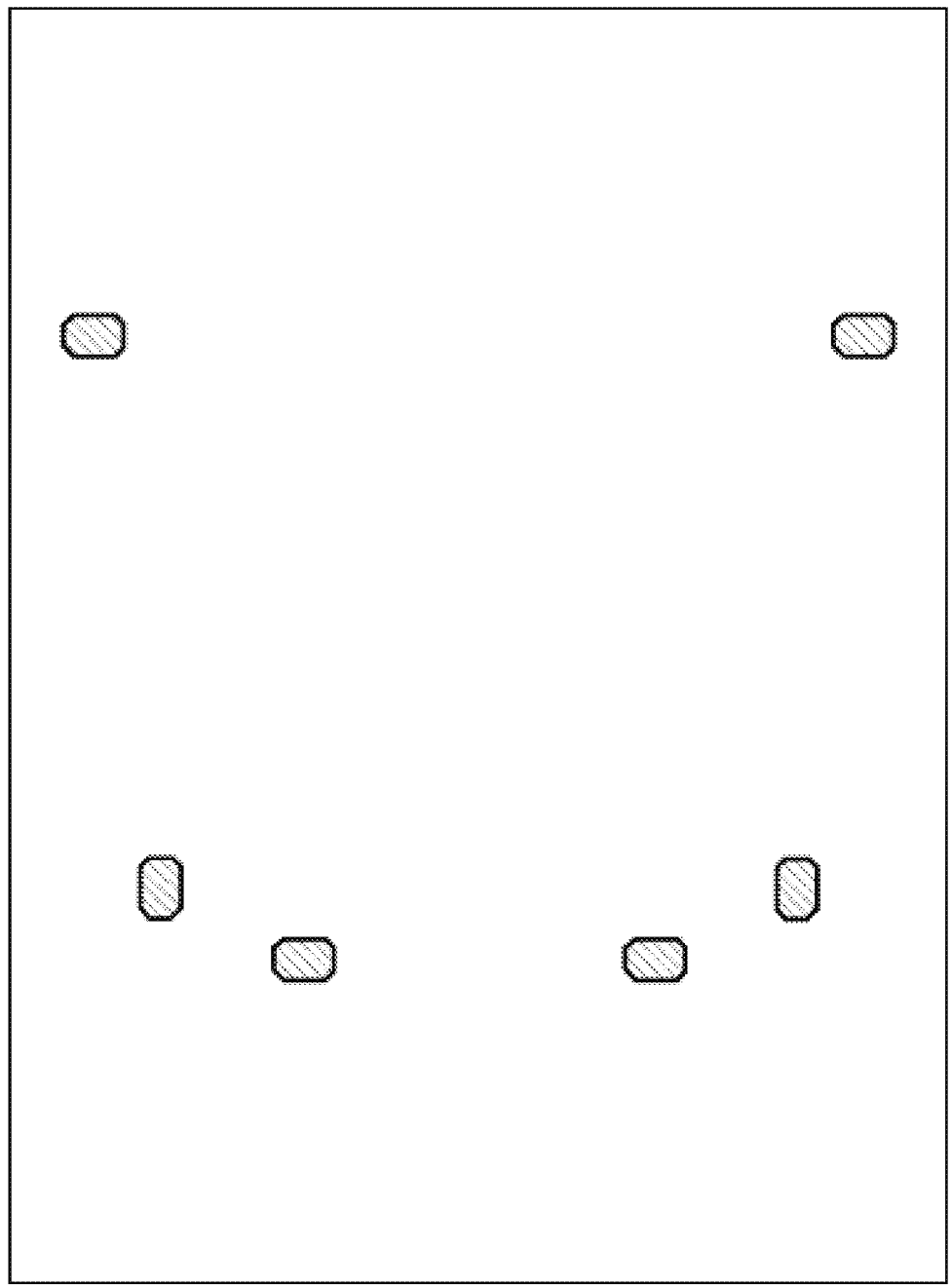
Figure 3K:
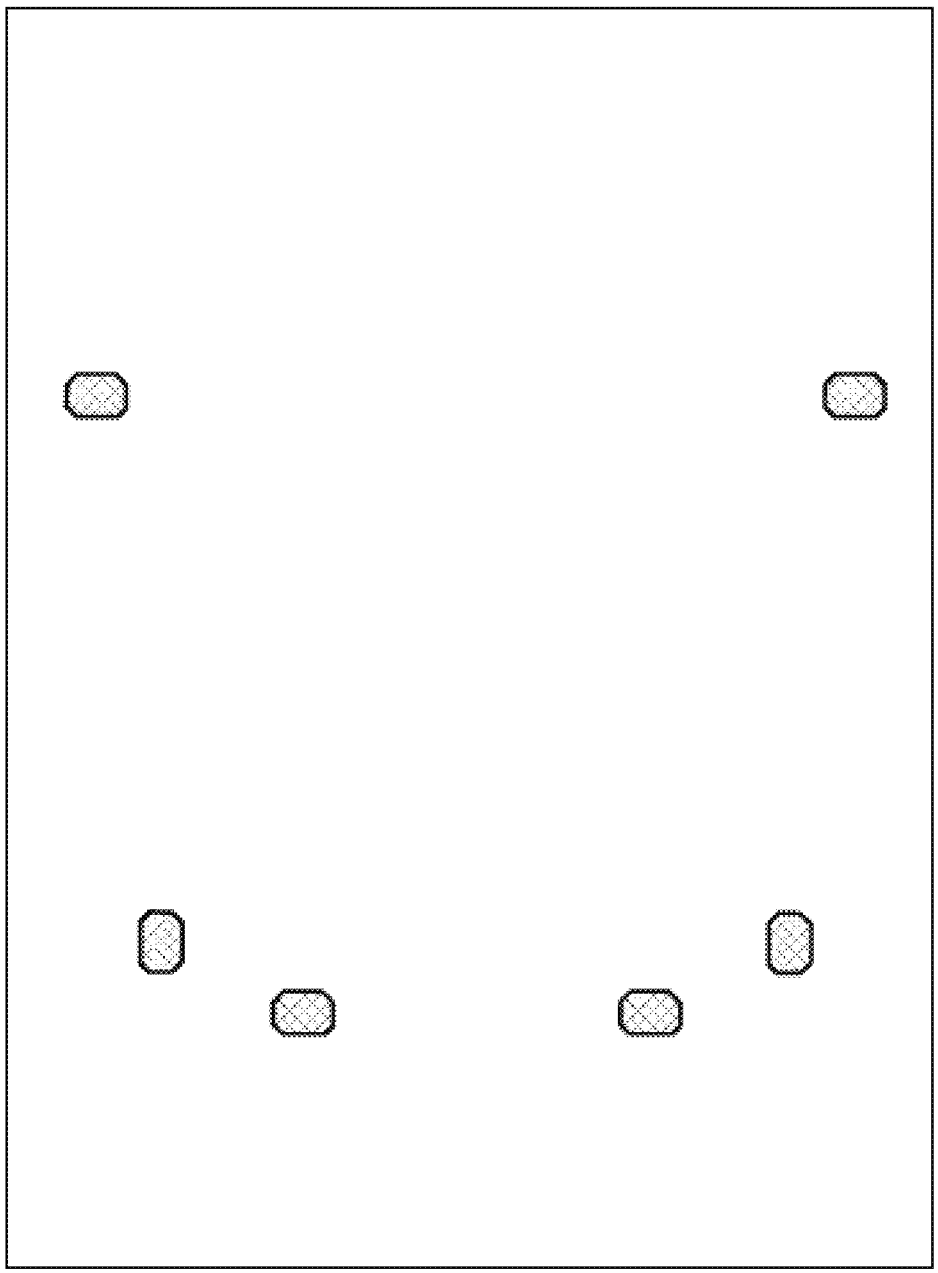
Figure 3L:
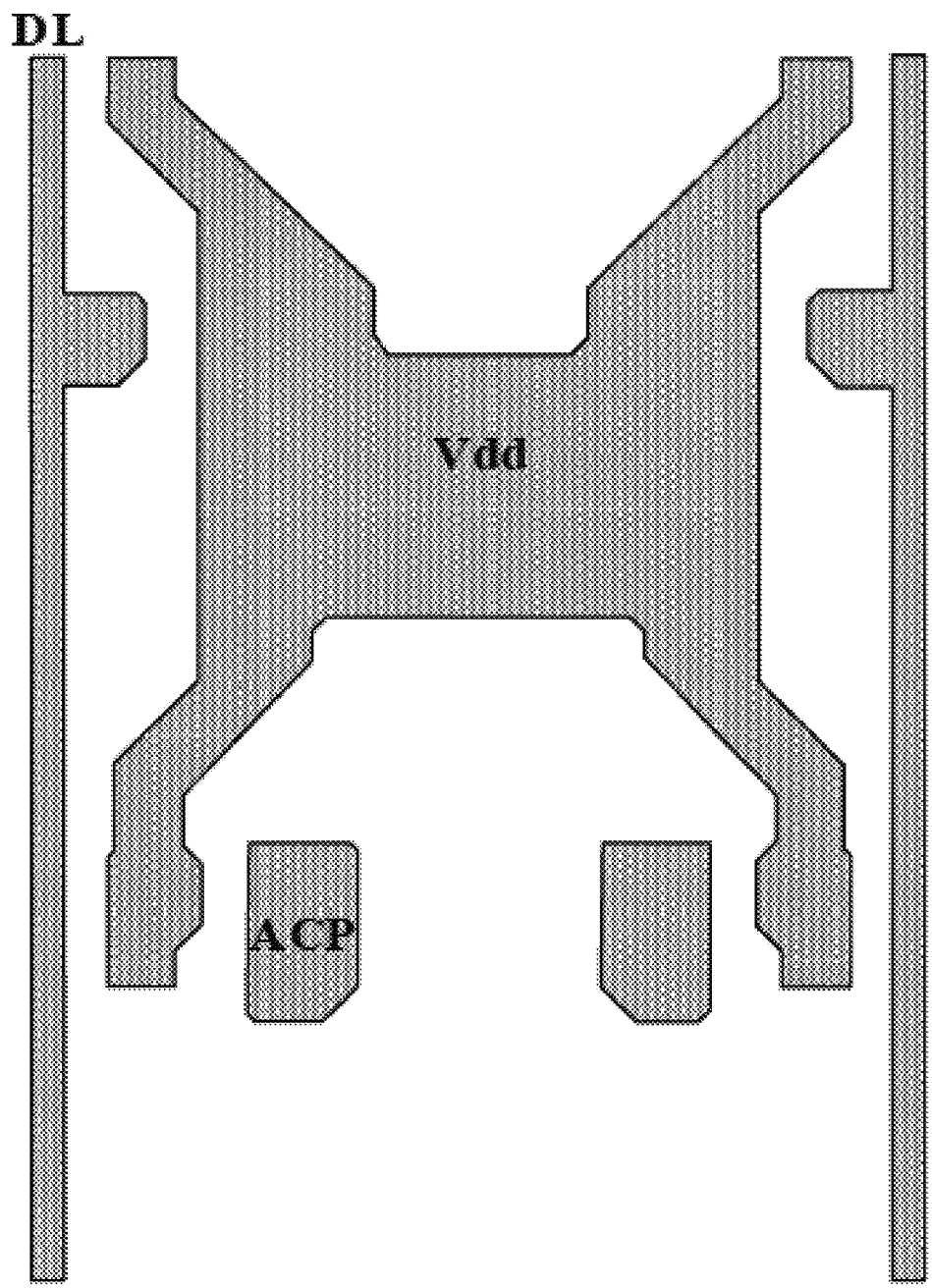
Figure 3M:
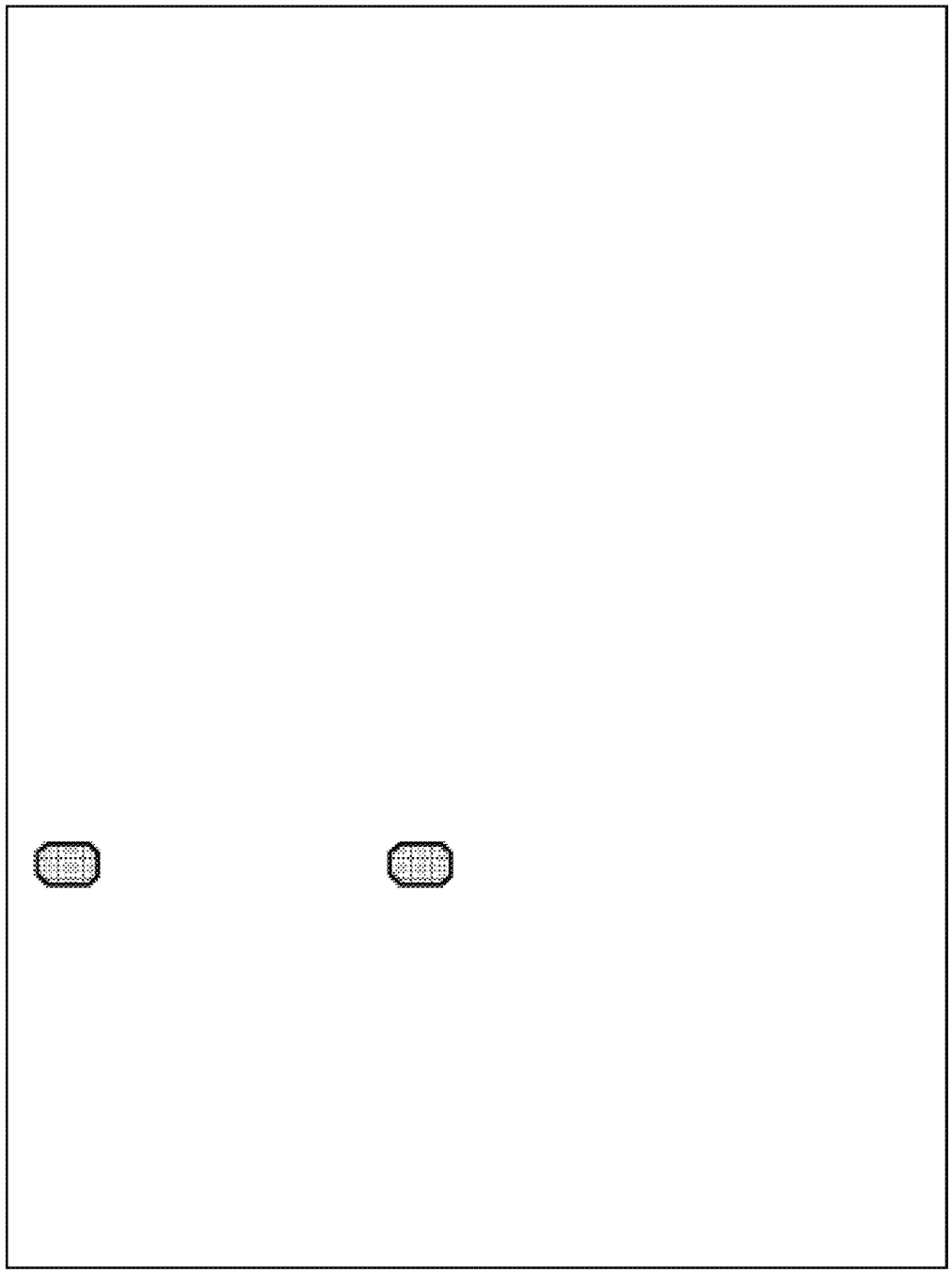
Figure 3N:
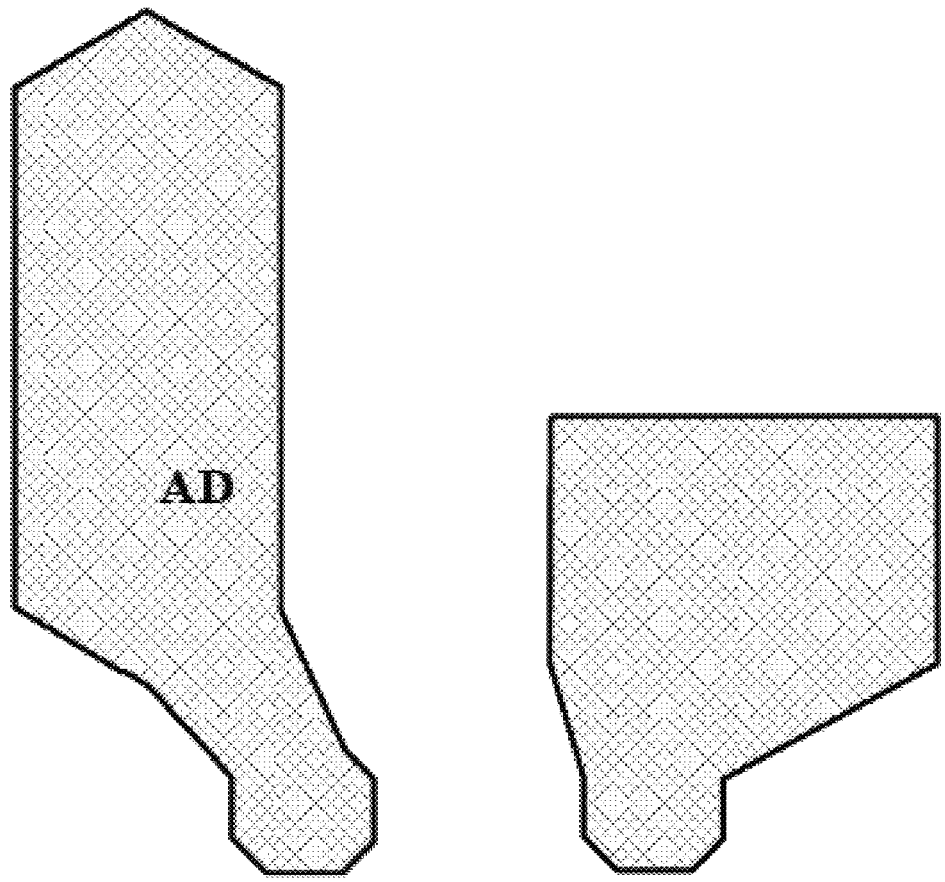
Figure 3O:
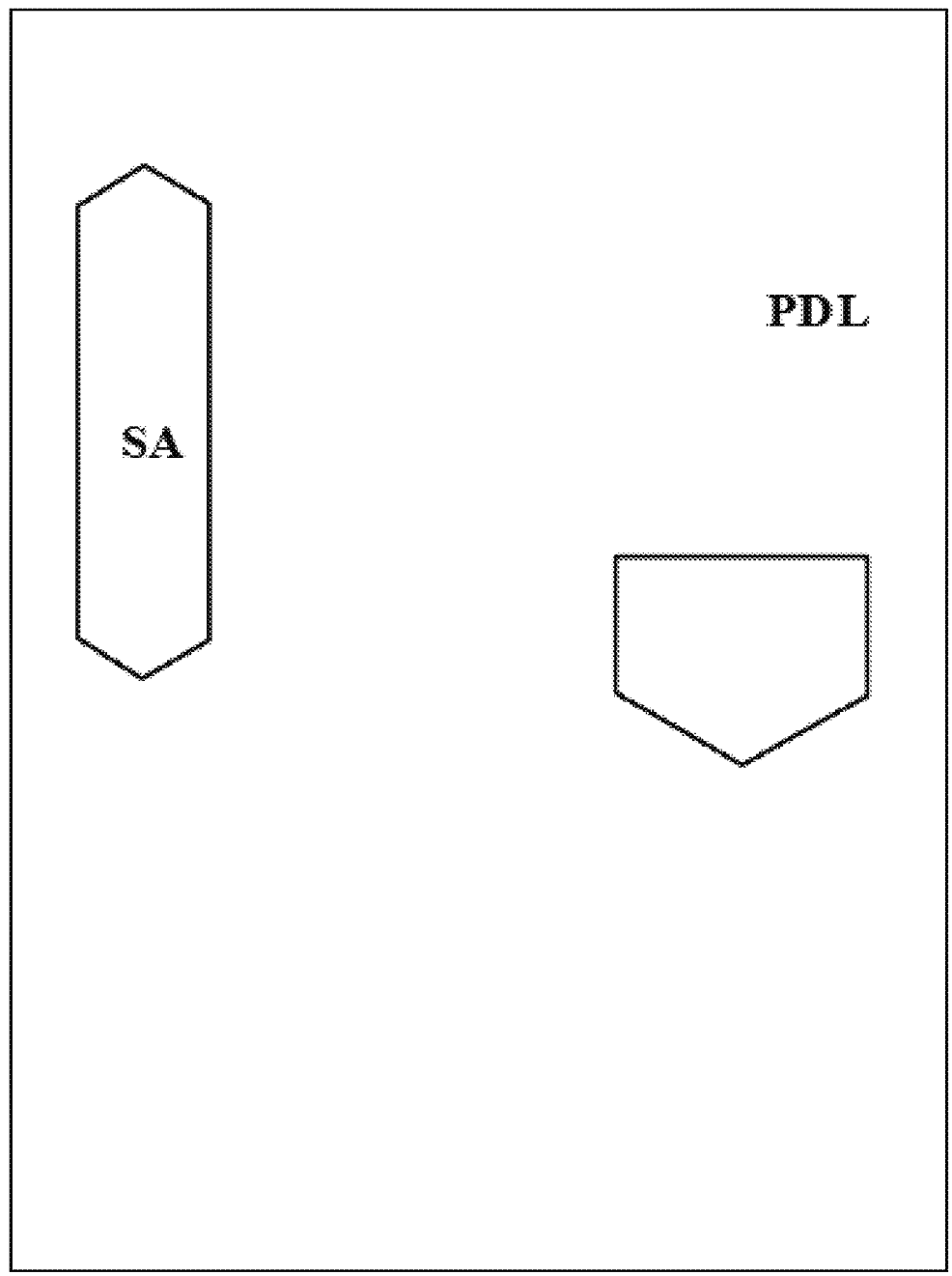

FIG. 3A is a diagram illustrating the structure of two adjacent pixel driving circuits in as array substrate is some embodiments according to the present disclosure. FIG. 3B is a diagram illustrating the structure of a first semiconductor material layer of two adjacent pixel driving circuits in an array substrate depicted in FIG. 3A. FIG. 3C is a diagram illustrating the structure of a first gate metal layer of two adjacent pixel driving circuits in an array substrate depicted in FIG. 3A. FIG. 1D is a diagram illustrating the structure of a second gate metal layer of two adjacent pixel driving circuits in an array substrate depicted in FIG. 3A. FIG. 3E is a diagram illustrating the structure of a second semiconductor material layer of two adjacent pixel driving circuits in an array substrate depicted in FIG. 3A. FIG. 3F is a diagram illustrating the structure of a third gate metal layer of two adjacent pixel driving circuits in an array substrate depicted in FIG. 3A. FIG. 3G is a diagram illustrating vias extending dough a passivation layer, a second inter-layer dielectric layer, a first inter-layer dielectric layer, an insulating layer and a gate insulating layer in an array substrate depicted in FIG. 3A. FIG. 3H is a diagram illustrating vias extending through a passivation layer and a second inter-layer dielectric layer is an array substrate depicted in FIG. 3A. FIG. 3I is a diagram illustrating the structure of a first signal line layer of two adjacent pixel driving circuits in an array substrate depicted in FIG. 3A. FIG. 3J is a diagram illustrating vias extending through a first planarization layer in an array substrate depicted in FIG. 3A. FIG. 3K is a diagram illustrating was extending through a passivation layer, a second inter-layer dielectric layer, a first inter-layer dielectric layer, an insulating layer and a gate insulating layer is an array substrate depicted in FIG. 3A. FIG. 3L is a diagram illustrating the structure of a second signal line layer of two adjacent pixel driving circuits in an array substrate depicted in FIG. 3A. FIG. 3M is a diagram illustrating vias extending through a second planarization layer in an array substrate depicted in FIG. 3A. FIG. 3N is a diagram illustrating the structure of an anode layer of two adjacent pixel driving circuits in an array substrate depicted in FIG. 3A. FIG. 3O is a diagram illustrating the structure of a pixel definition layer of two adjacent pixel driving circuits in an array substrate depicted is FIG. 3A.

Figure 4A:
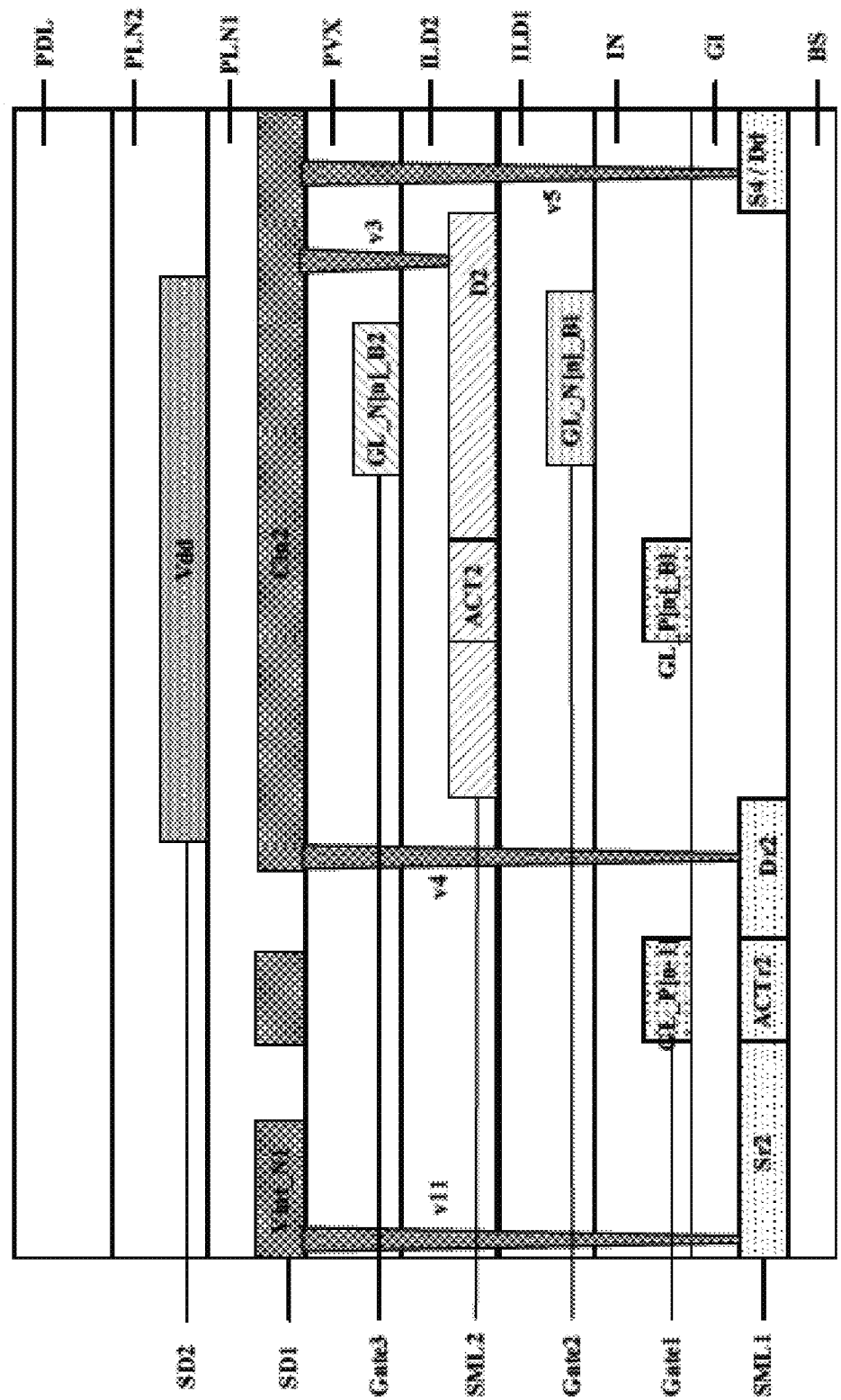
FIG. 4A is a cross-sectional view along an A-A' line in FIG. 3A.
Figure 4B:
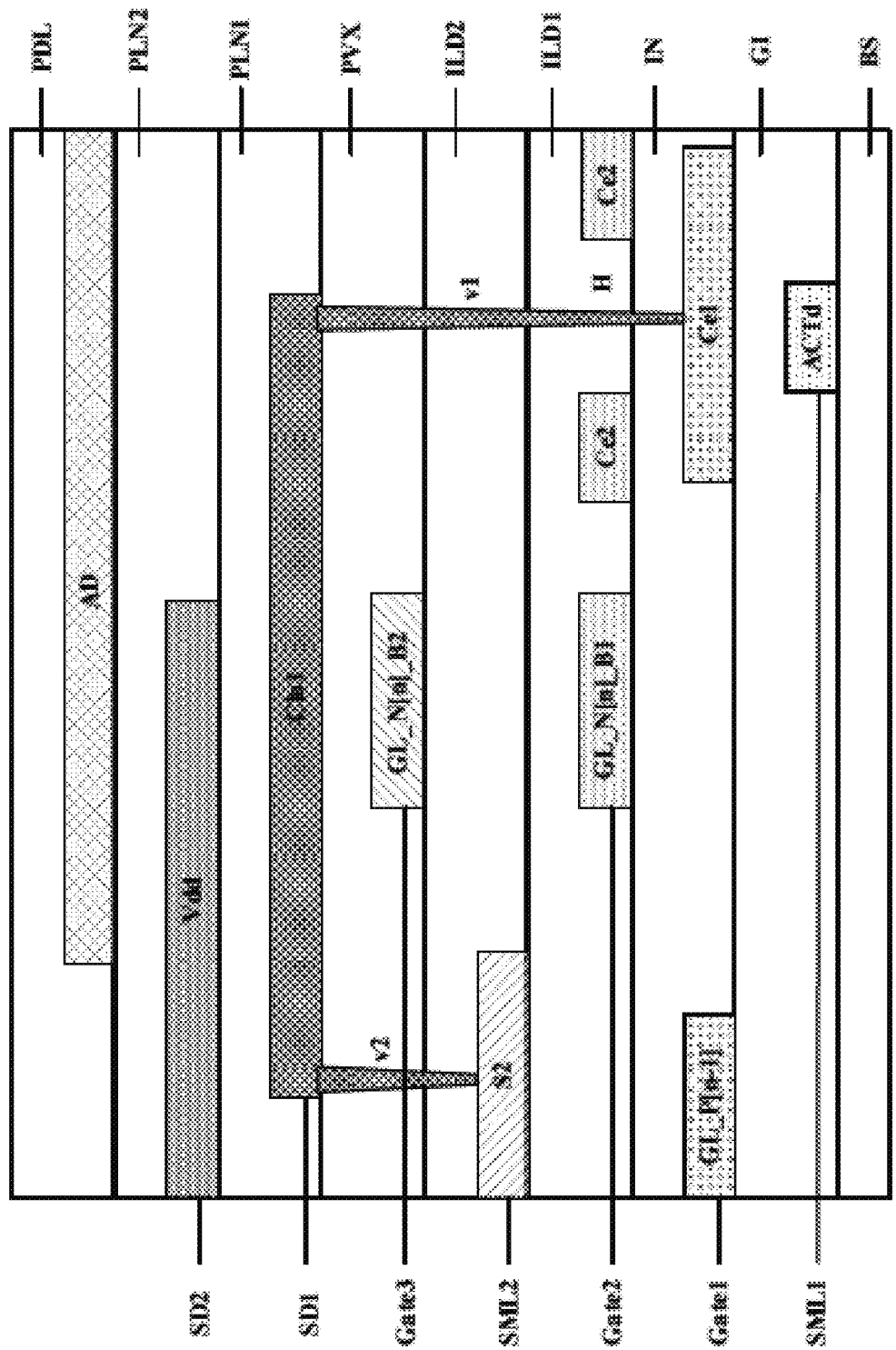
FIG. 4B is a cross-sectional view along a B-B' line in FIG. 3A.
Figure 4C:
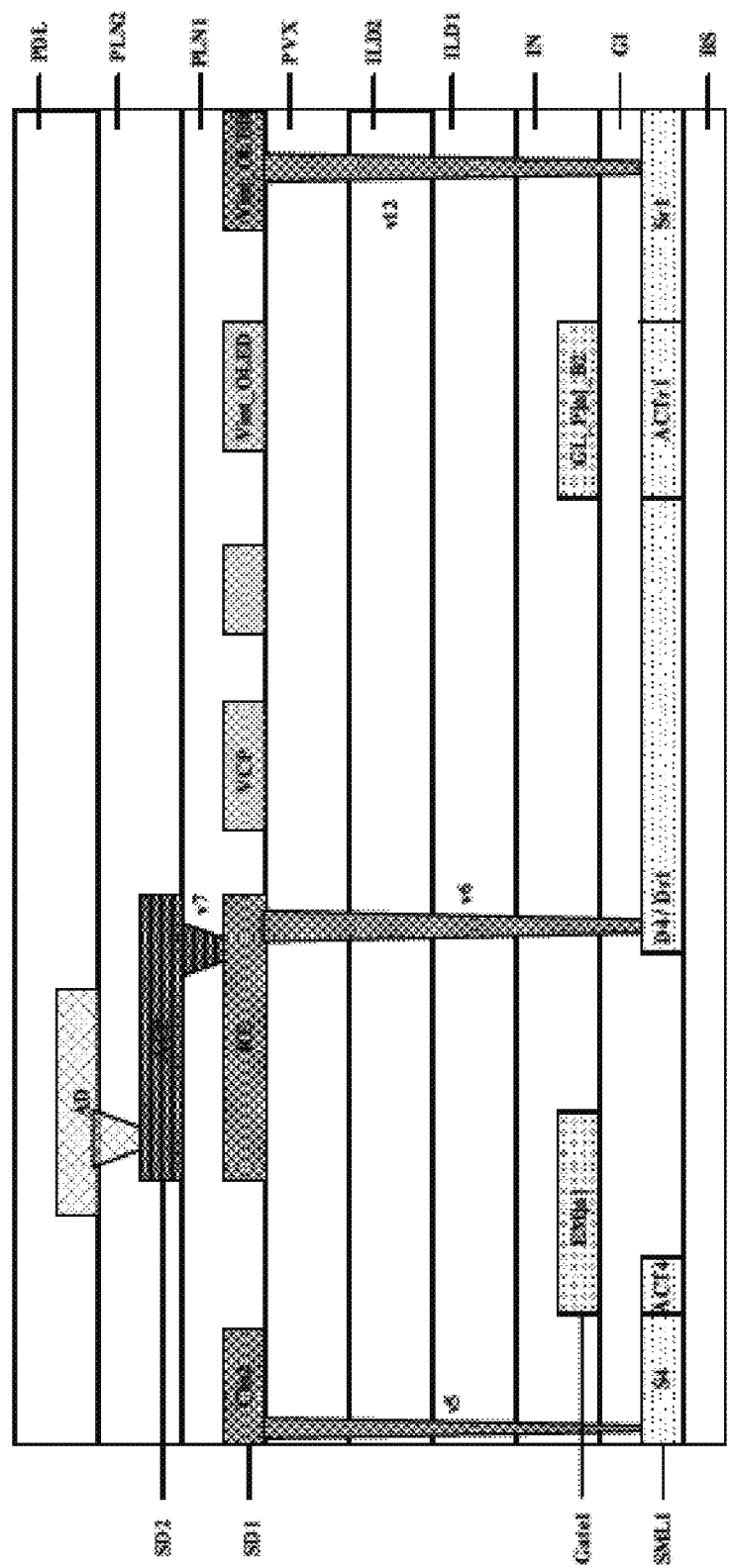
FIG. 4C is a cross-sectional view along a C-C' line in FIG. 3A.
Figure 4D:
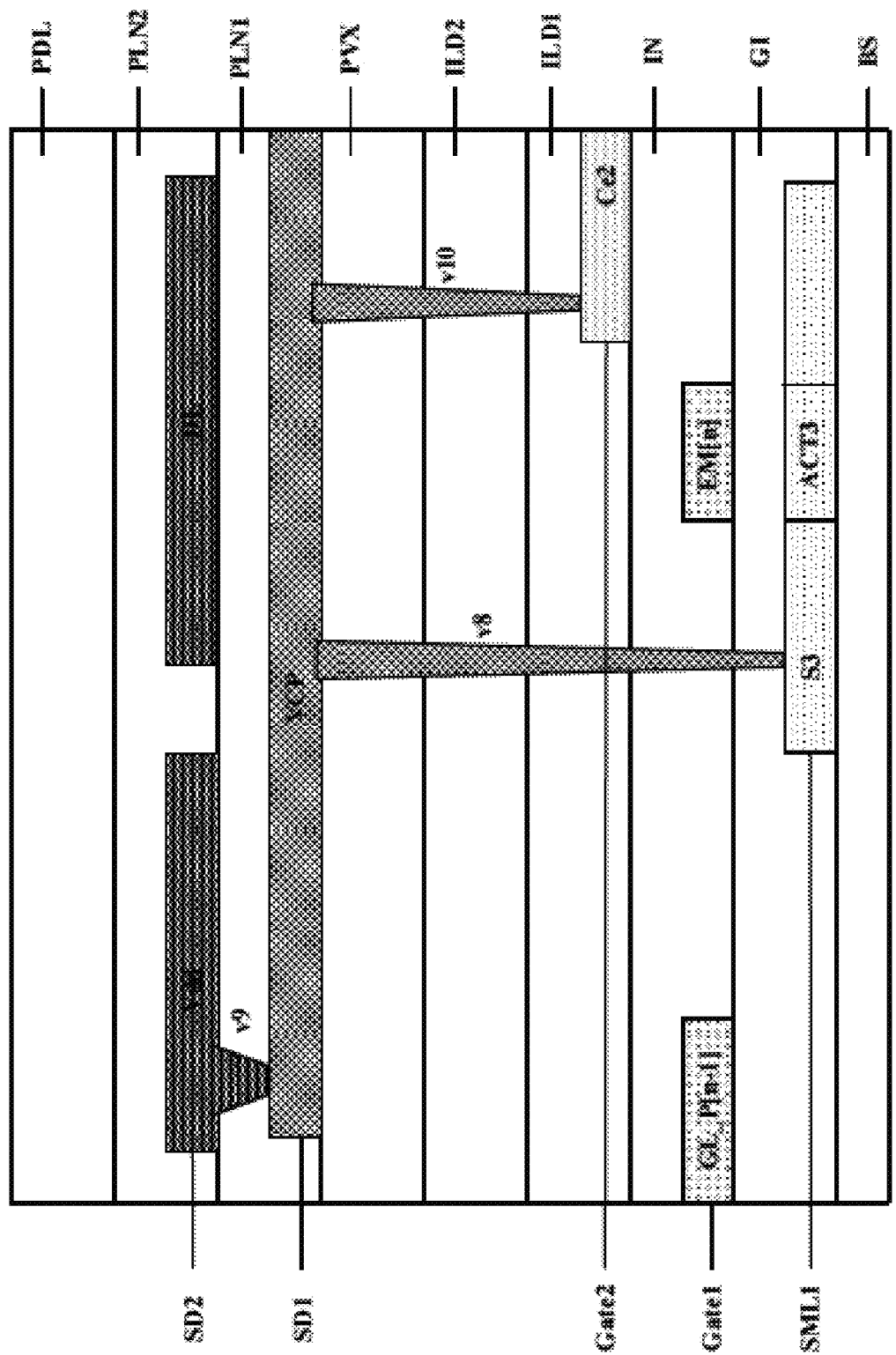
FIG. 4D is a cross-sectional view along a D-D' line in FIG. 3A.

FIG. 4A is a cross-sectional view along an A-A' line in FIG. 3A. FIG. 4B is a cross-sectional view along a B-B' line in FIG. 3A. FIG. 4C is a cross-sectional view along a C-C' line an FIG. 3A. FIG. 4D is a cross-sectional view along a D-D' line is FIG. 3A.

Figure 5A:
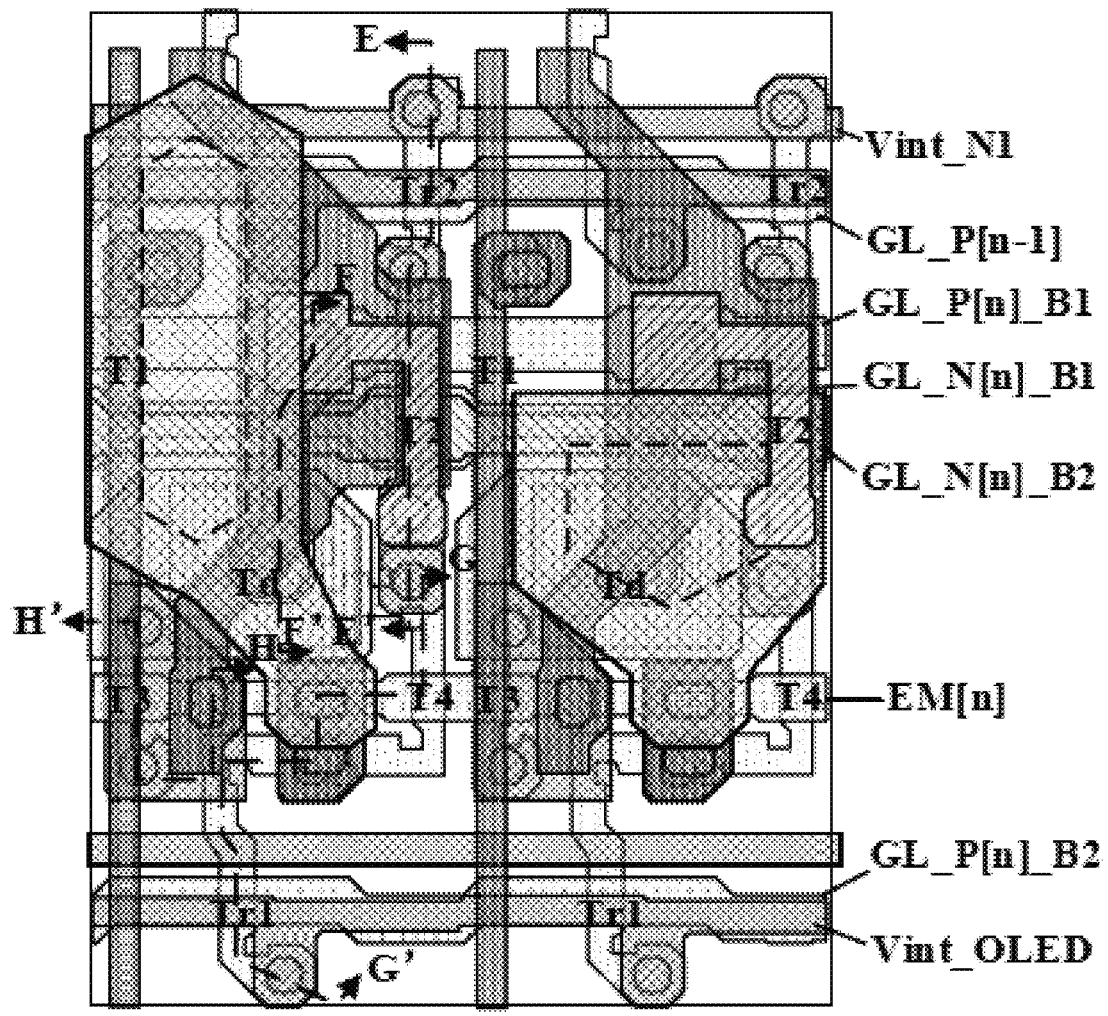
FIG. 5A is a diagram illustrating the structure of two adjacent pixel driving circuits in an array substrate in some embodiments according to the present disclosure.
Figure 5B:
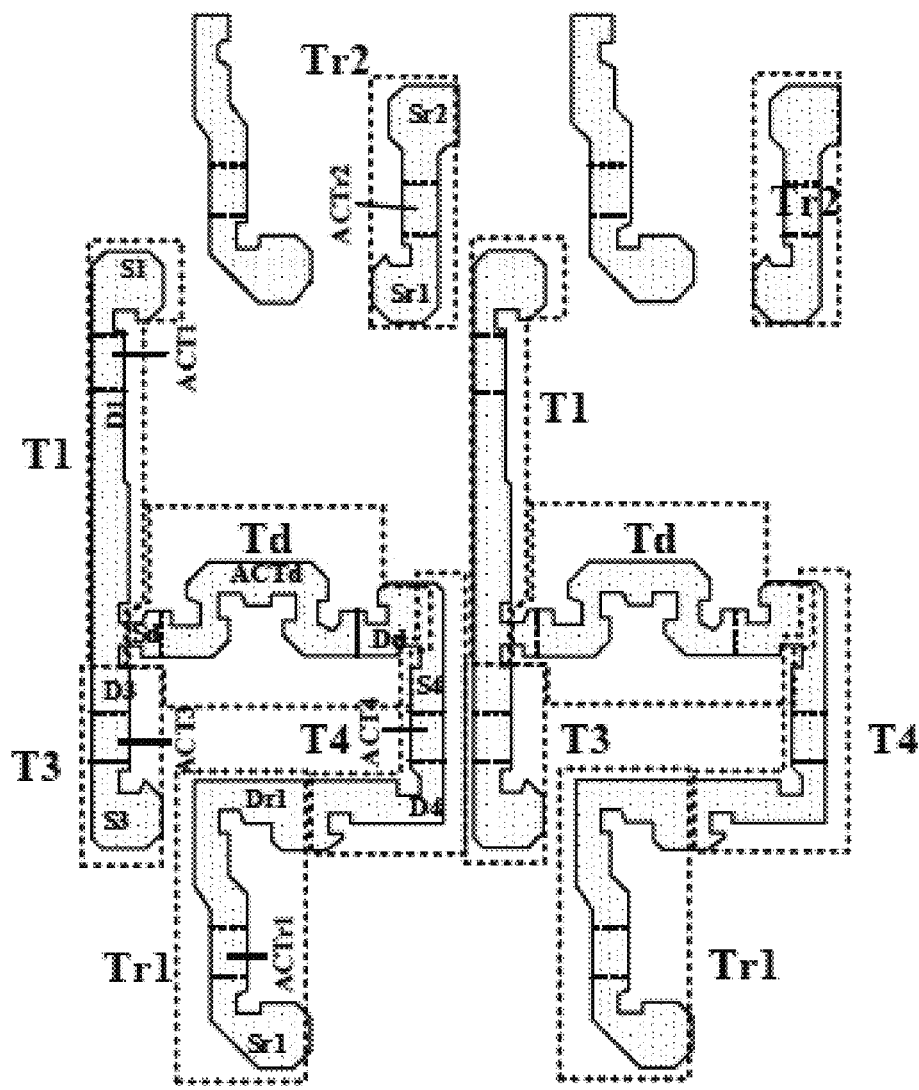
FIG. 5B is a diagram illustrating the structure of a first semiconductor material layer of two adjacent pixel driving circuits in an array substrate depicted in FIG. 5A.
Figure 5C:
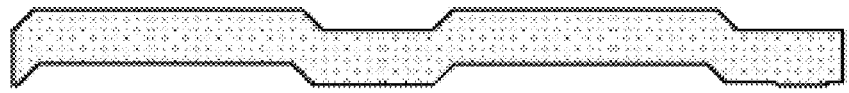
FIG. 5C is a diagram illustrating the structure of a first gate metal layer of two adjacent pixel diving circuits in an array substrate depicted in FIG. 5A.
Figure 5C:
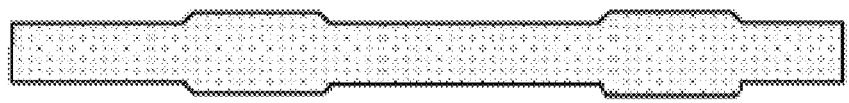
Figure 5C:
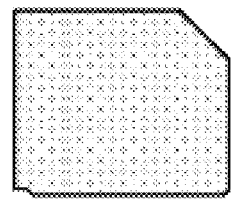
Figure 5C:
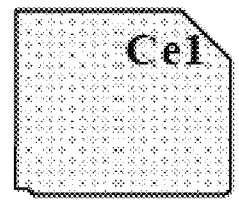
Figure 5C:
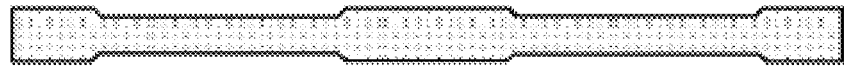
Figure 5C:
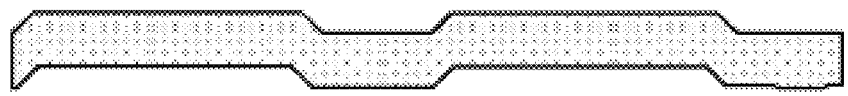
Figure 5D:
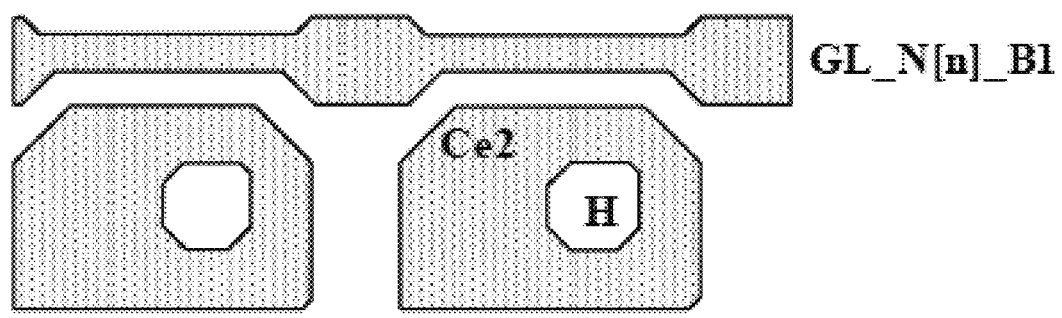
FIG. 5D is a diagram illustrating the structure of a second gate metal layer of two adjacent pixel driving circuits is an array substrate depicted in FIG. 5A.
Figure 5E:
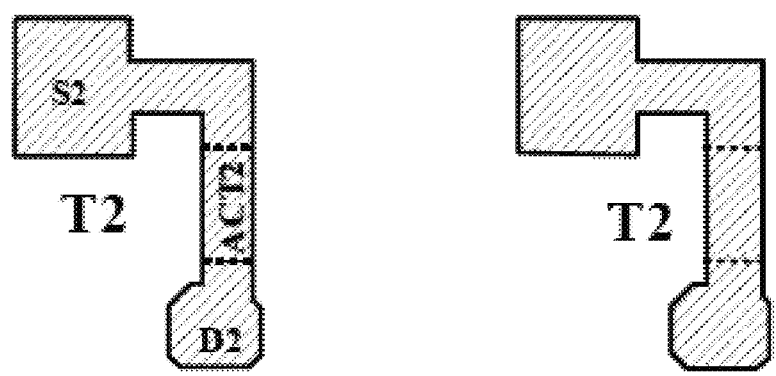
FIG. 5E is a diagram illustrating the structure of a second semiconductor material layer of two adjacent pixel driving circuits is an array substrate depicted in FIG. 5A.
Figure 5F:
FIG. 5F is a diagram illustrating the structure of a third gate metal layer of two adjacent pixel driving circuits is an array substrate depicted in FIG. 5A.
Figure 5G:
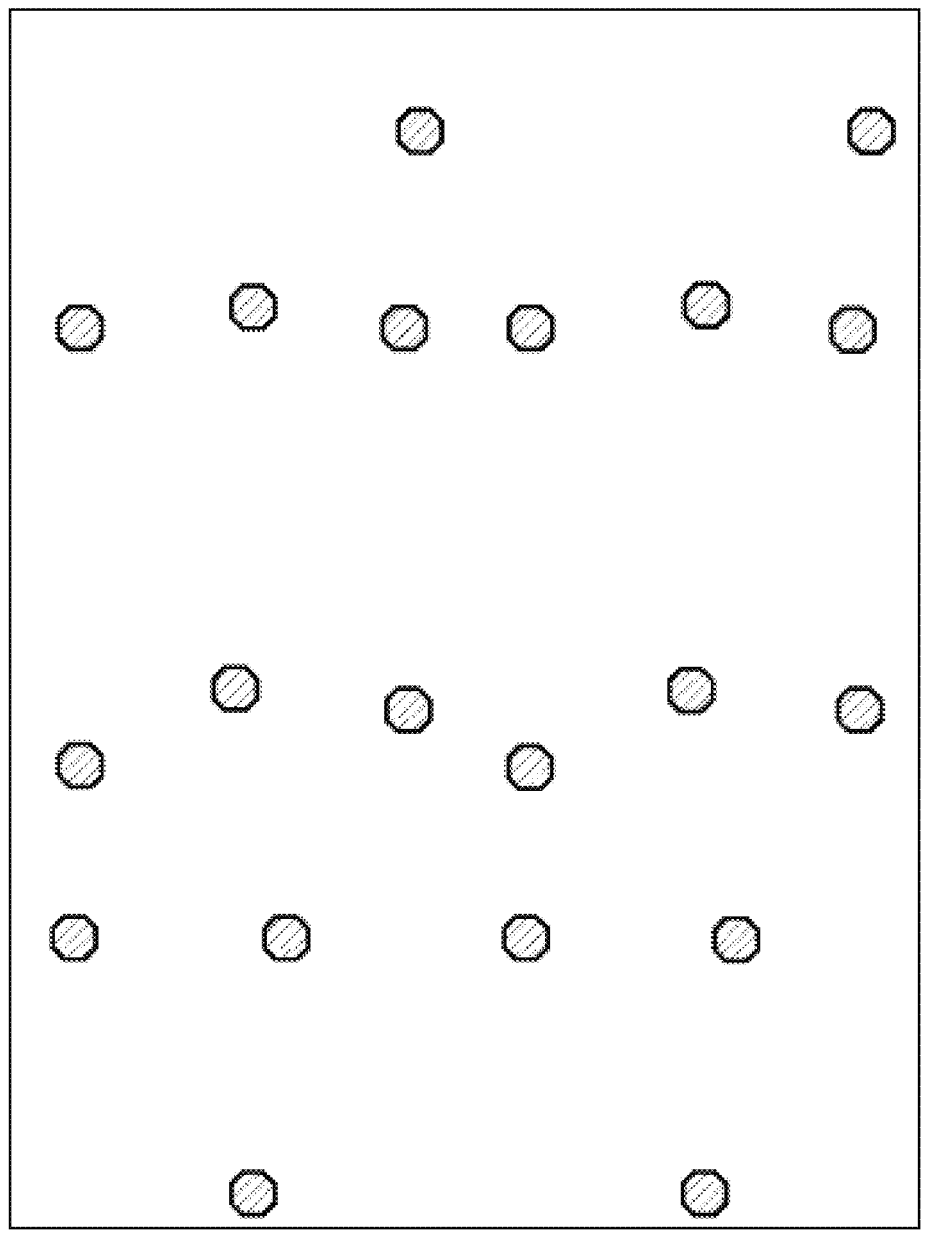
FIG. 5G is a diagram illustrating vias extending through a passivation layer, a second inter-layer dielectric layer, a first inter-layer dielectric layer, an insulating layer and a gate insulating layer in an array substrate depicted in FIG. 5A.
Figure 5H:
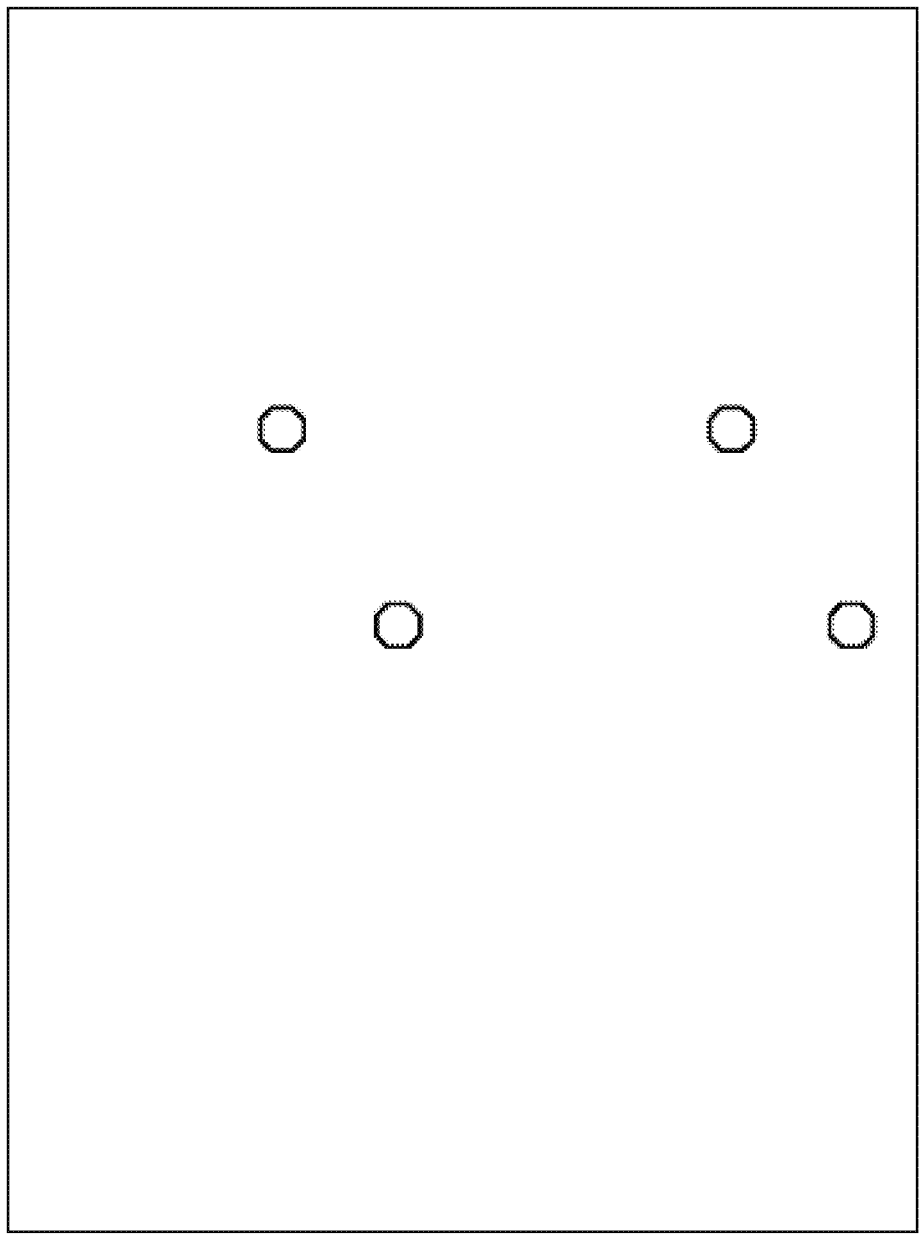
FIG. 5H is a diagram illustrating vias extending through a passivation layer and a second inter-layer dielectric layer in an array substrate depicted in FIG. 5A.
Figure 5I:
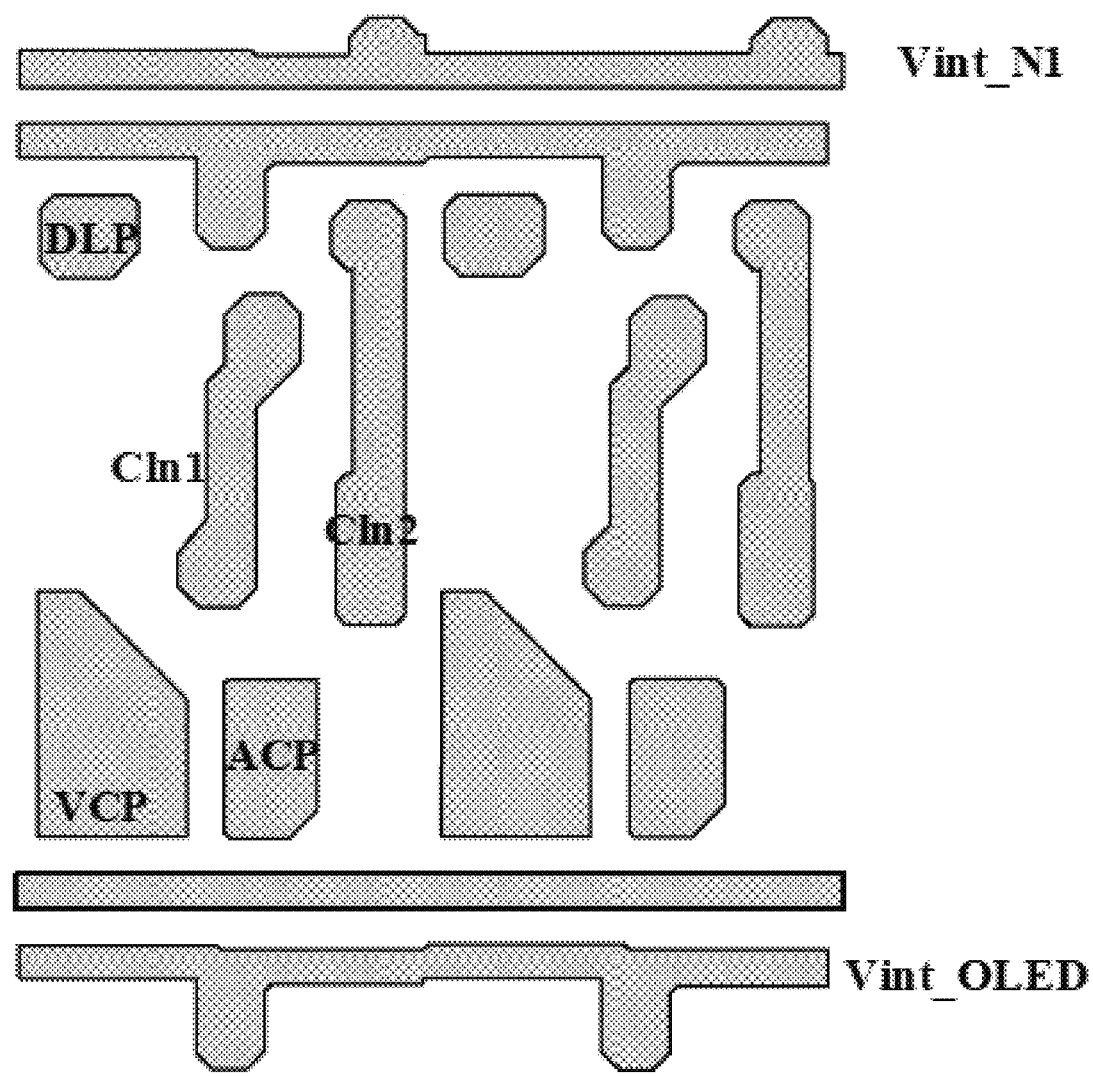
FIG. 5I is a diagram illustrating the structure of a first signal line layer of two adjacent pixel driving circuits is an array substrate depicted in FIG. 5A.
Figure 5J:
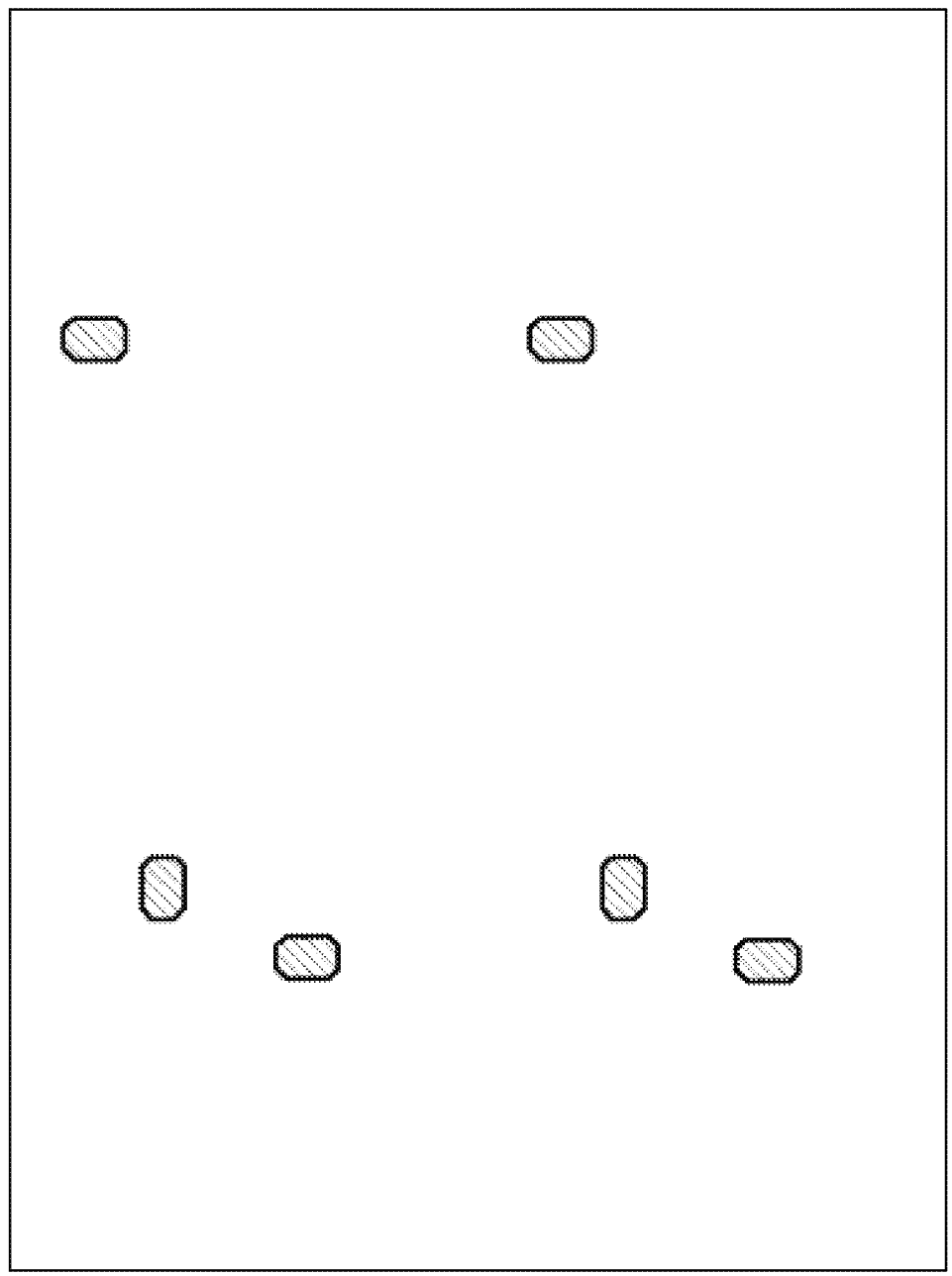
FIG. 5J is a diagram illustrating vias extending through a first planarization layer in as array substrate depicted in FIG. 5A.
Figure 5K:
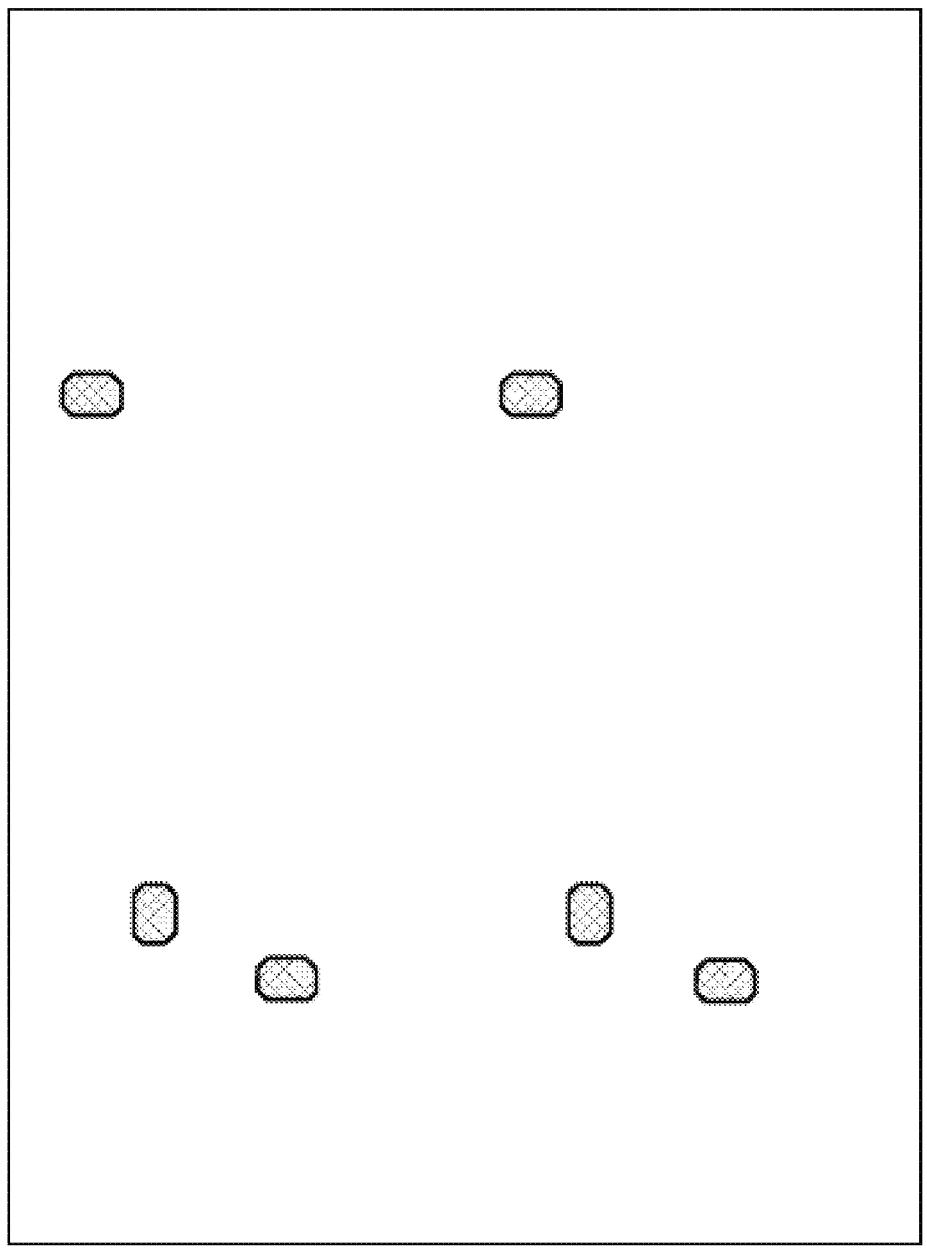
FIG. 5K is a diagram illustrating vias extending through a passivation layer, a second inter-layer dielectric layer, a first inter-layer dielectric layer, an insulating layer and a gate insulating layer in an array substrate depicted in FIG. 5A.
Figure 5L:
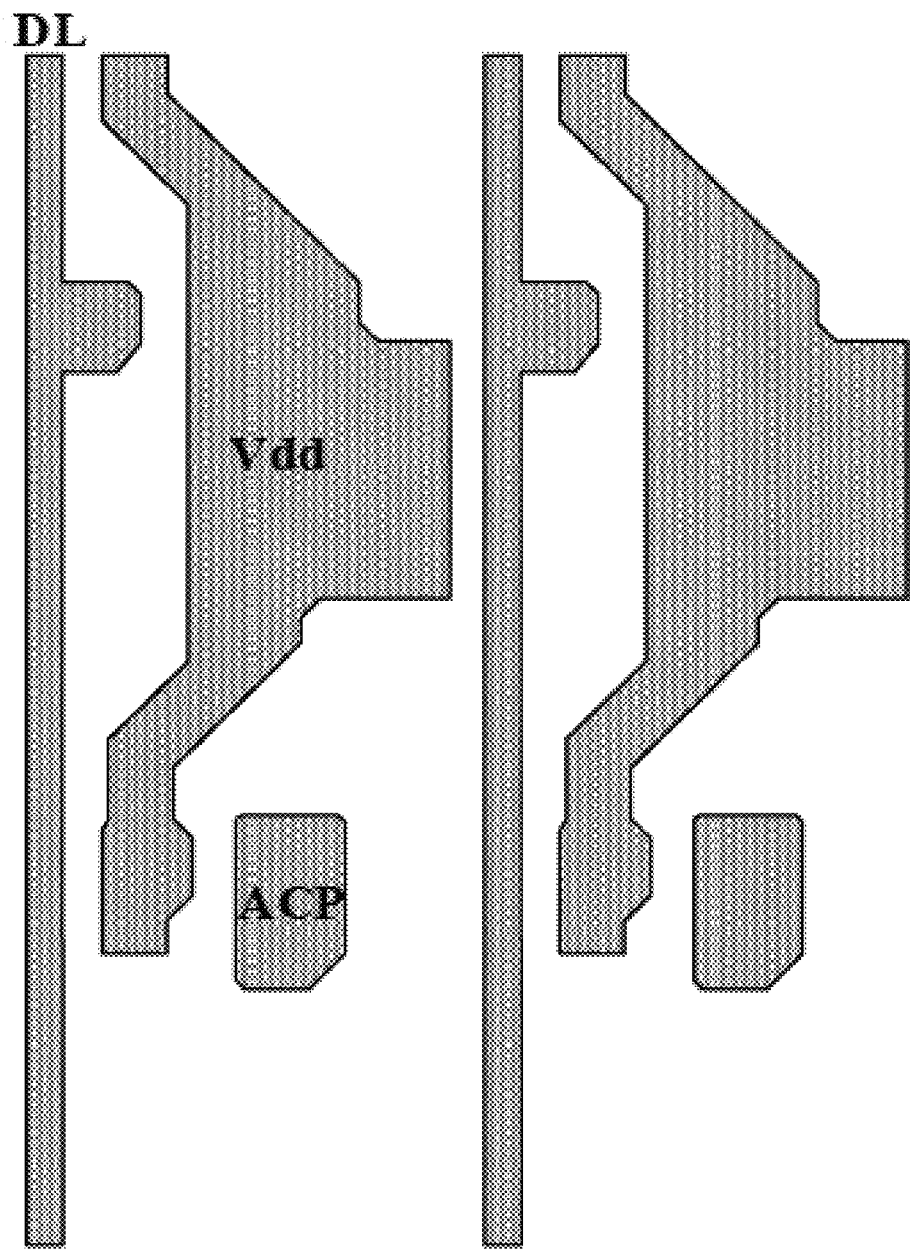
FIG. 5L is a diagram illustrating the structure of a second signal line layer of two adjacent pixel driving circuits is an array substrate depicted in FIG. 5A.
Figure 5M:
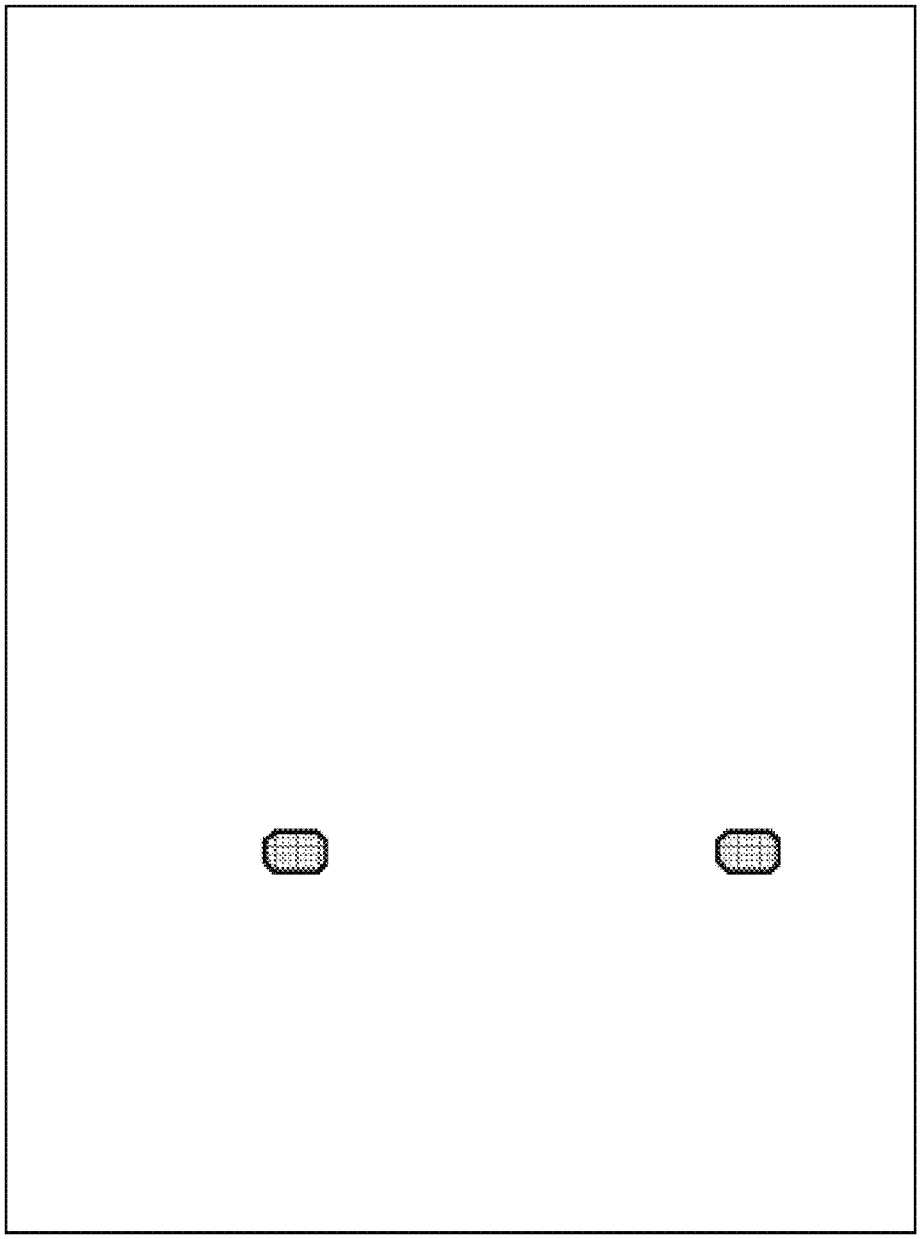
FIG. 5M is a diagram illustrating vias extending through a second planarization layer in an array substrate depicted in FIG. 5A.
Figure 5N:
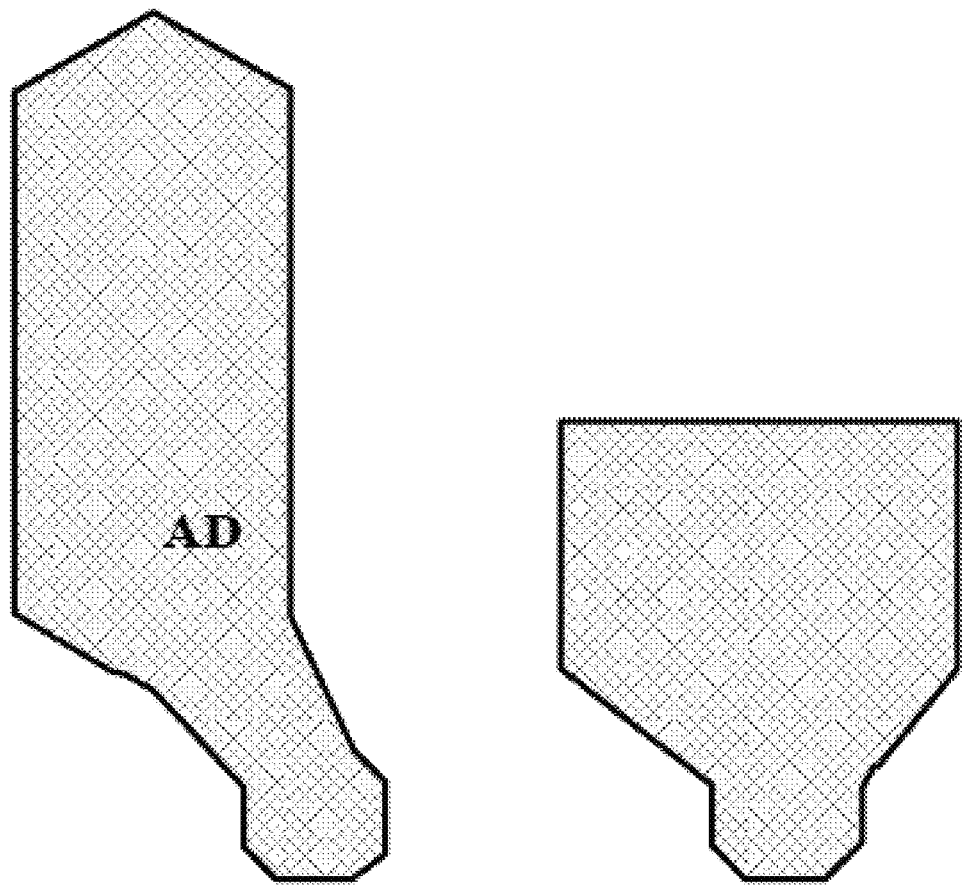
FIG. 5N is a diagram illustrating the structure of an anode layer of two adjacent pixel driving circuits in an array substrate depicted in FIG. 5A.
Figure 5O:
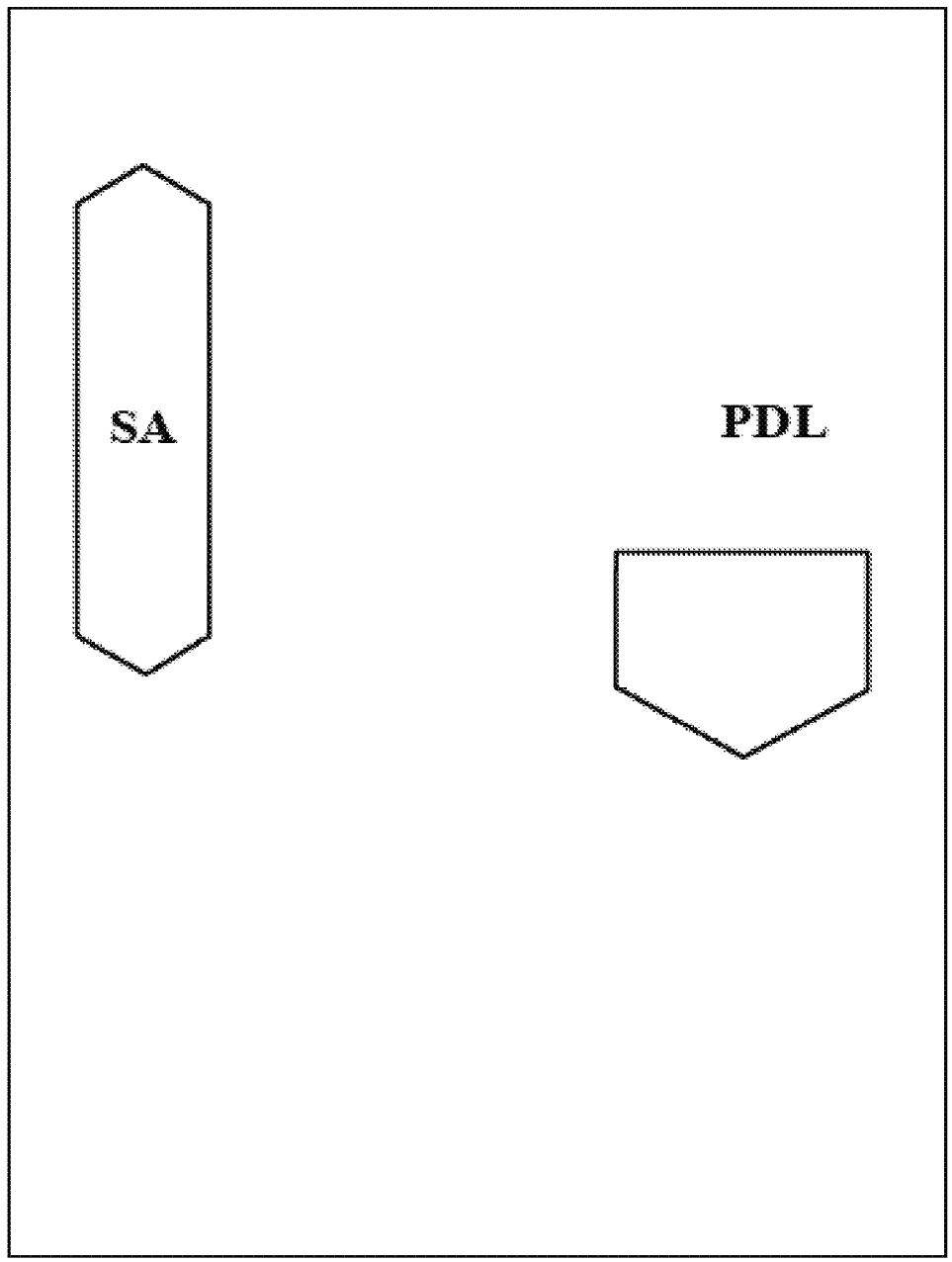
FIG. 5O is a diagram illustrating the structure of a pixel definition layer of two adjacent pixel driving circuits is an army substrate depicted in FIG. 5A.

FIG. 5A is a diagram illustrating the structure of two adjacent pixel driving circuits in aw array substrate aw some embodiments according to the present disclosure. FIG. 5B as a diagram illustrating the structure of a first semiconductor material layer of two adjacent pixel driving circuits in an array substrate depicted in FIG. 5A. FIG. 5C is a diagram illustrating the structure of a first gate metal layer of two adjacent pixel driving circuits in an array substrate depicted in FIG. 5A. FIG. 5D is a diagram illustrating the structure of a second gate metal layer of two adjacent pixel driving circuits in an array substrate depicted in FIG. 5A. FIG. 5E is a diagram illustrating the structure of a second semiconductor material layer of two adjacent pixel driving circuits in an array substrate depicted in FIG. 5A. FIG. 5F is a diagram illustrating the structure of a third gate metal layer of two adjacent pixel driving circuits in an array substrate depicted in FIG. 5A. FIG. 5G is a diagram illustrating vias extending dough a passivation layer, a second inter-layer dielectric layer, a first inter-layer dielectric layer, an insulating layer and a gate insulating layer in an array substrate depicted in FIG. 5A. FIG. 5H is a diagram illustrating vias extending through a passivation layer and a second inter-layer dielectric layer is an array substrate depicted in FIG. 5A. FIG. 5I is a diagram illustrating the structure of a first signal line layer of two adjacent pixel driving circuits in an array substrate depicted in FIG. 5A. FIG. 5J is a diagram illustrating vias extending through a first planarization layer in an array substrate depicted in FIG. 5A. FIG. 5K is a diagrams illustrating vias extending through a passivation layer, a second inter-layer dielectric layer, a first inter-layer dielectric layer, an insulating layer and a gate insulating layer is an array substrate depicted in FIG. 5A. FIG. 5L is a diagram illustrating the structure of a second signal line layer of two adjacent pixel driving circuits in an array substrate depicted in FIG. 5A. FIG. 5M is a diagram illustrating vias extending through a second planarization layer in an array substrate depicted in FIG. 5A. FIG. 5N is a diagram illustrating the structure of an anode layer of two adjacent pixel driving circuits in an array substrate depicted in FIG. 5A. FIG. 5O is a diagram illustrating the structure of a pixel definition layer of two adjacent pixel diving circuits is an array substrate depicted in FIG. 5A.

Figure 6A:
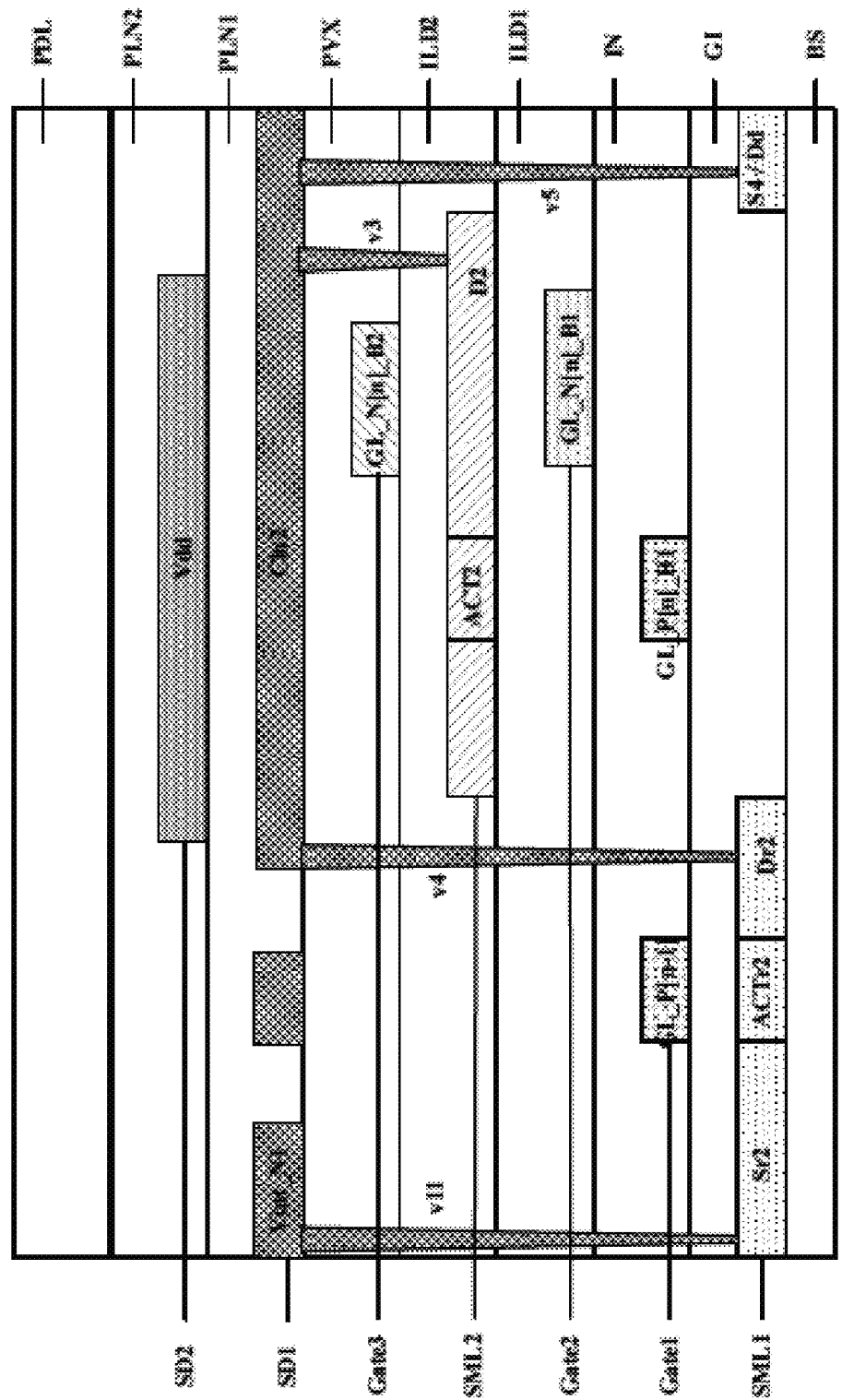
FIG. 6A is a cross-sectional view along a E-E' line in FIG. 5A.
Figure 6B:
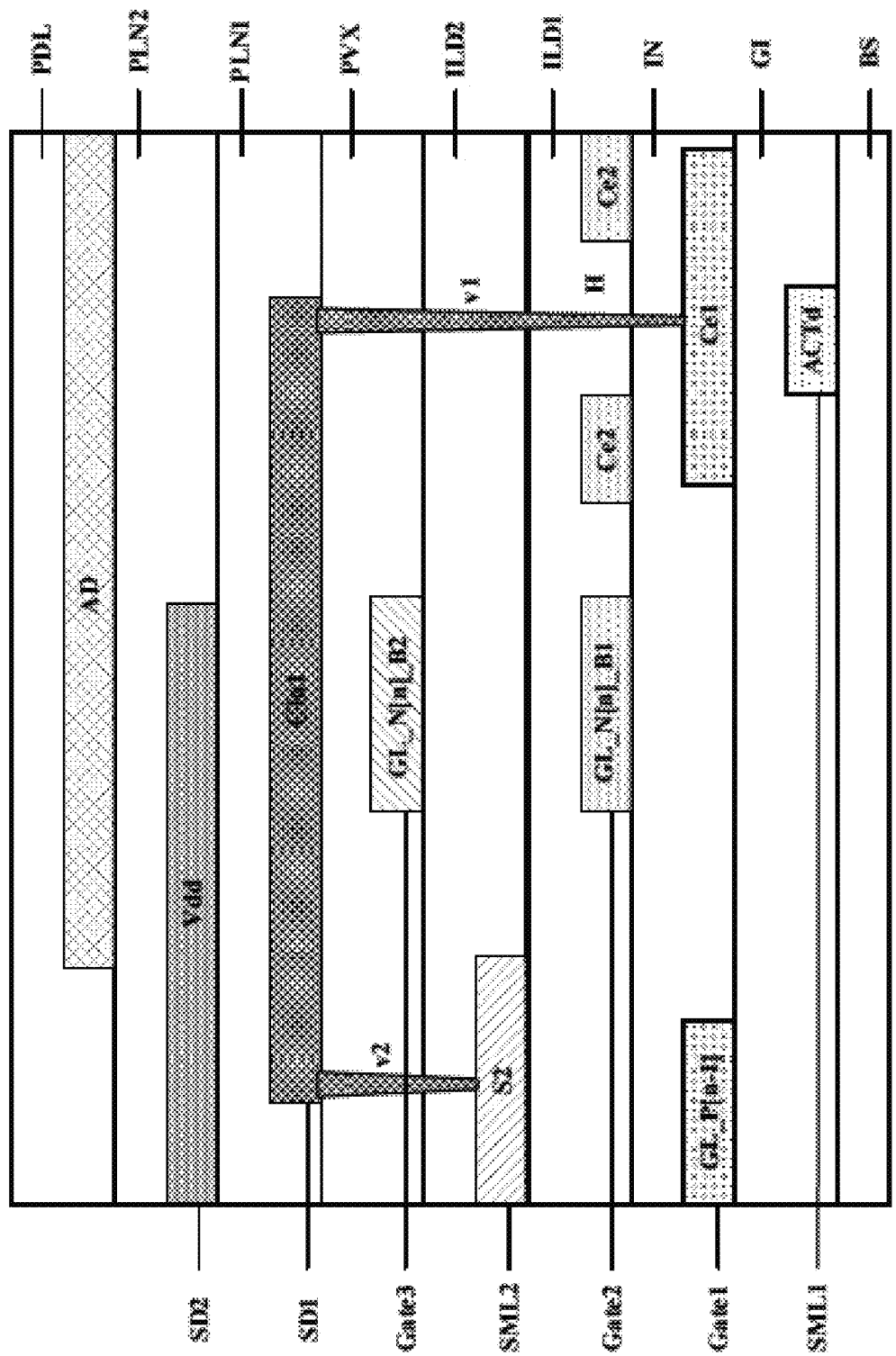
FIG. 6B is a cross-sectional view along an F-F' line in FIG. 5A.
Figure 6C:
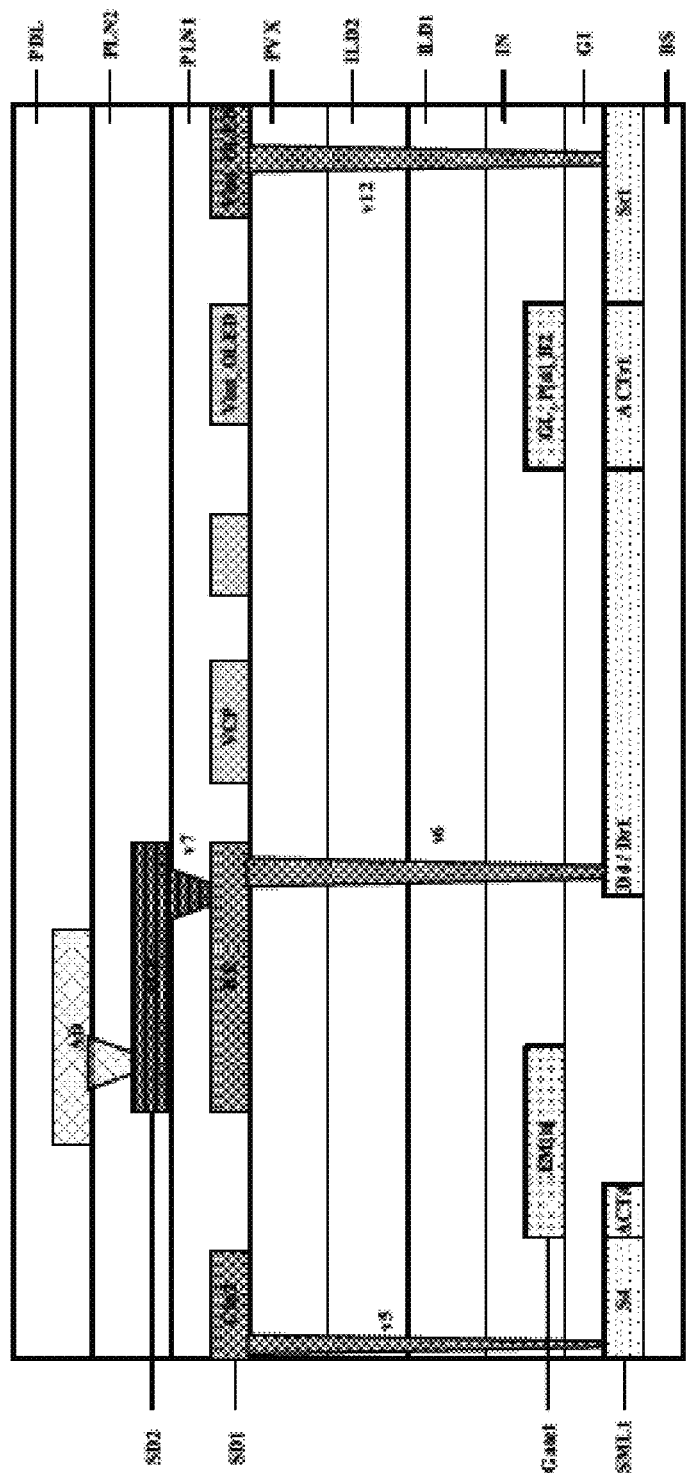
FIG. 6C is a cross-sectional view along a G-G' line in FIG. 5A.
Figure 6D:
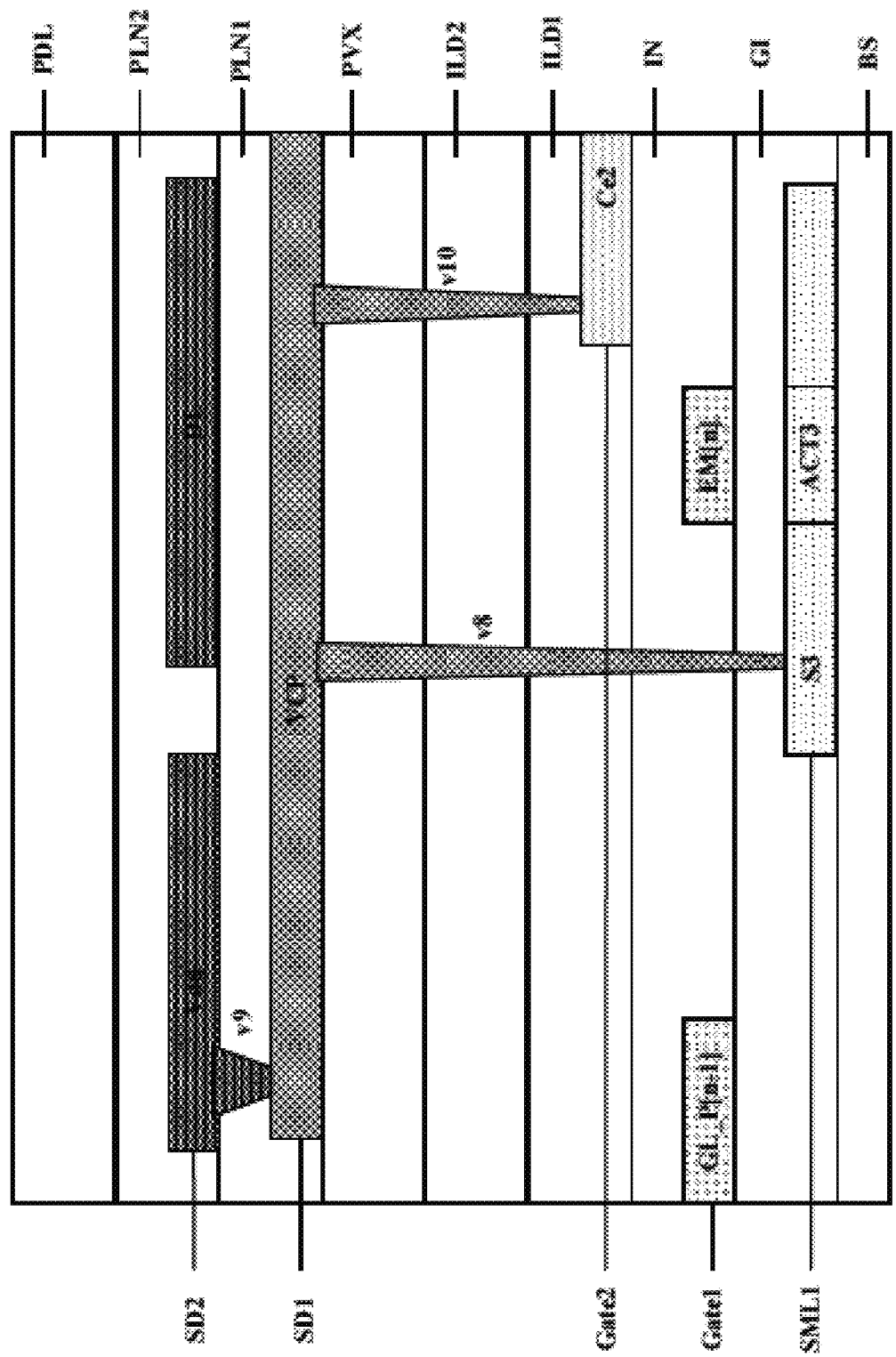
FIG. 6D is a cross-sectional view along an H-H' line in FIG. 5A.

FIG. 6A is a cross-sectional view along a E-E' line in FIG. 5A. FIG. 6B is a cross-sectional view along aw F-F' line in FIG. 5A. FIG. 6C is a cross-sectional view along a G-G' line in FIG. 5A. FIG. 6D is a cross-sectional view along an H-H' line in FIG. 5A.

Referring to FIG. 3A to FIG. 3O, and FIG. 4A to FIG. 4D, is some embodiments, corresponding layers of a first pixel driving circuit and corresponding layers of a second pixel diving circuit directly adjacent to each other and is the present stage have a substantially mirror symmetry with respect to each other, e.g., about a plane perpendicular to a main surface of the array substrate and substantially parallel to the data lines in FIG. 3A. As used herein, the term "corresponding layers of a first pixel driving circuit and corresponding layers of a second pixel driving circuit" is not intended to include layers that are not parts of the pixel driving circuits. For example, the "corresponding layers of a first pixel driving circuit and corresponding layers of a second pixel driving circuit" do wot include an anode layer or a pixel definition layer. In one example, the "corresponding layers of a first pixel driving circuit and corresponding layers of a second pixel driving circuit" refers to conductive layers of the first pixel driving circuit and conductive layers of a second pixel driving circuit. In one specific example, "corresponding layers" includes at least one of a first semiconductor material layer, a East gate metal layer, a second gate metal layer, a second semiconductor material layer, a third gate metal layer, a first signal line layer, or a second signal line layer. In another specific example, "corresponding layers" father includes at least one of a gate insulating layer, an insulating layer, a first inter-layer dielectric layer, a second inter-layer dielectric layer, a passivation layer, a first planarization layer, or a second planarization layer.

Referring to FIG. 5A to FIG. 5O, and FIG. 6A to FIG. 6D, is some embodiments, corresponding layers of a first pixel driving circuit and corresponding layers of a second pixel driving circuit directly adjacent to each other and is the present stage have a substantially translational symmetry with respect to each other, e.g., along an extension direction of the gate lines is FIG. 5A. As used herein, the term "corresponding layers of a first pixel driving circuit and corresponding layers of a second pixel driving circuit" is not intended to include layers that are not parts of the pixel driving circuits. For example, the "corresponding layers of a first pixel driving circuit and corresponding layers of a second pixel driving circuit" do not include an anode layer or a pixel definition layer. In one example, the "corresponding layers of a first pixel driving circuit and corresponding layers of a second pixel driving circuit" refers to conductive layers of the first pixel driving circuit and conductive layers of a second pixel driving circuit. In one specific example, "corresponding layers" includes at least one of a first semiconductor material layer, a first gate metal layer, a second gate metal layer, a second semiconductor material layer, a third gate metal layer, a first signal line layer, or a second signal line layer. Is another specific example, "corresponding layers" further includes at least one of a gate insulating layer, an insulating layer, a first inter-layer dielectric layer, a second inter-layer dielectric layer, a passivation layer, a first planarization layer, or a second planarization layer.

Referring to FIG. 3A to FIG. 3O, FIG. 4A to FIG. 4D, FIG. 5A to FIG. 5O, and FIG. 6A to FIG. 6D, in some embodiments, the array substrate includes a base substrate BS, a first semiconductor material layer SML1 on the base substrate BS, a gate insulating layer GI on a side of the first semiconductor material layer SML1 away from the base substrate BS, a first gate metal layer Gate1 on a side of the gate insulating layer GI away from the first semiconductor material layer SML1, an insulating layer IN on a side of the first gate metal layer Gate1 away from the gate insulating layer GI, a second gate metal layer Gate1 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate1 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the ford gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, a second planarization layer PLN2 on a side of the second signal line layer SD2 away from the fast planarisation layer PLN1, aw anode layer AD on a side of the second planarization layer PLN2 away from the second signal line layer SD2, and a pixel definition layer PDL on a side of the anode layer AD away from the second planarization layer PLN2.

Referring to FIG. 2, FIG. 3A, FIG. 3B, FIG. 5A. FIG. 5B, FIG. 4A & FIG. 4D, and FIG. 6A to FIG. 6D, in some embodiments, the first semiconductor material layer SML1 includes at least active layers of multiple transistors of the pixel driving circuit, including the first transistor T1, the third transistor T3, the fourth transistor T4, the first reset transistor Tr1, the second reset transistor Tr2, and the driving transistor Td. Optionally, the first semiconductor material layer SML1 further includes at least respective portions of source electrodes of multiple transistors of the pixel driving circuit, including the first transistor T1, the third transistor T3, the fourth transistor 14, the first reset transistor Tr1, the second reset transistor Tr2, and the driving transistor Td. Optionally, the first semiconductor material layer SML1 father includes at least respective portions of drain electrodes of multiple transistors of the pixel driving circuit, including the first transistor T1, the third transistor 13, the fourth transistor T4, the first reset transistor Tr1, the second reset transistor Tr2, and the driving transistor Td. Optionally, the first semiconductor material layer SML1 includes active layers, source electrodes, and drain electrodes of multiple transistors of the pixel diving circuit, including the first transistor T1, the third transistor T3, the fourth transistor T4, the first reset transistor Tr1, the second reset transistor Tr2, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 3B and FIG. 5B, the pixel driving circuit on the left is annotated with labels indicating components of each of multiple transistors (T1, T3, T4, Tr1, Tr2, and Td) is the pixel driving circuit. For example, the first transistor T1 includes an active layer ACT1, a source electrode S1, and a drain electrode D1. The third transistor T3 includes an active layer ACT3, a source electrode S3, and a drain electrode D3. The fourth transistor T4 includes an active layer ACT4, a source electrode S4, and a drain electrode DA. The first reset transistor Tr1 includes an active layer ACTr1, a source electrode Sr1, and a drain electrode Dr1. The second reset transistor Tr2 includes an active layer ACTr2, a source electrode Sr1, and a drain electrode Dr2. The driving transistor Td includes an active layer ACTA, a source electrode Sd, and a drain electrode Dd.

Optionally, the active layers (ACT1, ACT3, ACT4, ACTr1, ACTr2, and ACTd), de source electrodes (S1, S3, S4, Sr1, Sr2, and Sd), and the drain electrodes (D1, D3, D4, Dr1, Dr2, and Dd) of the respective transistors (T1, T3, T4, Tr1, Tr2, and Td) are in a same layer.

In some embodiments, the active layers (ACT1, ACT3, ACT4, ACTr1, and ACTd), the source electrodes (S1, S3, S4, Sr1, and Sd), and the drain electrodes (D1, D3, D4, Dr1, and Dd) of the respective transistors (T1, T3, T4, Tr1, and Td) in the pixel driving circuit are parts of a unitary structure. Optionally, a part of the second reset transistor Tr2 in the first semiconductor material layer is spaced apart from other transistors (T1, T3, T4, Tr1, and Td) in a same pixel diving circuit.

Referring to FIG. 3B, second reset transistors respectively from a first pixel driving circuit and a second pixel driving circuit directly adjacent to each other and in the present stage form a unitary structure. Specifically, source electrodes (or dram electrodes, depending on the direction of a current flowing through the second reset transistors) of the second reset transistors respectively from the first pixel driving circuit and the second pixel driving circuit directly adjacent to each other and in the present stage are connected to each other, thereby forming the unitary structure.

Referring to FIG. 2, FIG. 3A, FIG. 3C, FIG. 5A, FIG. 5C, FIG. 4A to FIG. 4D, and FIG. 6A to FIG. 6D, in some embodiments, the first gate metal layer Gate1 in some embodiments includes a plurality of first gate lines (e.g., a first gate line GL_P[n] in a present stage, a first gate line GL_P[n−1] in a previous stage), a respective light emitting control signal line EM[n] of a plurality of light emitting control signal lines, and a first capacitor electrode Ce1 of the storage capacitor Cst. Various appropriate electrode materials and various appropriate fabricating methods may be used to make the first gate metal layer Gate1. For example, a conductive material may be deposited on the substrate by a plasma-enhanced chemical vapor deposition (PECVD) process and patterned Examples of appropriate conductive materials for making the first gate metal layer Gate1 include, but are not limited to, aluminum, cooper, molybdenum, chromium, aluminum copper alloy, copper molybdenum alloy, molybdenum aluminum alloy, aluminum chromium alley, copper chromium alloy, molybdenum chromium alloy, copper molybdenum aluminum alloy, and the bike. Optionally, the plurality of first gate lines (e.g., a first gate line GL_P[n] in the present stage, the first gate line GL_P[n−1] is the previous stage), the respective light emitting control signal line EM[n] of the plurality of light emitting control signal lives, and the first capacitor electrode Ce1 of the stowage capacitor Cst are is a same layer.

As used herein, the term "same layer" refers to the relationship between the layers simultaneously formed in the same step. In one example, the plurality of first gate lines and the first capacitor electrode Ce1 are in a same layer when they are formed as a result of one of more steps of a same patterning process performed in a same layer of material. In another example, the plurality of first gate lines and the first capacitor electrode Ce1 can be formed in a same layer by simultaneously performing the step of forming the plurality of first gate lines, and the step of forming the first capacitor electrode Ce1. The term "same layer" does not always mean that the thickness of the layer or the height of the layer is a crow-sectional view is the same.

In some embodiments, referring to FIG. 3C and FIG. 5C, the first gate line GL_P[n] in the present stage includes a first gate line first branch GL_P[n]_B1 and a first gate line second branch GL_P[n]_B2 configured to be provided with a same gate scanning signal. The gate electrode of the first reset transistor Tr1 is connected to the first gate line second branch GL_P[n]_B2 in the present stage. The gate electrode of the second reset transistor Tr2 is connected to the first gate line second branch GL_P[n]_B2 in the previous stage.

In one example, the first gate line GL_P[n−1] in the previous stage in FIG. 3C shows a first gate line second branch in the previous stage.

Referring to FIG. 2, FIG. 3A, FIG. 3D, FIG. 5A, FIG. 5D, FIG. 4A to FIG. 4D, and FIG. 6A to FIG. 6D, in some embodiments, the second gate metal layer Gate2 in some embodiments includes at least portions of a plurality of second gate lines (e.g., a second gate line first branch GL_N[n]_B1) and a second capacitor electrode Ce2 of the storage capacitor Cst. Various appropriate electrode materials and various appropriate fabricating methods may be used to make the second gate metal layer Gate1. For example, a conductive material may be deposited on the substrate by a plasma-enhanced chemical vapor deposition (PECVD) process and patterned. Examples of appropriate conductive materials for making the second gate metal layer Gate2 include, but are not limited to, aluminum, copper, molybdenum, chromium, aluminum copper alloy, copper molybdenum alloy, molybdenum aluminum alloy, aluminum chromium alley, copper chromium alley, molybdenum chromium alloy, copper molybdenum aluminum alloy, and the like. Optionally, the second gate line first branch GL_N[n]_B1 and the second capacitor electrode Ce2 of the storage capacitor Cst are in a same layer.

Referring to FIG. 2, FIG. 3A, FIG. 3E, FIG. 5A, FIG. 5E, FIG. 4A to FIG. 4D, and FIG. 6A to FIG. 6D, in some embodiments, the second semiconductor material layer SML2 includes at least an active layer of the second transistor T2. Optionally, the second semiconductor material layer SML2 further includes at least a portion of a source electrode of the second transistor T2. Optionally, the second semiconductor material layer SML2 further includes at least a portion of a drain electrode of the second transistor T2. Optionally, the second semiconductor material layer SML2 includes the active layer, the source electrode, and the drain electrode of the second transistor T2. In the present array substrate, at least the active layer of the second transistor T2 is in a layer different from at least the active layers of other transistors of the pixel driving circuit. Various appropriate semiconductor materials may be used for walking the second semiconductor material layer SML2. Examples of the semiconductor materials for making the second semiconductor material layer SML2 include metal oxide-based semiconductor material such as indium gallium zinc oxide and metal oxynitride-based semiconductor materials such as zine oxynitride.

In FIG. 3E and FIG. 5E, the pixel driving circuit on the left is annotated with labels indicating components of the second transistor T2 in the pixel driving circuit. For example, the second transistor T2 includes an active layer ACT2, a source electrode S2, and a drain electrode D2. Optionally, the active layer ACT2, the source electrode S2, and the drain electrode D2 of the second transistor T2 are in a same layer.

Referring to FIG. 2, FIG. JA, FIG. 3F, FIG. 5A, FIG. 5F, FIG. 4A to FIG. 4D, and FIG. 6A to FIG. 6D, in some embodiments, the third gate metal layer Gate1 in some embodiments includes at least portions of a plurality of second gate lines (e.g., a second gate line second branch GL_N[n]_B2). Various appropriate electrode materials and various appropriate fabricating methods may be used to make the third gate metal layer Gate3. For example, a conductive material may be deposited on the substrate by a plasma-enhanced chemical vapor deposition (PECVD) process and patterned. Examples of appropriate conductive materials for making the third gate metal layer Gate3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the respective second gate line GL_N[n] in a present stage includes the second gate line first branch GL_N[n]_B1 and the second gate line second branch GL_N[n]_B2 in two different layers. Optionally, the second gate line first branch GL_N[n]_B1 is in the second gate metal layer Gate2, and the second gate lime second branch GL_N[n]_B2 is in the third gate metal layer Gate3. As shown in FIG. 4B and FIG. 6B, in some embodiments, an orthographic projection of the second gate line first branch GL_N[n]_B1 on a base substrate BS at least partially overlays with an orthographic projection of the second gate line second branch GL_N[n]_B2 on the base substrate BS.

Referring to FIG. 2, FIG. 3A, FIG. 3I, FIG. 5A, FIG. 5I, FIG. 4A to FIG. 4D, and FIG. 6A to FIG. 6D, in some embodiments, the first signal line layer SD1 includes a plurality of first reset signal lines (e.g., a respective first reset signal line Vint_OLED), a plurality of second reset signal loses (e.g., a respective second reset signal line Vint_N1), a first node connecting lore Cln1, a second mode connecting line Cln2, a voltage converting pad VCP, and a relay electrode RE. Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines (e.g., the respective first reset signal line Vint_OLED), the plurality of second reset signal lines (e.g., the respective second reset signal line Vint_N1), the first node connecting line Cln1, the second node connecting line Cln2, the voltage converting pad VCP, and the relay electrode RE are in a same layer. By having the plurality of first reset signal lines and the plurality of second reset signal lives in the first signal line layer SD1, the plurality of first reset signal lines and the plurality of second reset signal lines can be made of a material of low resistance, thereby improving mura particularly in regions display low grayscale image.

In some embodiments, the first node connecting line Cln1 connects various components of the pixel diving circuit to the node N1. Referring to FIG. 4B and FIG. 6B, the first node connecting line Cln1 is connected to the first capacitor electrode Ce1 through a first via v1, and connected to the second transistor T2 (e.g., to the source electrode S2 of the second transistor T2) through a second via v2.

Referring to FIG. 2, FIG. 3A, FIG. 3D, FIG. 5A, FIG. 5D, FIG. 4B, and FIG. 6B, D1 some embodiments, in a hole region H, a portion of the second capacitor electrode Ce2 is absent. Optionally, an orthographic projection of the second capacitor electrode Ce1 on a base substrate BS completely covers, with a margin, an orthographic projection of the first capacitor electrode Ce1 on the base substrate BS except for the hole region H in which a portion of the second capacitor electrode Ce2 is absent. Optionally, the first via v1 extends through the passivation layer PVX, the second inter-layer dielectric layer ILD2, the first inter-layer dielectric layer ILD1, the hole region H, and the insulating layer IN.

Figure 7A:
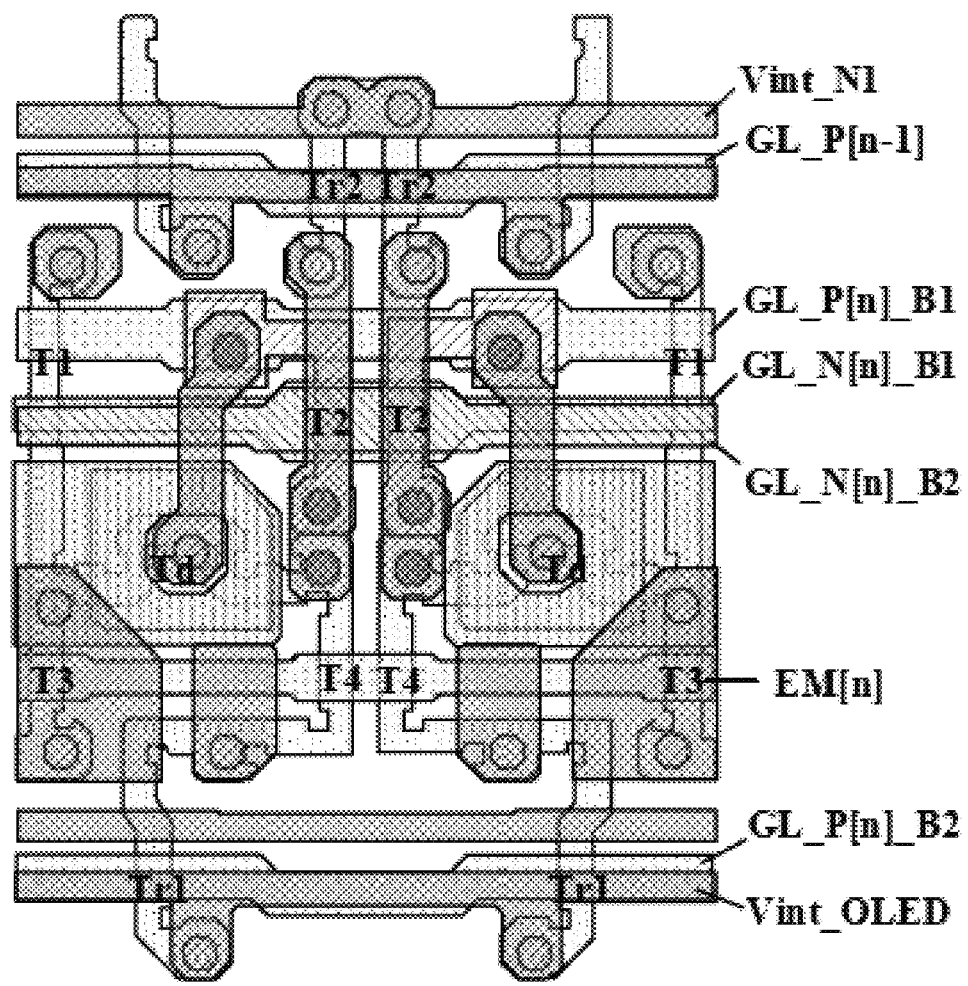
FIG. 7A is a diagram illustrating the structure of a first semiconductor material layer, a first gate metal layer, a second gate metal layer, a second semiconductor material layer, a third gate metal layer, and a first signal line layer of two adjacent pixel diving circuits in an array substrate depicted in FIG. 3A.
Figure 8A:
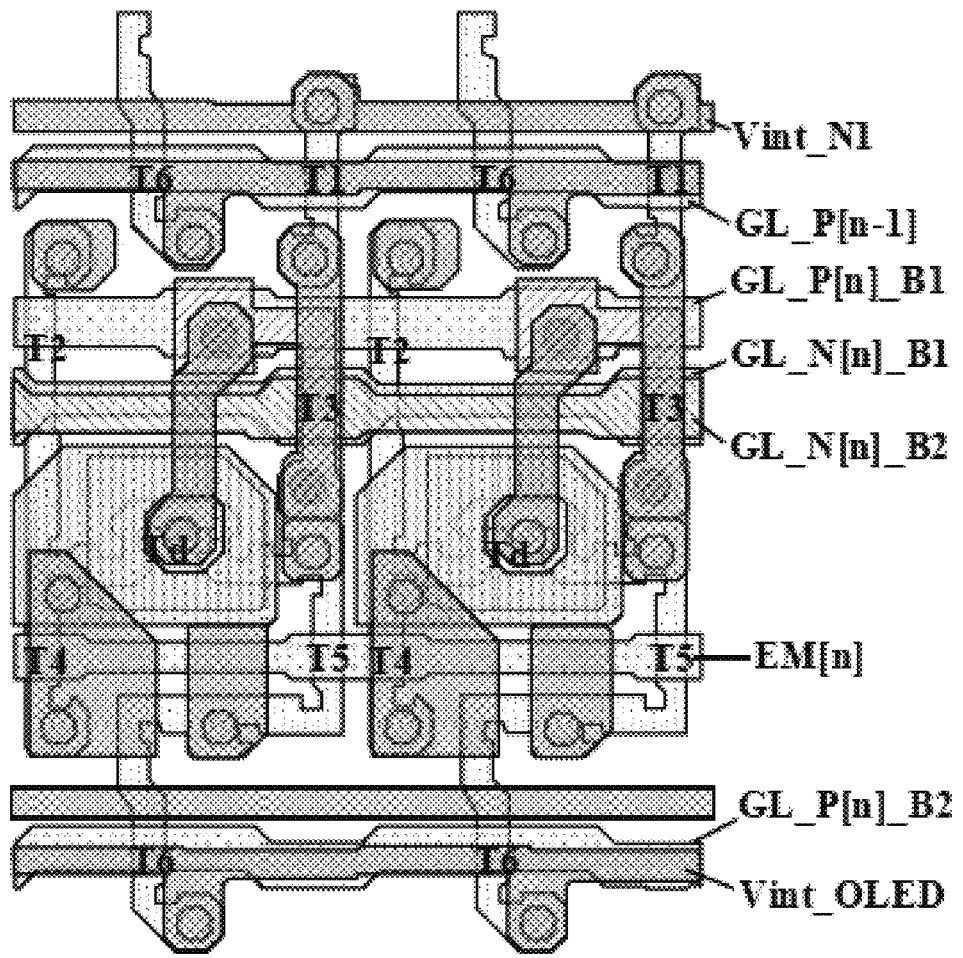
FIG. 8A is a diagram illustrating the structure of a first semiconductor material layer, a first gate metal layer, a second gate metal layer, a second semiconductor material layer, a third gate metal layer, and a first signal line layer of two adjacent pixel driving circuits in an array substrate depicted in FIG. 5A.

In some embodiments, the first node connecting line Cln1 crosses over the respective second gate line GL_N[n] in the present stage. FIG. 7A is a diagram illustrating the structure of a first semiconductor material layer, a first gate metal layer, a second gate metal layer, a second semiconductor material layer, a fluid gate metal layer, and a first signal line layer of two adjacent pixel driving circuits in an array substrate depicted in FIG. 3A. FIG. 8A is a diagram illustrating the structure of a first semiconductor material layer, a first gate metal layer, a second gate metal layer, a second semiconductor material layer, a third gate metal layer, and a first signal fixe layer of two adjacent pixel driving circuits in an array substrate depicted in FIG. 5A. As shown in FIG. 7A, FIG. 5A, FIG. 4B, and FIG. 6B, the first node connecting line Cln1 crosses over the second gate line first branch GL_N[n]_B1 as the second gate metal layer Gate2, and the second gate line second branch GL_N[n]_B2 in the third gate metal layer Gate3.

In some embodiments, the second node connecting line Cln2 connects various components of the pixel driving circuit to the node N3. Referring to FIG. 4A and FIG. 6A, the second node connecting line Cln2 is connected to the second transistor T2 (e.g., to the drain electrode D2 of the second transistor T2) through a ford via v3, connected to the second reset transistor Tr2. (e.g., to the drain electrode Dr2 of the second reset transistor Tr2) through a fourth via v4, and connected to the fourth transistor T4 and the driving transistor Td (e.g., to the source electrode S4 of the fourth transistor T4 and the drain electrode Dd of the driving transistor Td) through a fifth via v5.

Referring to FIG. 2, FIG. 3A, FIG. 3. FIG. 5A, FIG. 5, FIG. 4A, and FIG. 6.4, LE some embodiments, the third via v3 extends through the passivation layer PVK and the second inter-layer dielectric layer ILD2, the fourth via v4 extends through the passivation layer PVX, the second inter-layer dielectric layer ILD2, the first inter-layer dielectric layer ILD1, the hole region H, and the insulating layer IN, and the fifth via v5 extends through the passivation layer PVX, the second inter-layer dielectric layer ILD2, the first inter-layer dielectric layer ILD), the bole region H, and the insulating layer IN.

In some embodiments, referring to FIG. 7A, FIG. 3I, FIG. BA, FIG. 5I, FIG. 4A, and FIG. 6A, the second node connecting line Cln2 crosses over the respective second gate line GL_N[n] in the present stage and a first gate line first branch GL_P[n]_B1 of the first gate live GL_P[n] in the present stage. Optionally, the second mode connecting line Cln2 crosses over the second gate line first branch GL_N[n]_B1 and the second gate line second branch GL_N[n]_B2 of the respective second gate line GL_N[n] in the present stage, and the first gate line first branch GL_P[n]_B1 of the first gate line GL_P[n] is the present stage.

Referring to FIG. 2, FIG. 3A, FIG. 3L, FIG. 5A, FIG. 5L, FIG. 4A to FIG. 4D, and FIG. 6A to FIG. 6D, in some embodiments, the second signal line layer SD2 includes a plurality of voltage supply lines (e.g., the respective voltage supply line Vdd), a plurality of data lines (e.g., the respective data line DL), and an anode contact pad ACP. Various appropriate conductive materials and various appropriate fabricating methods may be used to wake the second signal line layer SD2. For example, a conductive material may be deposited on the substrate by a plasma-enhanced chemical vapor deposition (PECVD) process and patterned Examples of appropriate conductive materials for making the second signal line layer SD1 include, but are not limited to, aluminum, copper, molybdenum, chromium aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines (e.g., the respective voltage supply line Vdd), the plurality of data lives (e.g., the respective data live DL), and the anode contact pad ACP are in a same layer.

Figure 7B:
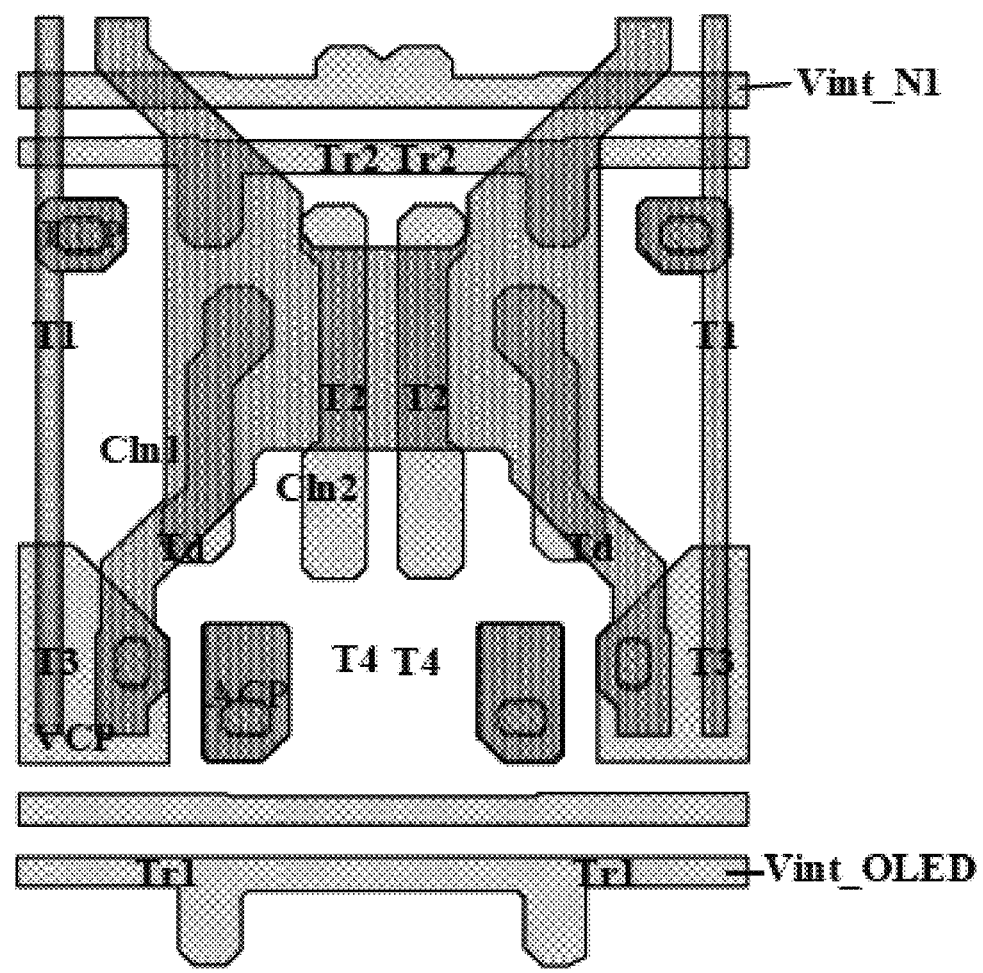
FIG. 7B is a diagram illustrating the structure of a first signal line layer and a second signal line layer of two adjacent pixel driving circuits in as array substrate depicted in FIG. 3A.
Figure 8B:
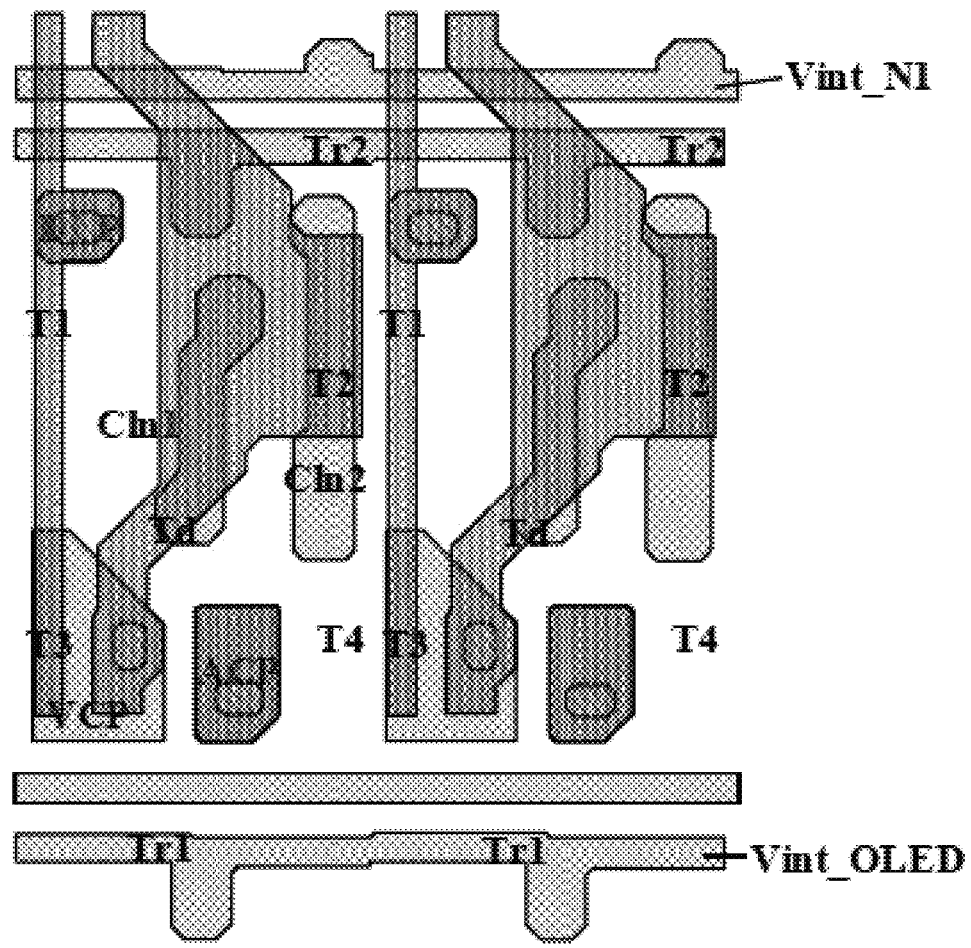
FIG. 8B is a diagram illustrating the structure of a first signal line layer and a second signal line layer of two adjacent pixel diving circuits in an array substrate depicted in FIG. 5A.
Figure 8C:
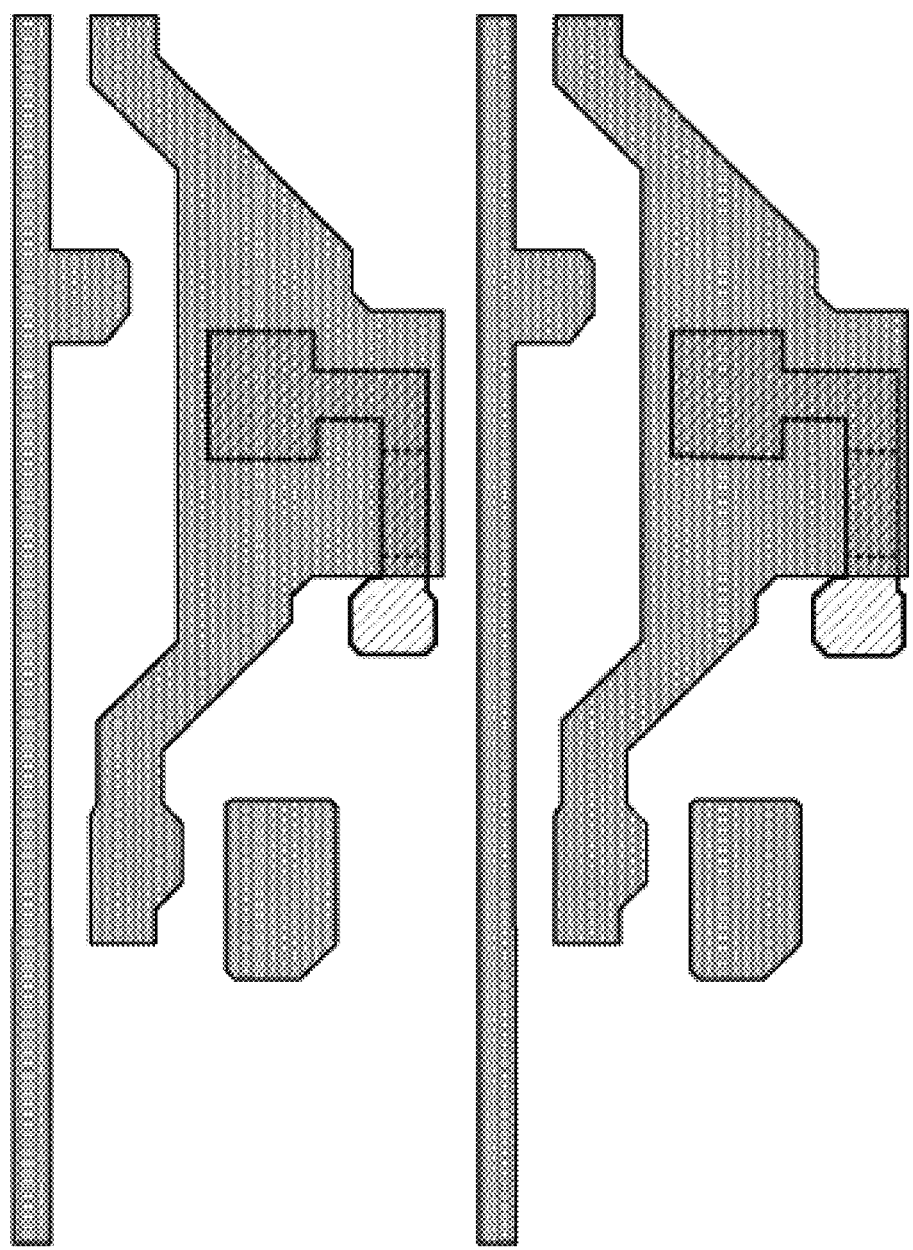

FIG. 7B is a diagram illustrating the structure of a first signal line layer and a second signal line layer of two adjacent pixel driving circuits in an array substrate depicted in FIG. 3A. FIG. 8B is a diagram illustrating the structure of a first signal line layer and a second signal line layer of two adjacent pixel driving circuits in an array substrate depicted in FIG. 5A. Referring to FIG. 7B, FIG. 5B, FIG. 2, FIG. 3A, FIG. 3I, FIG. 5A, FIG. 5I, FIG. 4C, and FIG. 6C, in some embodiments, the relay electrode RE is connected to the drain electrode D4 of the fourth transistor TA and the drain electrode Dr1 of the first reset transistor Tr1 through a sixth via v6 extending through the passivation layer PVX, the second inter-layer dielectric layer ILD2, the first inter-layer dielectric layer ILD1, and the insulating layer IN. Ax anode contact pad ACP is connected to the relay electrode RE through a seventh via v7 extending through the Est planarisation layer PLN1.

Referring to FIG. 2, FIG. 3A, FIG. 3I, FIG. 5A, FIG. 5I, FIG. 4D, and FIG. 6D, in some embodiments, the voltage connecting pad VCP is connected to the third transistor T3 (e.g., to the source electrode S3 of the third transistor T3) through an eighth via v8 extending through the passivation layer PVX, the second inter-layer dielectric layer ILD2, the first inter-layer dielectric layer ILD1, and the insulating layer IN. The respective voltage supply line Vdd of the plurality of voltage supply lines is connected to the voltage connecting pad VCP through a ninth via v9 extending through the first planarization layer PLN1. The voltage connecting pad VCP is connected to the second capacitor electrode Ce2 of the storage capacitor Cst through a tenth via v10 extending through the passivation layer PVX, the second inter-layer dielectric layer ILD2, and the first inter-layer dielectric layer ILD1.

Referring to FIG. 2, FIG. 3A, FIG. 3I, FIG. 5A, FIG. 5I, FIG. 4A, and FIG. 6A, in some embodiments, the respective second reset signal line Vint_N1 of a plurality of second reset signal lines is connected to the second reset transistor Tr2 (e.g., to the source electrode Sr2 of the second reset transistor Tr2) through an eleventh via v11 extending through the passivation layer PVX, the second inter-layer dielectric layer ILD2, the first inter-layer dielectric layer ILD1, and the insulating layer IN.

Referring to FIG. 2, FIG. 3A, FIG. 3I, FIG. 5A, FIG. 5I, FIG. 4C, and FIG. 6C, is some embodiments, the respective Gist reset signal line Vint_OLED of a plurality of first reset signal lines is connected to the first reset transistor Tr1 (e.g., to the source electrode Sr1 of the fast reset transistor Tr1) through a twelfth via v12 extending through the passivation layer PVX, the second inter-layer dielectric layer ILD2, the first inter-layer dielectric layer ILD1, and the insulating layer IN.

Referring to FIG. 2, FIG. 3A, FIG. 3N, FIG. 5A, FIG. 5N, FIG. 4A to FIG. 4D, and FIG. 6A to FIG. 6D, in some embodiments, the array substrate further includes an anode layer AD.

Referring to FIG. 2, FIG. 3A, FIG. 3O, FIG. 5A, FIG. 5O, FIG. 4A to FIG. 4D, and FIG. 6A to FIG. 6D, in some embodiments, the array substrate further includes a pixel definition layer PDL. The pixel definition layer PDL defines subpixel apertures SA, through which light emitting layers are respectively connected to anodes is respective pixel driving circuits.

In some embodiment, the array substrate includes a novel pixel driving circuit. The pixel driving circuit is some embodiments includes a driving transistor Td, and a storage capacitor Cst, and a first reset transistor Tr1 having a gate electrode connected to a first gate line GL_P[n] in a present stage of a plurality of first gate lines, a source electrode connected to a respective first reset signal line Vint_OLED of a plurality of first reset signal lines, and a drain electrode connected to as anode of a light emitting element LE. Optionally, the pixel driving circuit further includes a second reset transistor Tr2 having a gate electrode connected to a first gate line GL_P[n−1] in a previous stage of the plurality of first gate lines, a source electrode connected to a respective second reset signal line Vint_N1 of a plurality of second reset signal lines, and a drain electrode connected to a drain electrode of the driving transistor Td. The first gate line GL_P[n−1] in the previous stage is connected to the gate electrode of the second reset transistor Tr2 is the present stage and a gate electrode of the first reset transistor Tr1 is the previous stage. The first gate line GL_P[n] in the present stage is connected to the gate electrode of the first reset transistor Tr1 is the present stage and a gate electrode of the second reset transistor Tr2 is a next stage. As used herein, an individual stage corresponds to a row of pixel driving circuits, for example, a present stage corresponds to a present row of pixel driving circuits, and a previous stage corresponds to a previous row of pixel driving circuits. In one example, the first gate line GL_P[n] in the present row of pixel driving circuits is connected to the gate electrode of the best reset transistor Tr1 in the present row of pixel driving circuits and a gate electrode of the second reset transistor Tr2 in a next row of pixel driving circuits.

By having the second reset transistor Tr2 in the present stage and the first reset transistor Tr1 as the previous stage share a same gate line, and having the first reset transistor Tr1 in the present stage and the second reset transistor Tr2 in a next stage share a same gate line, the layout of the pixel driving circuit can be simplified to enhance light transmittance rate and image display resolution of the array substrate.

In some embodiments, the pixel driving circuit further includes a fourth transistor T4 having a gate electrode connected to a respective light emitting control signal line EM[n], a source electrode connected to the drabs electrode of the second reset transistor Tr1 and the drain electrode of the driving transistor Td, and a drain electrode connected to the drain electrode of the first reset transistor Tr1 and the anode of the light emitting element LE.

In some embodiments, the first gate line GL_P[n] in the present stage comprises a first gate line first branch GL_P[n]_B1 and a first gate line second branch GL_P[n]_B2 configured to be provided with a same gate scanning signal. The gate electrode of the first reset transistor Tr1 is connected to the first gate line second branch GL_P[n]_B2 in the present stage. The gate electrode of the second reset transistor Tr2 is connected to the first gate line second branch GL_P[n]_B2 in the previous stage.

In some embodiments, the pixel driving circuit further includes a first transistor T1 having a gate electrode connected to the first gate line first branch GL_P[n]_B1 in a present stage of a plurality of first gate lines, a source electrode connected to a respective data line DL of a plurality of data lines, and a dram electrode connected to a source electrode of the diving transistor Td.

In some embodiments, the pixel driving circuit further includes a second transistor T2 having a gate electrode connected to a respective second gate line GL_N[n] in a present stage of a plurality of second gate lines, a source electrode connected to a first capacitor electrode Ce1 of the storage capacitor Cst and a gate electrode of the driving transistor Td, and a dram electrode connected to a drain electrode of the driving transistor Td. The plurality of first gate lines and the plurality of second gate lines are spaced apart by one or more insulating layer.

In some embodiments, the array substrate includes a base substrate BS; a first semiconductor material layer SML1 on the base substrate; an insulating layer IN on a side of the first semiconductor material layer SML1 away from the base substrate BS; and a second semiconductor material layer SML2 on a side of the insulating layer IN away from the first semiconductor material layer SML1. The first semiconductor material layer SML1 includes an active layer of the driving transistor Td and an active layer of the first reset transistor Tr1. The second semiconductor material layer SML2 includes aw active layer of the second transistor T2. In some embodiments, the first semiconductor material layer SML1 further includes at least a portion of the source electrode of the driving transistor Td, at least a portion of the drain electrode of the driving transistor Td, at least a portion of the source electrode of the first reset transistor Tr1, at least a portion of the drain electrode of the first reset transistor Tr1. In some embodiments, the second semiconductor material layer further includes at least a portion of the source electrode of the second transistor T2, and at least a portion of the drain electrode of the second transistor T2. Optionally, the first semiconductor material layer SML1 includes active layers, at least portions of source electrodes, and at least portions of drain electrodes of all transistors other than the second transistor T2 in the pixel driving circuit. Optionally, the first semiconductor material layer SML1 includes a polycrystalline silicon material; and the second semiconductor material layer SML2 includes a metal oxide semiconductor material.

In some embodiments, the respective second gate line GL_N[n] in a present stage comprises a second gate line first branch GL_N[n]_B1 and a second gate line second branch GL_N[n]_B2 in two different layers. Optionally, an orthographic projection of the second gate line first branch GL_N[n]_B1 on a base substrate at least partially overlaps with an orthographic projection of the second gate line second branch GL_N[n]_B2 on the base substrate BS.

In some embodiments, the array substrate includes a base substrate BS; a second gate metal layer Gate2 on the base substrate BS; a first inter-layer dielectric layer ILD1 on a side of the second gate metal layer Gate1 away from the base substrate BS; a second semiconductor material layer SML2 on a side of the first inter-layer dielectric layer ILD1 away from the second gate metal layer Gate2; a second inter-laves dielectric layer ILD2 on a side of the second semiconductor material layer SML2 away from the first inter-layer dielectric layer ILD1; and a third gate metal layer Gates on a side of the second inter-layer dielectric layer ILD2 away from the second semiconductor material layer SML2. Optionally, the second gate metal layer Gate2 includes the second gate line first branch GL_N[n]_B1. Optionally, the second semiconductor material layer SML2 includes aw active layer of the second transistor T2. Optionally, the third gate metal layer Gate3 includes the second gate line second branch GL_N[n]_B2.

In some embodiment, the array substrate includes a base substrate BS; a first gate metal layer Gate1 on the base substrate BS, the first gate metal layer Gate1 including a first capacitor electrode Ce1 of the storage capacitor Cst; a second semiconductor material layer SML2 on a side of the first gate metal layer Gate1 away from the base substrate BS, the second semiconductor material layer SML2 including at least a portion of a source electrode of the second transistor T2; and a first signal line layer SD1 on a side of the second semiconductor material layer SML2 away from the first gate metal layer Gate1, the first signal line layer SD1 including the plurality of first reset signal lines and a first node connecting line Cln1. Optionally, the first node connecting line Cln1 is connected to the first capacitor electrode Ce1 through a first via v1, and connected to the source electrode of the second transistor T2 through a second via v2. Optionally, the first node connecting line Cln1 crosses over the respective second gate line GL_N[n] in the present stage.

In some embodiments, the array substrate includes a base substrate BS; a first semiconductor material layer SML1 on the base substrate BS, the first semiconductor material layer SML1 including the drain electrode of the second reset transistor Tr2, the source electrode of the fourth transistor T4, and the drain electrode of the driving transistor Td; a second semiconductor material layer SML2 is a side of the first semiconductor material layer SML1 away from the base substrate, the second semiconductor material layer SML2 including the drain electrode of the second transistor T2; and a first signal line layer SD1 on a side of the second semiconductor material layer SML2 away from the first gate metal layer Gate1, the first signal line layer SD1 including the plurality of first reset signal lines and a second node connecting line Cln2. Optionally, the second node connecting line Cln2 is connected to the drain electrode of the second transistor T2 through a third via v3, connected to the dram electrode of the second reset transistor Tr2 through a fourth via v4, and connected to the source electrode of the fourth transistor T4 and the drain electrode of the driving transistor Td through a fifth via v5. Optionally, the second node connecting line Cln2 crosses over the respective second gate line GL_N[n] in the present stage and a first gate line first branch GL_P[n]_B1 of the first gate line GL_P[n] in the present stage.

Figure 7C:
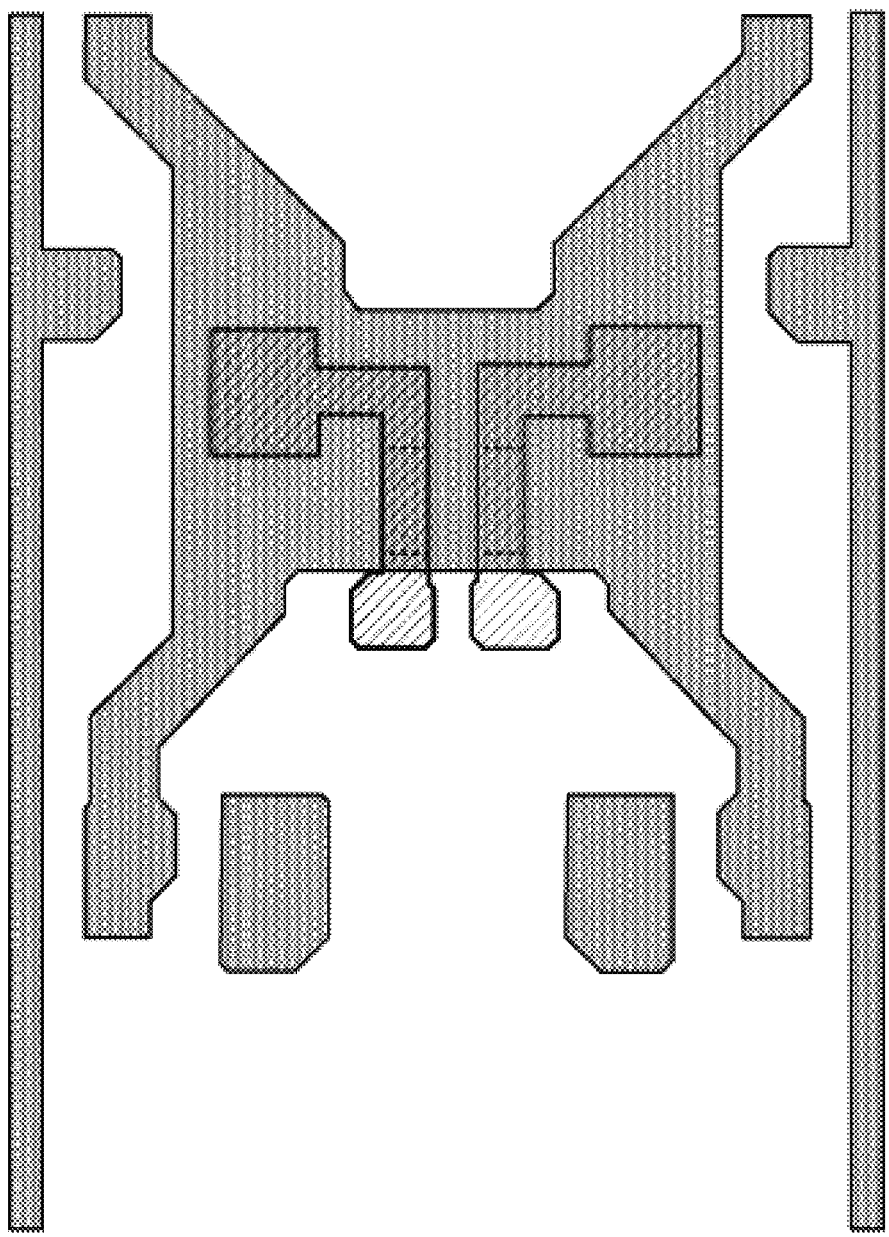
FIG. 7C is a diagram illustrating the structure of a second semiconductor material layer and a second signal line layer of two adjacent pixel diving circuits in an array substrate depicted in FIG. 3A.

In some embodiments, the array substrate includes a base substrate BS; a second semiconductor material layer SML2 on a side of the insulating layer IN away from the first semiconductor material layer SML1, the second semiconductor material layer SML2 including an active layer of the second transistor T2; and a second signal line layer SD2 on a side of the second semiconductor material layer SML2 away from the base substrate BS, the second signal line layer SD2 including a plurality of voltage supply lines. FIG. 7C is a diagram illustrating the structure of a second semiconductor material layer and a second signal line layer of two adjacent pixel driving circuits in aw array substrate depicted in FIG. 3A. FIG. 5C is a diagram illustrating the structure of a second semiconductor material layer and a second signal line layer of two adjacent pixel driving circuits in an array substrate depicted in FIG. 5A. Referring to FIG. 7C and FIG. 5C, in some embodiments, an orthographic projection of a respective voltage supply line Vdd of the plurality of voltage supply lines on the base substrate BS covers as orthographic projection of the active layer of the second transistor T2 on the base substrate BS. Optionally, the orthographic projection of a respective voltage supply line Vdd of the plurality of voltage supply lines on the base substrate BS further covers an orthographic projection of the source electrode (or drain electrode, depending on the direction of a current flowing through the second transistor T2) of the second transistor T2 on the base substrate BS. Optionally, voltage supply lines respectively from a first pixel driving circuit and a second pixel driving circuit directly adjacent to each other and in the present stage form a unitary structure in which the voltage supply lives are connected to each other in a region where orthographic projections of voltage supply lines on the base substrate cover orthographic projections of active layers of second transistors from the first subpixel and the second subpixel on the base substrate BS.

Referring to FIG. 3B, FIG. 7A, FIG. 4A, and FIG. 4C, in some embodiments, second reset transistors respectively from a first pixel driving circuit and a second pixel diving circuit directly adjacent to each other and in the present stage forms a unitary structure in which source electrodes (or drain electrodes, depending on the direction of a current flowing through the second reset transistors) of the second reset transistors are connected to each other is a region where the respective second reset signal line Vint_N1 is connected to the source electrodes or drain electrodes of the second reset transistors through one or more vias. Optionally, the second reset transistor Tr2 is spaced apart from other transistors is a same pixel driving circuit, as shown in FIG. 3B. Second reset transistors respectively form a first pixel driving circuit and a second pixel driving circuit directly adjacent to each other and is the present stage form a unitary structure. Source electrodes or drain electrodes of the second reset transistors respectively from the first pixel driving circuit and the second pixel driving circuit directly adjacent to each other and in the present stage are connected to each other, thereby forming the unitary structure. Optionally, the respective second reset signal line Vint_N1 is connected to the source electrodes or drain electrodes of the second reset transistors through a single via. The single via design can further enhance image display resolution of the array substrate.

In another aspect, the present invention provides a display apparatus, including the array substrate described herein or fabricated by a method described herein, and one or more integrated circuits connected to the array substrate.

Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a pixel driving circuit. In some embodiments, the pixel driving circuit includes a driving transistor, and a storage capacitor, and a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element.

In some embodiments, the pixel driving circuit further includes a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor. Optionally, the first gate line is the previous stage is connected to the gate electrode of the second reset transistor is the present stage and a gate electrode of a first reset transistor is the previous stage, and the first gate line in the present stage is connected to the gate electrode of the first reset transistor in the present stage and a gate electrode of a second reset transistor in a next stage.

In some embodiments, the pixel driving circuit further includes a fourth transistor having a gate electrode connected to a respective light emitting control signal line, a source electrode connected to the drain electrode of the second reset transistor and the drain electrode of the driving transistor, and a drain electrode connected to the drain electrode of the first reset transistor and the anode of the light emitting element.

In some embodiments, the first gate line in the present stage comprises a first gate line first branch and a first gate line second branch configured to be provided with a same gate scanning signal. Optionally, the gate electrode of the first reset transistor is connected to the first gate line second branch in the present stage; and the gate electrode of the second reset transistor is connected to the first gate line second branch in the previous stage.

In some embodiments, the pixel driving circuit father includes a first transistor having a gate electrode connected to the first gate line first branch in a present stage of a plurality of first gate lines, a source electrode connected to a respective data line of a plurality of data lines, and a drain electrode connected to a source electrode of the driving transistor.

In some embodiments, the pixel driving circuit further includes a second transistor having a gate electrode connected to a respective second gate line in a present stage of a plurality of second gate lines, a source electrode connected to a first capacitor electrode of the storage capacitor and a gate electrode of the driving transistor, and a drain electrode connected to a drain electrode of the driving transistor. Optionally, the plurality of first gate lines and the plurality of second gate lines are spaced apart by one or more insulating layer.

In some embodiments, the respective second gate line in a present stage includes a second gate line first branch and a second gate line second branch in two different layers.

In some embodiments, the pixel driving circuit includes a driving transistor, and a storage capacitor, and a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element; a second reset transistor having a gate electrode connected to a first gate line in a previous stage of a plurality of first gate lines, a source electrode connected to a respective second reset signal line of a plurality of second reset signal lines, and a drain electrode connected to a drain electrode of the driving transistor; a first transistor having a gate electrode connected to a first gate line in a present stage of a plurality of first gate lives, a source electrode connected to a respective data line of a plurality of data lines, and a drain electrode connected to a source electrode of the driving transistor; a second transistor having a gate electrode connected to a respective second gate line in a present stage of a plurality of second gate lines, a source electrode connected to the first capacitor electrode of the storage capacitor and the gate electrode of the driving transistor, and a drain electrode connected to the drain electrode of the diving transistor; a third transistor having a gate electrode connected to a respective light emitting control signal line of a plurality of light emitting control signal lines, a source electrode connected to a respective voltage supply line of a plurality of voltage supply lines, and a drain electrode connected to the source electrode of the driving transistor and the drain electrode of the first transistor; and a fourth transistor having a gate electrode connected to the respective light emitting control signal line, a source electrode connected to drain electrodes of the driving transistor and the second transistor, and a drain electrode connected to an anode of a light emitting element. Optionally, the second capacitor electrode is connected to the respective voltage supply line and the source electrode of the third transistor.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the lie does not necessarily limit the claim scope to a specific embodiment, and the reference to exemplary embodiments of the invention does not imply a Limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been gives. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel driving circuit, comprising:
    a driving transistor;
    a storage capacitor;
    a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element; and
    a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor;
    wherein the first gate line in the previous stage is connected to the gate electrode of the second reset transistor in the present stage and a gate electrode of a first reset transistor in the previous stage; and
    the first gate line in the present stage is connected to the gate electrode of the first reset transistor in the present stage and a gate electrode of a second reset transistor in a next stage.

2. The pixel driving circuit of claim 1, further comprising a fourth transistor having a gate electrode connected to a respective light emitting control signal line, a source electrode connected to the drain electrode of the second reset transistor and the drain electrode of the driving transistor, and a drain electrode connected to the drain electrode of the first reset transistor and the anode of the light emitting element.

3. The pixel driving circuit of claim 2, wherein the first gate line in the present stage comprises a first gate line first branch and a first gate line second branch configured to be provided with a same gate scanning signal;
    the gate electrode of the first reset transistor is connected to the first gate line second branch in the present stage; and
    the gate electrode of the second reset transistor is connected to the first gate line second branch in the previous stage.

4. The pixel driving circuit of claim 3, further comprising a first transistor having a gate electrode connected to the first gate line first branch in a present stage of a plurality of first gate lines, a source electrode connected to a respective data line of a plurality of data lines, and a drain electrode connected to a source electrode of the driving transistor.

5. A pixel driving circuit, comprising:
    a driving transistor;
    a storage capacitor;
    a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element;
    a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor; and
    a second transistor having a gate electrode connected to a respective second gate line in a present stage of a plurality of second gate lines, a source electrode connected to a first capacitor electrode of the storage capacitor and a gate electrode of the driving transistor, and a drain electrode connected to a drain electrode of the driving transistor;
    wherein the plurality of first gate lines and the plurality of second gate lines are spaced apart by one or more insulating layer.

6. The pixel driving circuit of claim 5, wherein the respective second gate line in a present stage comprises a second gate line first branch and a second gate line second branch in two different layers.

7. The pixel driving circuit of claim 1, further comprising:
    a second reset transistor having a gate electrode connected to a first gate line in a previous stage of a plurality of first gate lines, a source electrode connected to a respective second reset signal line of a plurality of second reset signal lines, and a drain electrode connected to a drain electrode of the driving transistor;
    a first transistor having a gate electrode connected to a first gate line in a present stage of a plurality of first gate lines, a source electrode connected to a respective data line of a plurality of data lines, and a drain electrode connected to a source electrode of the driving transistor;

a second transistor having a gate electrode connected to a respective second gate line in a present stage of a plurality of second gate lines, a source electrode connected to the first capacitor electrode of the storage capacitor and the gate electrode of the driving transistor, and a drain electrode connected to the drain electrode of the driving transistor;

a third transistor having a gate electrode connected to a respective light emitting control signal line of a plurality of light emitting control signal lines, a source electrode connected to a respective voltage supply line of a plurality of voltage supply lines, and a drain electrode connected to the source electrode of the driving transistor and the drain electrode of the first transistor; and a fourth transistor having a gate electrode connected to the respective light emitting control signal line, a source electrode connected to drain electrodes of the driving transistor and the second transistor, and a drain electrode connected to an anode of a light emitting element;

wherein a second capacitor electrode of the storage capacitor is connected to the respective voltage supply line and the source electrode of the third transistor.

8. An array substrate, comprising a pixel driving circuit, and a light emitting element connected to the pixel driving circuit;

wherein the pixel driving circuit comprises:

a driving transistor;

a storage capacitor;

a first reset transistor having a gate electrode connected to a first gate line in a present stage of a plurality of first gate lines, a source electrode connected to a respective first reset signal line of a plurality of first reset signal lines, and a drain electrode connected to an anode of a light emitting element;

a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor; and a second transistor having a gate electrode connected to a respective second gate line in a present stage of a plurality of second gate lines, a source electrode connected to a first capacitor electrode of the storage capacitor and a gate electrode of the driving transistor, and a drain electrode connected to a drain electrode of the driving transistor;

wherein the plurality of first gate lines and the plurality of second gate lines are spaced apart by one or more insulating layer.

9. The array substrate of claim 8, comprising:

a base substrate;

a first semiconductor material layer on the base substrate;

an insulating layer on a side of the first semiconductor material layer away from the base substrate; and a second semiconductor material layer on a side of the insulating layer away from the first semiconductor material layer;

wherein the first semiconductor material layer comprises an active layer of the driving transistor and an active layer of the first reset transistor; and the second semiconductor material layer comprises an active layer of the second transistor.

10. The array substrate of claim 9, wherein the first semiconductor material layer further comprises at least a portion of the source electrode of the driving transistor, at least a portion of the drain electrode of the driving transistor, at least a portion of the source electrode of the first reset transistor, at least a portion of the drain electrode of the first reset transistor; and the second semiconductor material layer further comprises at least a portion of the source electrode of the second transistor, and at least a portion of the drain electrode of the second transistor.

11. The array substrate of claim 9, wherein the first semiconductor material layer comprises active layers, at least portions of source electrodes, and at least portions of drain electrodes of all transistors other than the second transistor in the pixel driving circuit.

12. The array substrate of claim 9, wherein the first semiconductor material layer comprises a polycrystalline silicon material; and the second semiconductor material layer comprises a metal oxide semiconductor material.

13. The array substrate of claim 8, wherein the respective second gate line in a present stage comprises a second gate line first branch and a second gate line second branch in two different layers; and an orthographic projection of the second gate line first branch on a base substrate at least partially overlaps with an orthographic projection of the second gate line second branch on the base substrate.

14. The array substrate of claim 13, comprising:

a base substrate;

a second gate metal layer on the base substrate;

a first inter-layer dielectric layer on a side of the second gate metal layer away from the base substrate;

a second semiconductor material layer on a side of the first inter-layer dielectric layer away from the second gate metal layer;

a second inter-layer dielectric layer on a side of the second semiconductor material layer away from the first inter-layer dielectric layer; and a third gate metal layer on a side of the second inter-layer dielectric layer away from the second semiconductor material layer;

wherein the second gate metal layer comprises the second gate line first branch;

the second semiconductor material layer comprises an active layer of the second transistor; and the third gate metal layer comprises the second gate line second branch.

15. The array substrate of claim 8, further comprising:

a base substrate;

a first gate metal layer on the base substrate, the first gate metal layer comprising a first capacitor electrode of the storage capacitor;

a second semiconductor material layer on a side of the first gate metal layer away from the base substrate, the second semiconductor material layer comprising at least a portion of a source electrode of the second transistor; and a first signal line layer on a side of the second semiconductor material layer away from the first gate metal layer, the first signal line layer comprising the plurality of first reset signal lines and a first node connecting line;

wherein the first node connecting line is connected to the first capacitor electrode through a first via, and connected to the source electrode of the second transistor through a second via.

16. The array substrate of claim 15, wherein the first node connecting line crosses over the respective second gate line in the present stage.

17. The array substrate of claim 8, wherein the pixel driving circuit further comprises:
- a second reset transistor having a gate electrode connected to a first gate line in a previous stage of the plurality of first gate lines, a source electrode connected to a respective second reset signal line of a plurality of second reset signal lines, and a drain electrode connected to a drain electrode of the driving transistor; and
- a fourth transistor having a gate electrode connected to a respective light emitting control signal line, a source electrode connected to the drain electrode of the second reset transistor and the drain electrode of the driving transistor, and a drain electrode connected to the drain electrode of the first reset transistor and the anode of the light emitting element;

wherein the array substrate further comprises:
- a base substrate;
- a first semiconductor material layer on the base substrate, the first semiconductor material layer comprising the drain electrode of the second reset transistor, the source electrode of the fourth transistor, and the drain electrode of the driving transistor;
- a second semiconductor material layer on a side of the first semiconductor material layer away from the base substrate, the second semiconductor material layer comprising the drain electrode of the second transistor; and
- a first signal line layer on a side of the second semiconductor material layer away from the first gate metal layer, the first signal line layer comprising the plurality of first reset signal lines and a second node connecting line;

wherein the second node connecting line is connected to the drain electrode of the second transistor through a third via, connected to the drain electrode of the second reset transistor through a fourth via, and connected to the source electrode of the fourth transistor and the drain electrode of the driving transistor through a fifth via.

18. A display apparatus, comprising the array substrate of claim 9, and an integrated circuit connected to the array substrate.

* * * * *